(12) United States Patent
Hsu

(10) Patent No.: US 12,165,717 B2
(45) Date of Patent: Dec. 10, 2024

(54) METHODS AND APPARATUS FOR A NOVEL MEMORY ARRAY

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 45 days.

(21) Appl. No.: 17/813,010

(22) Filed: Jul. 15, 2022

(65) Prior Publication Data

US 2022/0351790 A1 Nov. 3, 2022

Related U.S. Application Data

(63) Continuation-in-part of application No. 17/506,628, filed on Oct. 20, 2021, which is a continuation-in-part
(Continued)

(51) Int. Cl.
*G11C 16/00* (2006.01)
*G11C 16/12* (2006.01)
(Continued)

(52) U.S. Cl.
CPC .......... *G11C 16/3459* (2013.01); *G11C 16/12* (2013.01); *G11C 16/24* (2013.01); *G11C 16/30* (2013.01)

(58) Field of Classification Search
CPC . G11C 11/22; G11C 11/4091; G11C 11/4096; G11C 2207/002; G11C 7/1078;
(Continued)

(56) References Cited

U.S. PATENT DOCUMENTS

| 4,796,230 A | 1/1989 | Young |
| 5,835,414 A | 11/1998 | Hung et al. |

(Continued)

FOREIGN PATENT DOCUMENTS

| CN | 101055764 A | 10/2007 |
| CN | 101573762 A | 11/2009 |

(Continued)

OTHER PUBLICATIONS

International Search Report, dated Mar. 17, 2020, for corresponding International Application No. PCT/US2019/062057 (4 pages).
(Continued)

*Primary Examiner* — Thong Q Le
(74) *Attorney, Agent, or Firm* — Intellectual Property Law Group LLP

(57) ABSTRACT

Methods and apparatus for a novel memory array are disclosed. In an embodiment, a method is provided for reading a dynamic random-access memory (DRAM) array. The method includes activating the bit line select gates to equalize voltage levels on a plurality of bit lines, deactivating the bit line select gates to maintain the equalized voltage levels on the plurality of bit lines using a bit line capacitance associated with each bit line, and activating a selected word line to access selected memory cells connected to the selected word line. The method also includes activating bit line select gates to pass first data from a first bit line and second data from a second bit line to the sense amplifier. The first data is from a selected memory cell and the second data is reference data. The method also includes determining sensed data from the first and second data.

9 Claims, 45 Drawing Sheets

Related U.S. Application Data of application No. 17/492,553, filed on Oct. 1, 2021, which is a continuation-in-part of application No. 17/446,165, filed on Aug. 26, 2021, which is a continuation-in-part of application No. 17/330,304, filed on May 25, 2021, which is a continuation of application No. 16/849,875, filed on Apr. 15, 2020, now Pat. No. 11,049,579, which is a continuation-in-part of application No. 16/687,556, filed on Nov. 18, 2019, now Pat. No. 11,056,190.

(60) Provisional application No. 63/309,509, filed on Feb. 11, 2022, provisional application No. 63/306,085, filed on Feb. 2, 2022, provisional application No. 63/302,074, filed on Jan. 22, 2022, provisional application No. 63/298,978, filed on Jan. 12, 2022, provisional application No. 63/296,160, filed on Jan. 3, 2022, provisional application No. 63/287,543, filed on Dec. 9, 2021, provisional application No. 63/250,238, filed on Sep. 30, 2021, provisional application No. 63/171,580, filed on Apr. 7, 2021, provisional application No. 63/116,159, filed on Nov. 19, 2020, provisional application No. 63/112,038, filed on Nov. 10, 2020, provisional application No. 63/107,386, filed on Oct. 29, 2020, provisional application No. 63/105,877, filed on Oct. 27, 2020, provisional application No. 63/104,305, filed on Oct. 22, 2020, provisional application No. 63/094,343, filed on Oct. 20, 2020, provisional application No. 63/091,895, filed on Oct. 14, 2020, provisional application No. 63/090,171, filed on Oct. 9, 2020, provisional application No. 63/086,543, filed on Oct. 1, 2020, provisional application No. 63/070,266, filed on Aug. 26, 2020, provisional application No. 62/884,139, filed on Aug. 7, 2019, provisional application No. 62/871,198, filed on Jul. 7, 2019, provisional application No. 62/848,567, filed on May 15, 2019, provisional application No. 62/843,556, filed on May 5, 2019, provisional application No. 62/799,669, filed on Jan. 31, 2019, provisional application No. 62/783,199, filed on Dec. 20, 2018, provisional application No. 62/774,128, filed on Nov. 30, 2018, provisional application No. 62/770,150, filed on Nov. 20, 2018, provisional application No. 62/768,979, filed on Nov. 18, 2018.

(51) Int. Cl.
*G11C 16/24* (2006.01)
*G11C 16/30* (2006.01)
*G11C 16/34* (2006.01)

(58) Field of Classification Search
CPC ..... G11C 7/1096; G11C 11/4094; G11C 7/12; G11C 7/065; G11C 7/1048; G11C 11/4076; G11C 11/4097; G11C 11/21; G11C 2207/229; G11C 7/1006; G11C 7/1051; G11C 11/005; G11C 11/401; G11C 7/103; G11C 7/1072; G11C 11/40; G11C 11/4045; G11C 2207/005; G11C 7/10; G11C 7/22; G11C 29/785; G11C 7/1057; G11C 8/12; G11C 11/04; G11C 11/34; G11C 11/4085; G11C 11/4087; G11C 11/4093; G11C 16/12; G11C 16/24; G11C 2207/2254; G11C 29/81; G11C 5/145; G11C 7/06; G11C 7/1018; G11C 7/1045; G11C 7/106; G11C 7/1069; G11C 7/18; G11C 8/08; G11C 11/406; G11C 11/40611; G11C 11/40615

See application file for complete search history.

(56) References Cited

U.S. PATENT DOCUMENTS

| | | | |
|---|---|---|---|
| 6,266,272 | B1 | 7/2001 | Kirihata et al. |
| 7,016,229 | B2 | 3/2006 | Kim |
| 7,133,303 | B2 * | 11/2006 | Ito ........................ G11C 11/4076 365/150 |
| 7,630,251 | B2 | 12/2009 | Hosono |
| 7,751,242 | B2 | 6/2010 | Roohparvar |
| 7,827,348 | B2 | 11/2010 | Lee et al. |
| 8,891,311 | B2 | 11/2014 | Joo |
| 8,917,556 | B2 | 12/2014 | Kwak |
| 8,937,833 | B2 | 1/2015 | Lee |
| 9,218,874 | B1 | 12/2015 | Koh et al. |
| 9,747,992 | B1 | 8/2017 | Chen et al. |
| 9,858,993 | B2 | 1/2018 | Kang |
| 10,121,551 | B1 | 11/2018 | Miller et al. |
| 11,049,579 | B2 | 6/2021 | Hsu |
| 11,056,190 | B2 | 7/2021 | Hsu |
| 2002/0075731 | A1 | 6/2002 | Amano |
| 2003/0193824 | A1 | 10/2003 | Tsukikawa et al. |
| 2004/0057310 | A1 | 3/2004 | Hosono et al. |
| 2008/0049530 | A1 | 2/2008 | Hirota et al. |
| 2008/0130363 | A1 | 6/2008 | Hosono |
| 2009/0010064 | A1 | 1/2009 | Nazarian |
| 2009/0310414 | A1 | 12/2009 | Lee et al. |
| 2010/0020602 | A1 | 1/2010 | Baek et al. |
| 2010/0058003 | A1 | 3/2010 | Goto et al. |
| 2010/0214845 | A1 | 8/2010 | Choi |
| 2011/0051524 | A1 | 3/2011 | Hsu et al. |
| 2013/0076781 | A1 | 3/2013 | Sirpal et al. |
| 2013/0141974 | A1 | 6/2013 | Jang |
| 2013/0148429 | A1 | 6/2013 | Kim et al. |
| 2013/0229861 | A1 | 9/2013 | Ueda |
| 2013/0279251 | A1 | 10/2013 | Lee |
| 2014/0022846 | A1 | 1/2014 | Kim |
| 2014/0036590 | A1 | 2/2014 | Feeley et al. |
| 2014/0056072 | A1 | 2/2014 | Hung |
| 2014/0078826 | A1 | 3/2014 | Sel et al. |
| 2014/0233315 | A1 | 8/2014 | Park et al. |
| 2016/0071599 | A1 | 3/2016 | Hsu |
| 2016/0163395 | A1 | 6/2016 | Suito |
| 2016/0027504 | A1 | 7/2016 | Lee |
| 2016/0315097 | A1 | 10/2016 | Hsu |
| 2016/0358661 | A1 | 12/2016 | Vali et al. |
| 2017/0123666 | A1 | 5/2017 | Sinclair et al. |
| 2018/0293014 | A1 | 10/2018 | Ravimohan et al. |
| 2019/0066804 | A1 | 2/2019 | Vali et al. |
| 2019/0087343 | A1 | 3/2019 | Shen et al. |
| 2020/0118630 | A1 | 4/2020 | Lin et al. |
| 2020/0160910 | A1 | 5/2020 | Hsu |
| 2020/0243149 | A1 | 7/2020 | Hsu |
| 2020/0402553 | A1 | 12/2020 | Koh et al. |
| 2021/0327519 | A1 | 10/2021 | Hsu |
| 2021/0391027 | A1 | 12/2021 | Hsu |
| 2022/0028469 | A1 | 1/2022 | Hsu |
| 2022/0044746 | A1 | 2/2022 | Hsu |
| 2022/0351790 | A1 | 11/2022 | Hsu |
| 2023/0022531 | A1 | 1/2023 | Hsu |

FOREIGN PATENT DOCUMENTS

| | | |
|---|---|---|
| CN | 101842849 A | 9/2010 |
| CN | 103021463 A | 4/2013 |
| CN | 106158037 A | 11/2016 |
| JP | 2003229545 A1 | 8/2003 |

OTHER PUBLICATIONS

Written Opinion of the International Searching Authority, dated Mar. 17, 2020, for corresponding International Application No. PCT/US2019/062057 (4 pages).

(56) References Cited

OTHER PUBLICATIONS

International Search Report, dated Aug. 6, 2020, for corresponding International Application No. PCT/US2020/028367 (4 pages).
Written Opinion of the International Searching Authority, dated Aug. 6, 2020, for corresponding International Application No. PCT/US2020/028367 (7 pages).
International Search Report, dated Dec. 2, 2021, for corresponding International Application No. PCT/US2021/047828 (2 pages).
Written Opinion of the International Searching Authority, dated Dec. 2, 2021, for corresponding International Application No. PCT/US2021/047828 (4 pages).
China Office Action, dated Nov. 18, 2021 for corresponding China application No. 202080009779.7 with English translation (9 pages).
International Search Report, dated Jan. 11, 2022, for corresponding International Application No. PCT/US2021/053268 (2 pages).
Written Opinion of the International Searching Authority, dated Jan. 11, 2022, for corresponding International Application No. PCT/US2021/053268 (5 pages).
International Search Report, dated Feb. 25, 2022, for corresponding International Application No. PCT/US2021/055918 (4 pages).
Written Opinion of the International Searching Authority, dated Feb. 25, 2022, for corresponding International Application No. PCT/US2021/055918 (5 pages).
International Search Report, dated Oct. 14, 2022, for corresponding International Application No. PCT/US2022/073810 (4 pages).
Written Opinion of the International Searching Authority, dated Oct. 14, 2022, for corresponding International Application No. PCT/US2022/073810 (5 pages).
Ali et al., "In-Memory Low-Cost Bit-Serial Addition using Commodity DRAM Technology" IEEE Transactions on Circuits and Systems I: Regular Papers 67, 1 (2019): 155-156. Oct. 16, 2019 (11 pages).
International Search Report, dated Oct. 28, 2022, for corresponding International Application No. PCT/US2022/074403 (2 pages).
Written Opinion of the International Searching Authority, dated Oct. 28, 2022, for corresponding International Application No. PCT/US2022/074403 (5 pages).
China Office Action, dated Mar. 16, 2022, for corresponding China Application No. 2019800894490 with English translation (11 pages).
Taiwan Office Action, dated Sep. 1, 2023 for corresponding Taiwan Application No. 111128983 with English translation (12 pages).
Taiwan Office Action, dated Jun. 2, 2023 for corresponding Taiwan Application No. 111128648 with English translation (18 pages).

\* cited by examiner

Single-Page Read

Single-Page Read

Multiple-Page Read

Refresh

Single - Page Write

Multiple - Page Write

Column Address Selection

Column Address Selection

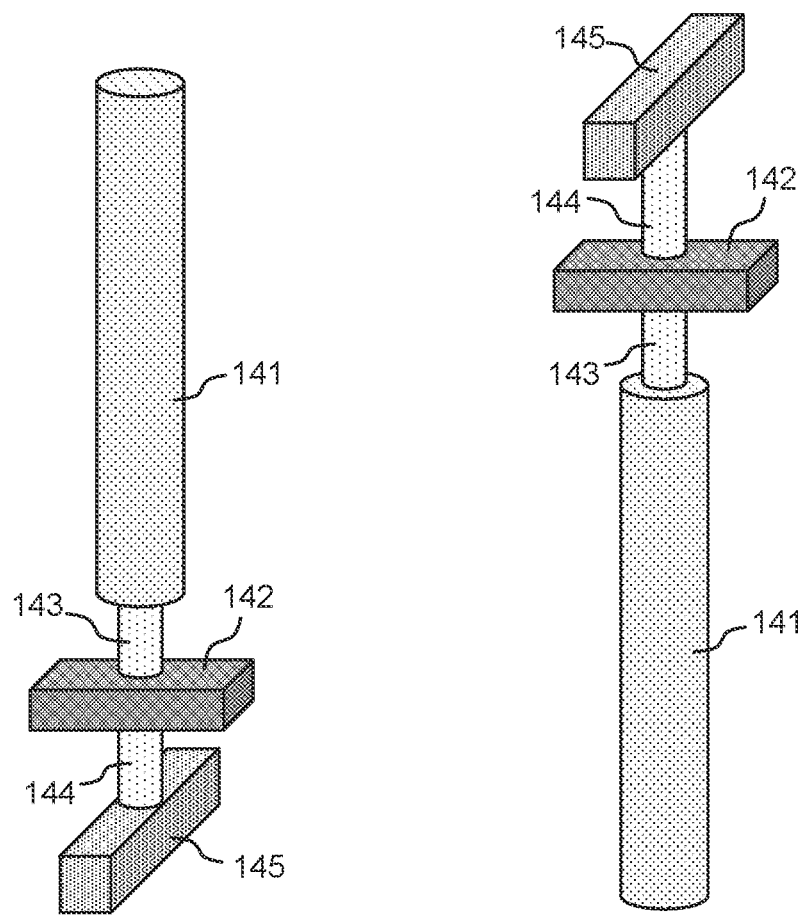

METHODS AND APPARATUS FOR A NOVEL MEMORY ARRAY

CROSS-REFERENCE TO RELATED APPLICATIONS

This application is a continuation-in-part (CIP) of U.S. patent application Ser. No. 17/506,628 filed on Oct. 20, 2021 and entitled "Methods and Apparatus for NAND Flash Memory".

This application claims the benefit under 35 U.S.C. § 119 of U.S. Provisional Patent Application No. 63/250,238 filed on Sep. 30, 2021 and entitled "Memory Array Architecture and Operations" and U.S. Provisional Patent Application No. 63/287,543 filed on Dec. 9, 2021 and entitled "Memory Array and Circuit Architecture" and U.S. Provisional Patent Application No. 63/296,160 filed on Jan. 3, 2022 and entitled "XL-DRAM (XL-RAM)—Memory Array and Circuit Architecture" and U.S. Provisional Patent Application No. 63/298,978 filed on Jan. 12, 2022 and entitled "Y-DRAM (Y-RAM)—A Novel Memory Array and Circuit Architecture" and U.S. Provisional Patent Application No. 63/302,074 filed on Jan. 22, 2022 and entitled "X-DRAM (X-RAM)—A Novel Memory Array and Circuit Architecture" and U.S. Provisional Patent Application No. 63/306,085 filed on Feb. 2, 2022 and entitled "X-DRAM (X-RAM)—A Novel Memory Array and Circuit Architecture" and U.S. Provisional Patent Application No. 63/309,509 filed on Feb. 11, 2022 and entitled "X-DRAM (X-RAM)—A Novel Memory Array and Circuit Architecture" all of which are hereby incorporated herein by reference in their entireties.

The application Ser. No. 17/506,628 is a continuation-in-part (CIP) of U.S. patent application Ser. No. 17/492,553 filed on Oct. 1, 2021 and entitled "METHODS AND APPARATUS FOR NAND FLASH MEMORY." The application Ser. No. 17/506,628 claims the benefit under 35 U.S.C. § 119 of U.S. Provisional Patent Application No. 63/171,580, filed on Apr. 7, 2021 and entitled "NAND FLASH MEMORY AND OPERATIONS" and U.S. Provisional Patent Application No. 63/094,343, filed on Oct. 20, 2020 and entitled "NAND FLASH MEMORY READ AND WRITE OPERATIONS" and U.S. Provisional Patent Application No. 63/104,305, filed on Oct. 22, 2020 and entitled "NAND FLASH MEMORY READ AND WRITE OPERATIONS" and U.S. Provisional Patent Application No. 63/105,877, filed on Oct. 27, 2020 and entitled "NAND FLASH MEMORY READ AND WRITE OPERATIONS" and U.S. Provisional Patent Application No. 63/107,386, filed on Oct. 29, 2020 and entitled "NAND FLASH MEMORY READ AND WRITE OPERATIONS" and U.S. Provisional Patent Application No. 63/112,038, filed on Nov. 10, 2020 and entitled "NAND FLASH MEMORY MULTIPLE-LEVEL-CELL READ AND WRITE OPERATIONS" and U.S. Provisional Patent Application No. 63/116,159, filed on Nov. 19, 2020 and entitled "NAND FLASH MEMORY MULTIPLE-LEVEL-CELL READ AND WRITE OPERATIONS," all of which are hereby incorporated herein by reference in their entireties.

The application Ser. No. 17/492,553 is a continuation-in-part (CIP) of U.S. patent application Ser. No. 17/446,165 filed on Aug. 26, 2021 and entitled "METHODS AND APPARATUS FOR NAND FLASH MEMORY." The application Ser. No. 17/492,553 claims the benefit under 35 U.S.C. § 119 of U.S. Provisional Patent Application No. 63/086,543, filed on Oct. 1, 2020 and entitled "NAND FLASH MEMORY READ AND WRITE OPERATIONS" and U.S. Provisional Patent Application No. 63/090,171, filed on Oct. 9, 2020 and entitled "NAND FLASH MEMORY MULTIPLE-LEVEL-CELL READ AND WRITE OPERATIONS" and U.S. Provisional Patent Application No. 63/094,343, filed on Oct. 20, 2020 and entitled "NAND FLASH MEMORY READ AND WRITE OPERATIONS" and U.S. Provisional Patent Application No. 63/104,305, filed on Oct. 22, 2020 and entitled "NAND FLASH MEMORY READ AND WRITE OPERATIONS" and U.S. Provisional Patent Application No. 63/105,877, filed on Oct. 27, 2020 and entitled "NAND FLASH MEMORY READ AND WRITE OPERATIONS" and U.S. Provisional Patent Application No. 63/107,386, filed on Oct. 29, 2020 and entitled "NAND FLASH MEMORY READ AND WRITE OPERATIONS" and U.S. Provisional Patent Application No. 63/112,038, filed on Nov. 10, 2020 and entitled "NAND FLASH MEMORY MULTIPLE-LEVEL-CELL READ AND WRITE OPERATIONS" and U.S. Provisional Patent Application No. 63/116,159, filed on Nov. 19, 2020 and entitled "NAND FLASH MEMORY MULTIPLE-LEVEL-CELL READ AND WRITE OPERATIONS," all of which are hereby incorporated herein by reference in their entireties.

The application Ser. No. 17/446,165 is a continuation-in-part (CIP) of U.S. patent application Ser. No. 17/330,304 filed on May 25, 2021 and entitled "METHODS AND APPARATUS FOR NAND FLASH MEMORY." The application Ser. No. 17/446,165 claims the benefit under 35 U.S.C. § 119 of U.S. Provisional Patent Application No. 63/107,386, filed on Oct. 29, 2020, and entitled "NAND Flash Memory Read and Write Operations," and U.S. Provisional Patent Application No. 63/105,877, filed on Oct. 27, 2020, and entitled "NAND Flash Memory Read and Write Operations," and U.S. Provisional Patent Application No. 63/091,895, filed on Oct. 14, 2020, and entitled "NAND Flash Memory Read and Write Operations," and U.S. Provisional Patent Application No. 63/070,266, filed on Aug. 26, 2020, and entitled "NAND Flash Memory Read and Write Operations, all of which are hereby incorporated herein by reference in their entireties.

The application Ser. No. 17/330,304 is a continuation of U.S. patent application Ser. No. 16/849,875 filed on Apr. 15, 2020 and entitled "METHODS AND APPARATUS FOR NAND FLASH MEMORY." The application Ser. No. 16/849,875 is a continuation-in-part (CIP) of U.S. patent application Ser. No. 16/687,556, filed on Nov. 18, 2019 and entitled "METHODS AND APPARATUS FOR NAND FLASH MEMORY." The application Ser. No. 16/687,556 claims the benefit under 35 U.S.C. § 119 of U.S. Provisional Patent Application No. 62/843,556, filed on May 5, 2019, and entitled "NAND Flash Memory Read and Write Operations," and U.S. Provisional Patent Application No. 62/848,567, filed on May 15, 2019, and entitled "NAND Flash Memory Read and Write Operations," and U.S. Provisional Patent Application No. 62/871,198, filed on Jul. 7, 2019, and entitled "NAND Flash Memory Read and Write Operations," and U.S. Provisional Patent Application No. 62/884,139, filed on Aug. 7, 2019, and entitled "NAND Flash Memory Read and Write Operations," all of which are hereby incorporated herein by reference in their entireties.

The application Ser. No. 16/687,556 claims the benefit under 35 U.S.C. § 119 of U.S. Provisional Patent Application No. 62/768,979, filed on Nov. 18, 2018, and entitled "NAND Flash Memory Read and Write Operations," and U.S. Provisional Patent Application No. 62/770,150, filed on Nov. 20, 2018, and entitled "NAND Flash Memory Read and Write Operations," and U.S. Provisional Patent Application No. 62/774,128, filed on Nov. 30, 2018, and entitled "NAND Flash Memory Read and Write Operations," and U.S. Provisional Patent Application No. 62/783,199, filed on Dec. 20, 2018, and entitled "NAND Flash Memory Read and Write Operations," and U.S. Provisional Patent Application No. 62/799,669, filed on Jan. 31, 2019, and entitled "NAND Flash Memory Read and Write Operations," all of which are hereby incorporated herein by reference in their entireties.

FIELD OF THE INVENTION

The exemplary embodiments of the present invention relate generally to the field of semiconductors and integrated circuits, and more specifically to the design and operation of memory arrays.

BACKGROUND OF THE INVENTION

Memory devices are extensively used in industrial and consumer electronics. In many cases, the limitations of the memory affect the size, performance, or cost of an industrial or consumer device, such as a mobile phone.

Existing memory device have undesirable issues such as high latency, low data throughput, and high power consumption. Thus, it is desirable to have a memory architecture and associated operations that can provide extremely low latency, high data throughput, and low power consumption for read and write operations.

SUMMARY

In various exemplary embodiments, a memory architectures and methods are provided for use with dynamic random-access memory (DRAM) applications. The technology of the disclosed architecture is referred to as 'X-DRAM' or 'X-RAM' technology.

In an embodiment, a method is provided for reading a dynamic random-access memory (DRAM) array. The method includes activating the bit line select gates to equalize voltage levels on a plurality of bit lines, deactivating the bit line select gates to maintain the equalized voltage levels on the plurality of bit lines using a bit line capacitance associated with each bit line, and activating a selected word line to access selected memory cells connected to the selected word line. The method also includes activating bit line select gates to pass first data from a first bit line and second data from a second bit line to the sense amplifier. The first data is from a selected memory cell and the second data is reference data. The method also includes determining sensed data from the first and second data. The method also includes activating unselected bit line select gates sequentially or randomly to pass data from the unselected bit lines to the sense amplifier. The sense amplifier senses the data of the unselected bit lines and restores the data back to the unselected cells.

In an embodiment, a dynamic random-access memory (DRAM) array is provided that comprises a first plurality of bit lines and a first plurality of word lines connected to a first memory cell array, a first plurality of bit line select gates that selectively connect to the first plurality of bit lines to a first data line, a second plurality of bit lines and a second plurality of word lines connected to a second memory cell array, and a second plurality of bit line select gates that selectively connect to the second plurality of bit lines to a second data line. The DRAM array also comprises an equalizer coupled to first and second data lines; and a sense amplifier coupled to the first and second data lines.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 8-9 show two types of exemplary DRAM cells using vertical transistors as the cell's select gate.

DETAILED DESCRIPTION

This application describes the details of memory array architectures and operations (methods) for DRAM applications. This technology is named 'X-DRAM' or 'X-RAM' technology. In addition to DRAM, the invention may be applied to any suitable applications, such as embedded memory, cache memory, storage class memory, and many others.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1A:
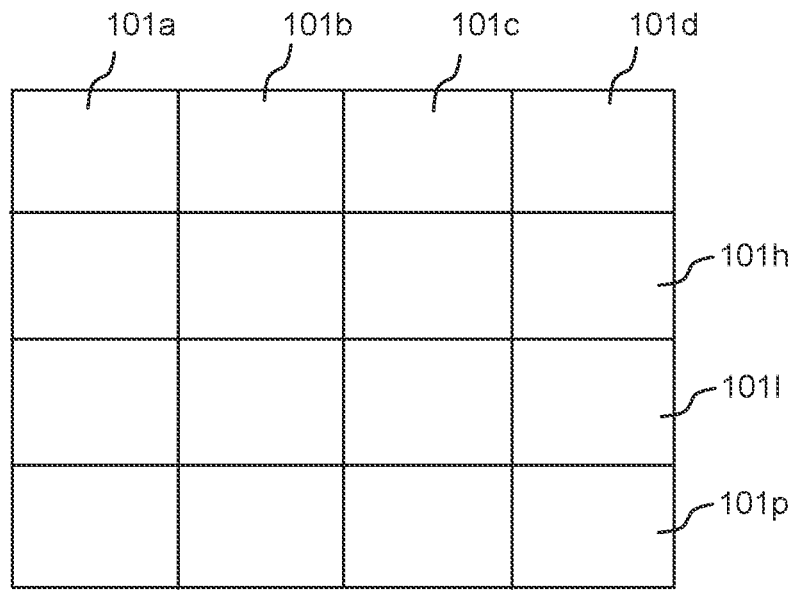
FIG. 1A shows a conventional array architecture for DRAM.

FIG. 1A shows a conventional array architecture for DRAM. The array shown in FIG. 1A can be divided into multiple banks, such as banks 101a to 101p.

Figure 1B:
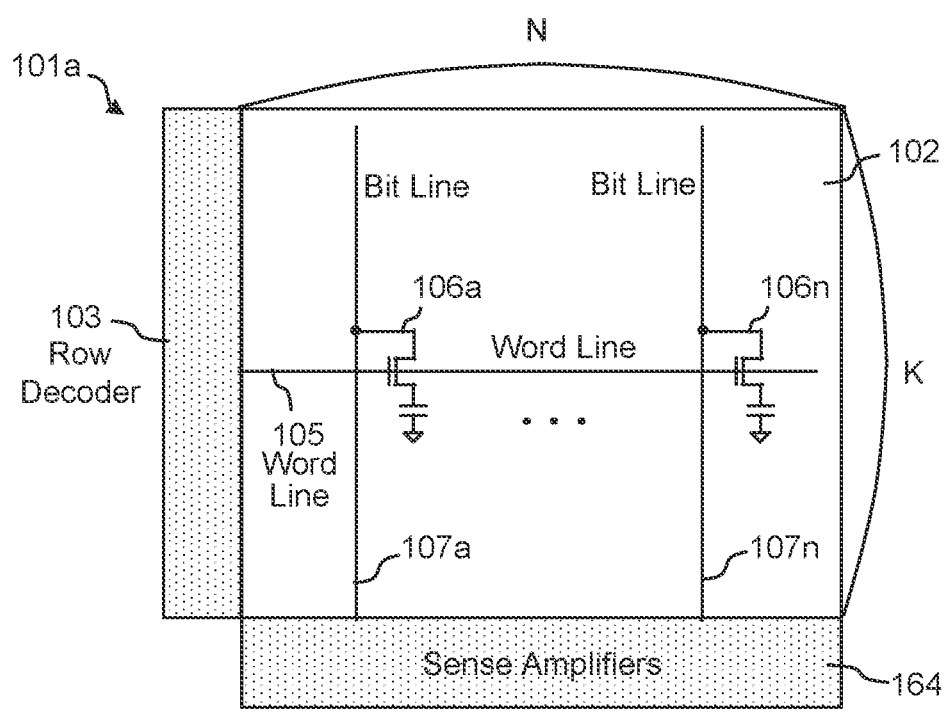
FIG. 1B shows the structure of one bank of the conventional array shown in FIG. 1A.

FIG. 1B shows the structure of one bank of the conventional array shown in FIG. 1A, such as bank 101a. The bank 101a includes a cell array 102 that comprises K word lines (WL) (e.g., WL 105) and N bit lines (BL) (e.g., BL 107a to 107n). A word line, such as WL 105, is connected to multiple DRAM cells, such as cells (106a to 106n). A row decoder 103 selects one word line to be enabled or disabled, such as WL 105, from a plurality of input word lines (not shown). The selected enabled word line (105) can access the selected cells (106a to 106n) and cause charge-sharing to occur between the cells' capacitors and the bit line capacitances of the associated bit lines (107a to 107n).

The bit lines (107a to 107n) are connected to a sense amplifier circuit 164 comprising multiple sense amplifiers. In the conventional array shown in FIG. 1B, each bit line is connected to one sense amplifier. Therefore, the number of the sense amplifiers in the sense amplifier circuit 164 is equal to the number of the bit lines. The sense amplifiers of the sense amplifier circuit 164 sense the voltage of the bit lines 107a to 107n to determine the data of the cells (106a to 106n). During write operations, the sense amplifiers of the sense amplifier circuit 164 will apply input data to the bit lines (107a to 107n). A row decoder 103 selects the word line 105, which is enabled to access the cells (106a to 106n) to write the data on the bit lines (107a to 107n) to the cells (106a to 106n).

When the array shown in FIG. 1A is divided into more banks along the bit line direction, the bit line length in each bank is reduced. This reduces the bit line capacitance, and thus the read and write speeds can be increased. However, because each bit line needs to be connected to one sense amplifier, dividing the array into more banks along the bit line direction will increase the number of sense amplifiers as well as the die size, which will increase the die cost as well.

To address the issues of die size and cost, embodiments of the invention disclose a novel DRAM architecture to significantly reduce the size of the sense amplifier circuit in each bank of the array. Therefore, the array can be divided into more banks to increase speed without increasing the die size.

Figure 1C:
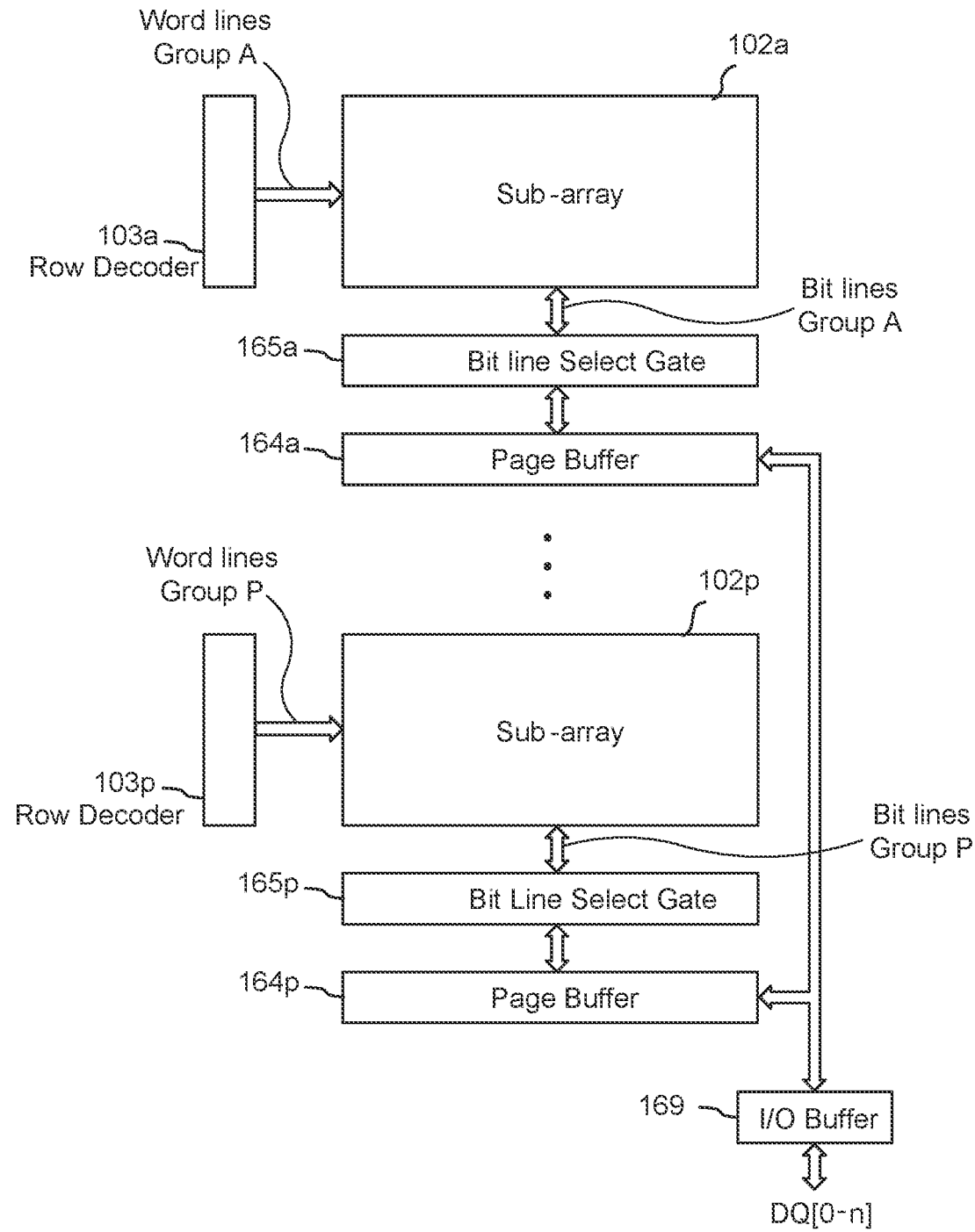
FIG. 1C shows an embodiment of a conventional memory array architecture.

FIG. 1C shows an embodiment of a conventional memory array architecture. The architecture divides a memory array into multiple sub-arrays (102a to 102p). In each sub-array, word lines are connected to row decoders (103a to 103p), and bit lines are connected to page buffers (164a to 164p) through bit line select gates (165a to 165p). The bit line select gates (165a to 165p) each operate to connect multiple bit lines to a corresponding page buffer. Assuming the number of bit lines in each sub-array is N, then M bit lines are connected to one page buffer through the bit line select gates. This reduces the number of the page buffers 164a to N/M. For DRAM application, the page buffers (164a to 164p) comprise sense amplifier circuits.

During write operations, an Input/Output (I/O) buffer 169 loads data from data bus (DQ[0-n]) to the page buffers (164a to 164p). In this implementation, 'n' is a suitable number such as 7, 15, 31, and so on. During read operations, the I/O buffer 169 outputs data from the page buffers (164a to 164p) to the data bus DQ[0-n].

Figure 1D:
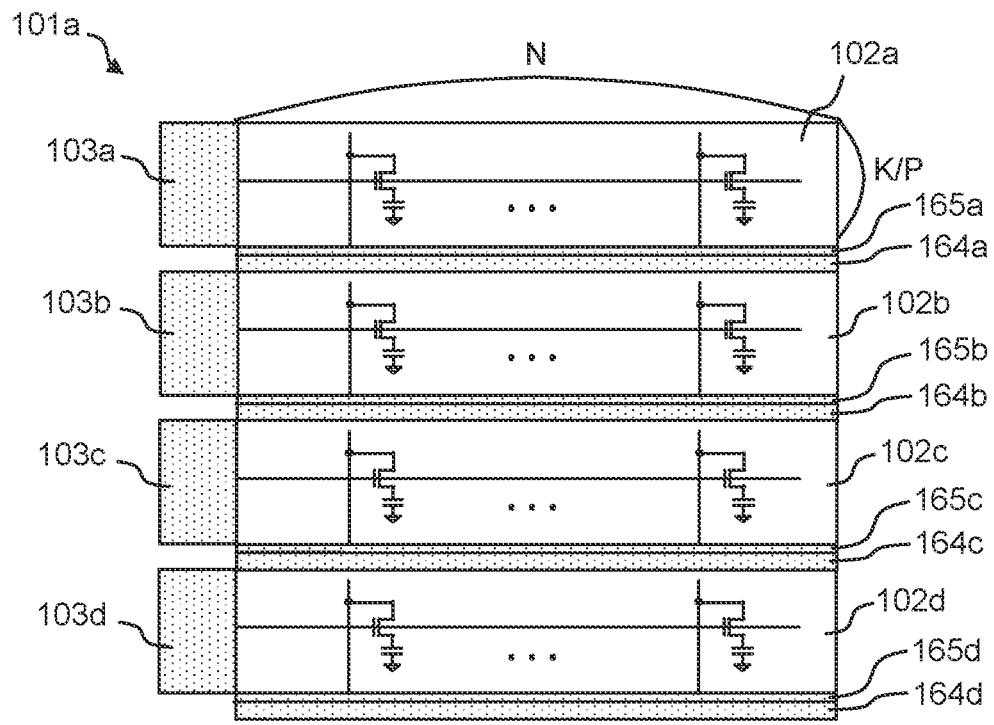
FIG. 1D shows an embodiment in which the architecture shown in FIG. 1C is applied to a DRAM application according to the invention.

FIG. 1D shows an embodiment in which the architecture shown in FIG. 1C is applied to a DRAM application according to the invention. A bank 101a is divided into multiple smaller banks or sub-arrays (102a to 102d). Assuming each bank is divided into P sub-arrays, each sub-array comprises K/P word lines. The word lines of the sub-arrays (102a to 102d) are connected to row decoders (103a to 103d).

In accordance with conventional memory, forming the P sub-array will increase the layout size of the sense amplifier circuits by a factor of P, because each sub-array needs to connect all the bit lines to a sense amplifier (SA) circuit, such as SA 164 shown in FIG. 1B. Thus, the die size is significantly increased. However, in accordance with the invention, the bit lines of each sub-arrays (102a to 102d) are connected to the sense amplifier circuits (164a to 164d) through the bit line select gates (165a to 165d), which multiplex multiple bit lines to one sense amplifier. This significantly reduces the number of the sense amplifiers (164a to 164p). Because the layout size of the bit line select gates (165a to 165p) are much smaller compared with that of the sense amplifier circuits, the total layout size of the bit line select gates (165a to 165p) and the sense amplifier circuits (164a to 164p) is similar to or smaller than the sense amplifier circuit 164 shown in FIG. 1B.

Figure 1E:
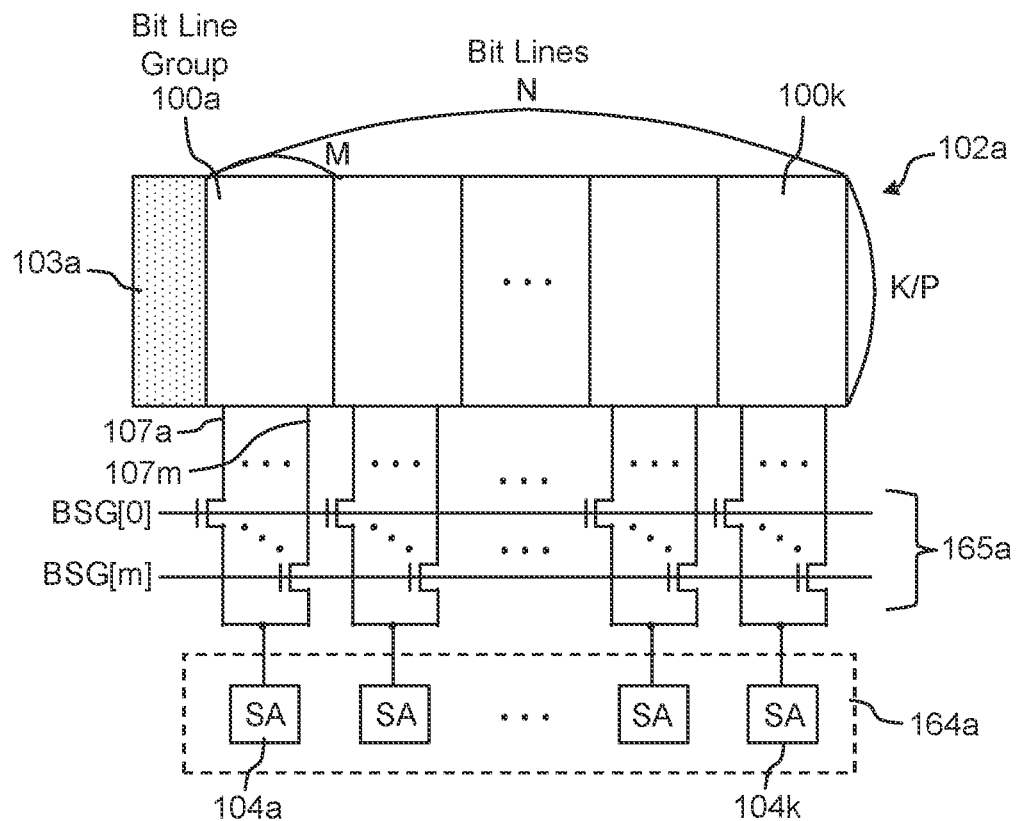
FIG. 1E shows an embodiment of one sub-array of the array architecture shown in FIG. 1D.

FIG. 1E shows an embodiment of one sub-array, such as (sub-array 102a), of the array architecture shown in FIG. 1D. FIG. 1E illustrates the row decoder 103a, bit line select gates 165a, and the sense amplifier circuit 164a. Assuming the sub-array 102a has a total of N bit lines, the bit lines are divided into multiple bit line groups (100a to 100k). Each bit line group, such as 100a, comprises M bit lines (107a to 107m). The M bit lines (107a to 107m) are connected to one sense amplifier, such as sense amplifier 104a, through the bit line select gates 165a. The bit line select gates 165a will select one bit line out of the M bit lines (107a to 107m) to be connected to the sense amplifier 104a. By using this architecture, the number of sense amplifiers of the sub-array can be reduced from N to N/M.

Figure 2A:
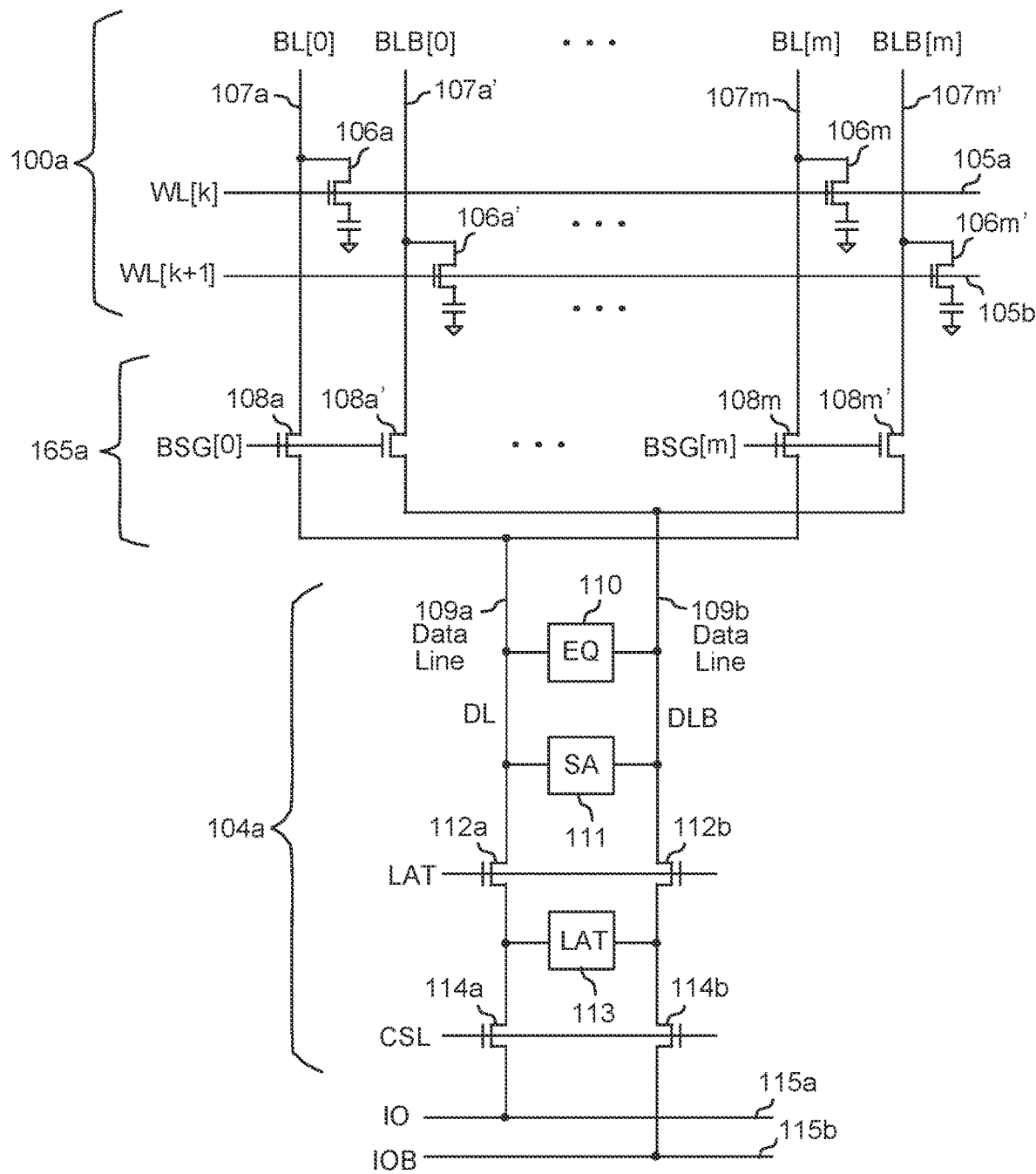
FIG. 2A shows the detailed structure of one bit line group shown in FIG. 1E.

FIG. 2A shows the detailed structure of one bit line group, such as BL group 100a shown in FIG. 1E. FIG. 2A illustrates bit line select gates 165a and sense amplifier circuit 104a. The bit lines are divided into two sub-groups, BL[0-m] (107a to 107m) and BLB[0-m](107a' to 107m'). The first sub-group of bit lines (107a to 107m) are connected to a data line (DL) 109a through the bit line select gates (108a to 108m). The second sub-group of bit lines (107a' to 107m') are connected to another data line, (DLB) 109b through the bit line select gates (108a' to 108m'). The bit lines select gates (108a to 108m) and (108a' to 108m') are connected to the bit line select gate signals BSG[0] to BSG[m] as shown.

The data lines 109a and 109b are connected to an equalizer circuit (EQ) 110 and a sense amplifier (SA) circuit 111. The data lines 109a and 109b are also connected to a data latch (LAT) 113 through the pass gates 112a and 112b, which are enabled/disabled by a LAT signal. The data latch 113 is connected to the input/output (I/O) data bus 115a and 115b through column select gates 114a and 114b. A column select line (CSL) signal enables/disables the column select gates 114a and 114b.

In this embodiment, the cells on the first and second groups of bit lines, such as cell 106a and cell 106a', are connected to different word lines 105a and 105b, respectively. When one word line, such as 105a, is selected (enabled), it will only access one cell, such as 106a connected to the bit line 107a, to cause charge-sharing to occur with the one bit line 107a. The other bit line 107a' without the selected cell will be used as a reference bit line. Similarly, when the word line 105b is selected, it will only access one cell 106a' to cause charge-sharing to occur with the bit line 107a'. The other bit line 107a without the select cell will be used as a reference bit line.

Figure 2B:
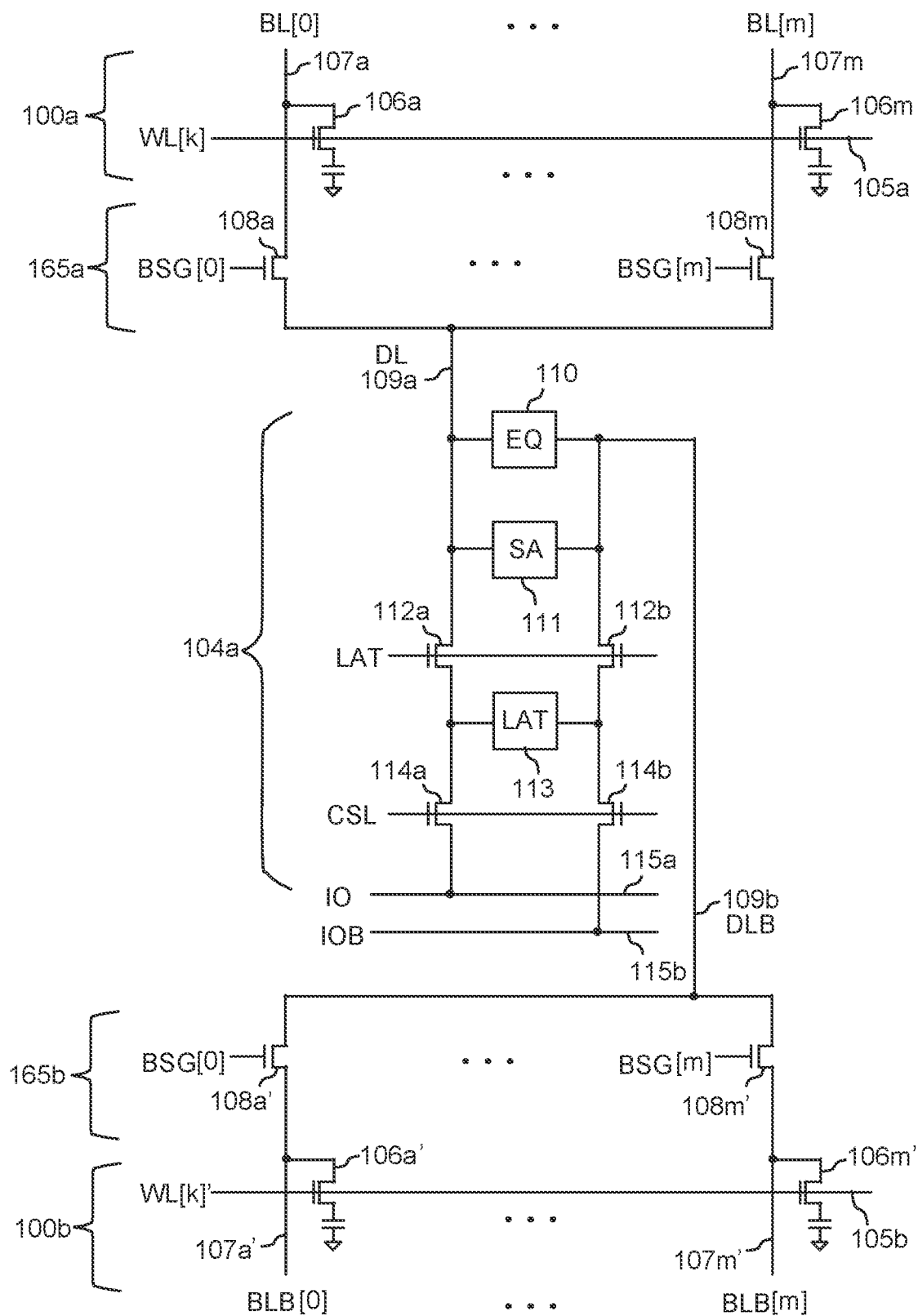
FIG. 2B shows another embodiment of the array and circuit architecture according to the invention.

FIG. 2B shows another embodiment of the array and circuit architecture according to the invention. This embodiment is similar to the one shown in FIG. 2A except that the two groups of bit lines BL[0-m] (107a to 107m) and BLB[0-m] (107a' to 107m') are located in two bit line groups 100a and 100b as shown. The two bit line groups 100a and 100b are connected to a sense amplifier circuit 104a through the bit line select gates 165a and 165b, respectively. In this embodiment, the cells (106a to 106m) on the first group of bit lines (107a to 107m) are all connected to the word line 105a. The cells (106a' to 106m') on the second group of bit lines (107a' to 107m') are all connected to the word line 105b.

During read operations, only one word line, such as 105a or 105b will be selected to access the cells (106a to 106m) or (106a' to 106m') to cause charge-sharing to occur in one group of bit lines, such as (107a to 107m) or (107a' to 107m'). The other unselected groups of bit lines will be used as reference bit lines.

Figure 2C:
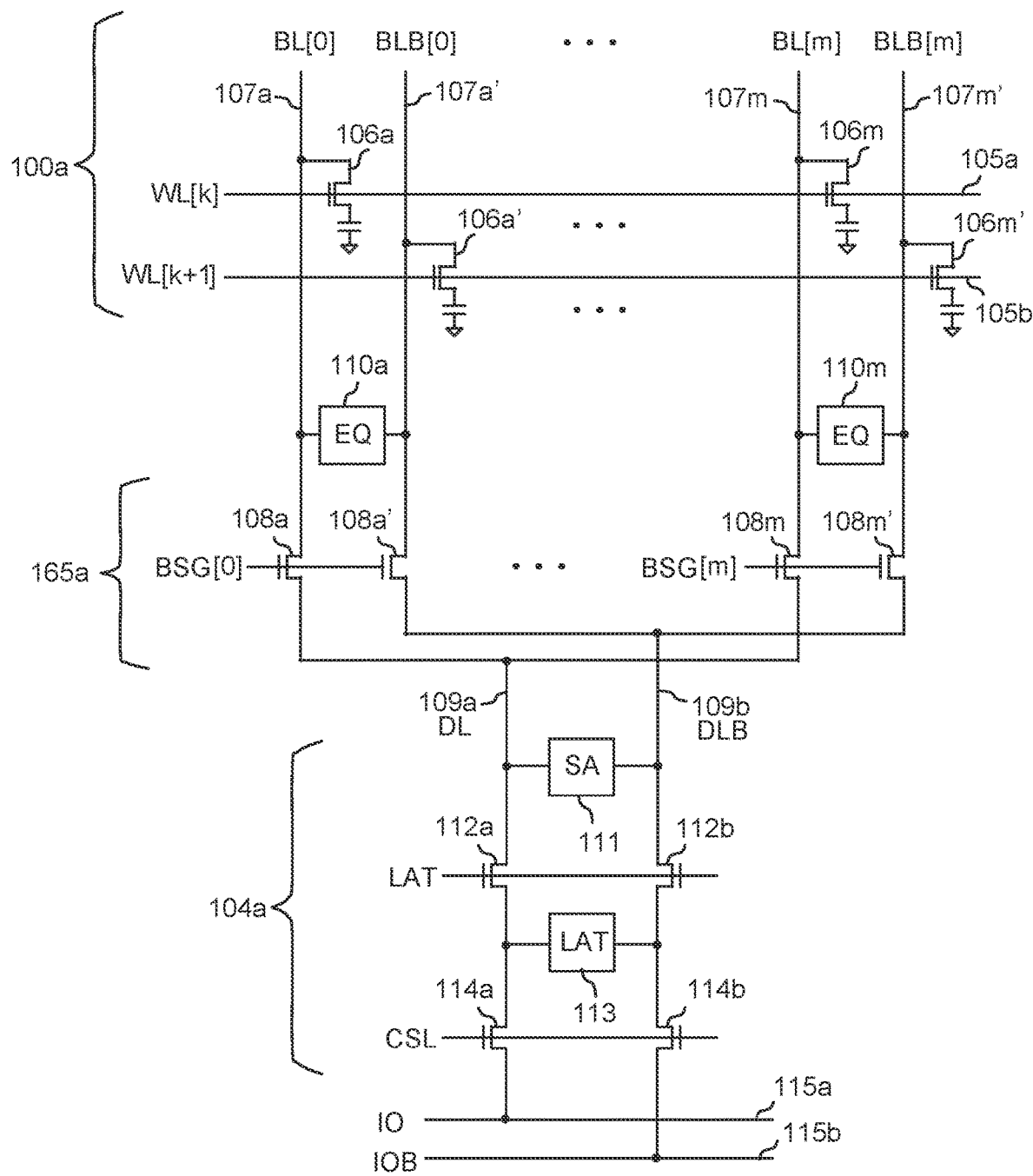
FIG. 2C shows another embodiment of an array and circuit architecture according to the invention.

FIG. 2C shows another embodiment of an array and circuit architecture according to the invention. This embodiment is similar to the one shown in FIG. 2A except that the equalizer circuits (110a to 110m) are connected to the bit lines (107a to 107m) and (107a' to 107m') instead of the data lines 109a and 109b. This increases the driving capability of the equalizer circuits 110a to 110m and reduces pre-charging time.

Figure 2D:
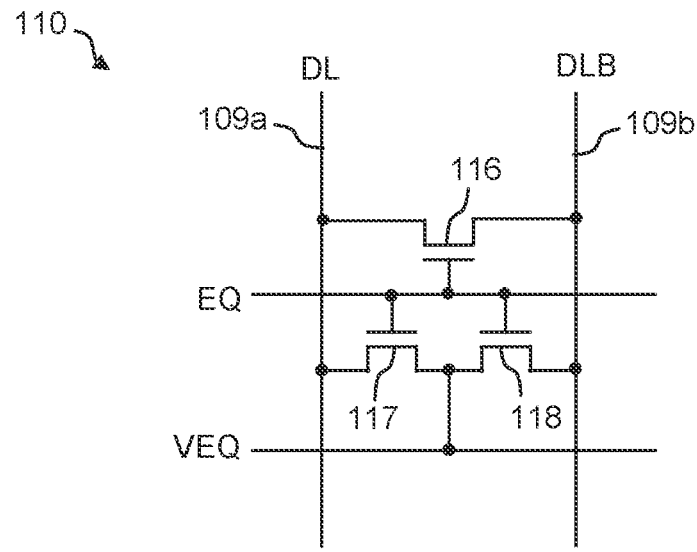
FIG. 2D shows an embodiment of the equalizer circuit.

FIG. 2D shows an embodiment of the equalizer circuit 110. When an equalization (EQ) signal goes high, it will turn on the NMOS transistors (116, 117, 118) to set the voltage of the data lines (109a and 109b) to be the same as the equalization voltage VEQ. A typical voltage for VEQ is approximately ½ VDD but can be set to any other desired level from 0V to VDD. This equalizer circuit 110 is exemplary and there are many other circuit designs that may be implemented to accomplish the same result. These implementations and improvements shall remain in the scope of the invention.

Figure 2E:
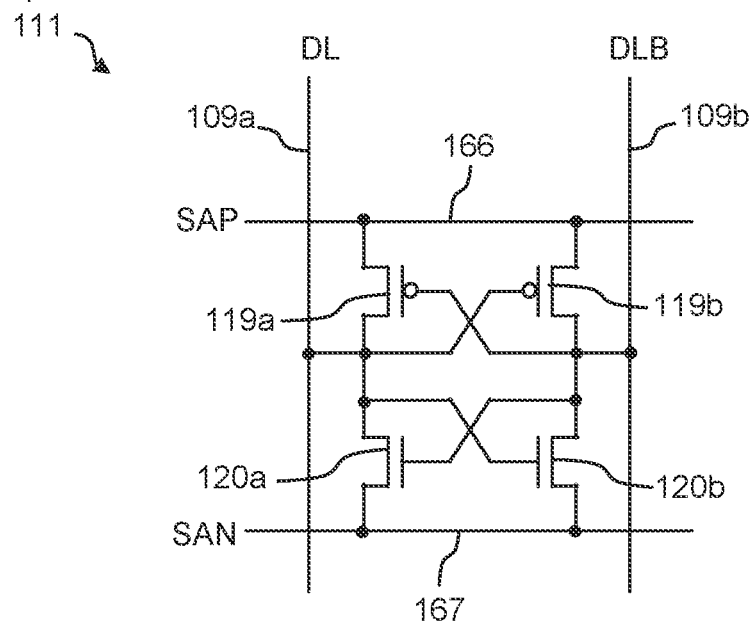
FIG. 2E shows an embodiment of the sense amplifier.

FIG. 2E shows an embodiment of the sense amplifier circuit 111. The PMOS transistors 119a and 119b and NMOS transistors 120a and 120b are connected to the sense amplifier power line P (SAP) 166 and sense amplifier power line N (SAN) 167, respectively. During read operations, the initial voltage of SAP and SAN are set to the equalization voltage VEQ, such as ½ VDD. This will turn off the transistors 119a, 119b, 120a, and 120b to make the data lines 109a and 109b floating. This allows the selected cell to set the voltages of the data lines 109a and 109b during the charge-sharing operation. After the charge-sharing, the power line SAN is pulled low to 0V to turn on the transistors 120a or 120b to pull down the data lines 109a or 109b based on their initial voltage. Then, the power line SAP is pulled high to VDD to turn on the transistors 119a and 119b to pull up the data lines 109a or 109b based on their initial voltage. Consequentially, the voltage of the data lines 109a and 109b are developed into full VDD and ground levels from their charge-sharing level.

The circuit shown in FIG. 2E is exemplary and there are many other circuit designs that may be implemented to achieve the same result. These implementations and improvements shall remain in the scope of the invention. The data latch 113 may be implemented with the same sense amplifier circuit shown in FIG. 2E, or by using any other typical data latch circuit.

Referring again to FIG. 2B, the bit line select gate signals BSG[0-m] select one bit line (e.g., 107a) from BL[0-m] (107a to 107m) in the bit line group 100a to connect the selected cell 106a to the sense amplifier circuit 104a.

Please notice, that since DRAM cells use a unique charge-sharing mechanism during read operations, turning on a bit line select gate to connect a selected bit line to the sense amplifier and leaving the other bit line select gates off will cause data loss for the other unselected bit lines. This prevents the traditional DRAM from using the bit line select gates. To solve this problem, embodiments of the invention provide a special read operation as shown in FIGS. 2F-I and described below.

FIGS. 2F-I shows an embodiment of a special read operation for DRAM cells for use with embodiments of the array architecture of the invention. The read operation comprises four steps: (1) Bit line pre-charge, (2) Bit lines and cells charge-sharing, (3) Read selected cell, and (4) Restore unselected Cells, as shown in FIGS. 2F-I, respectively.

Figure 2F:
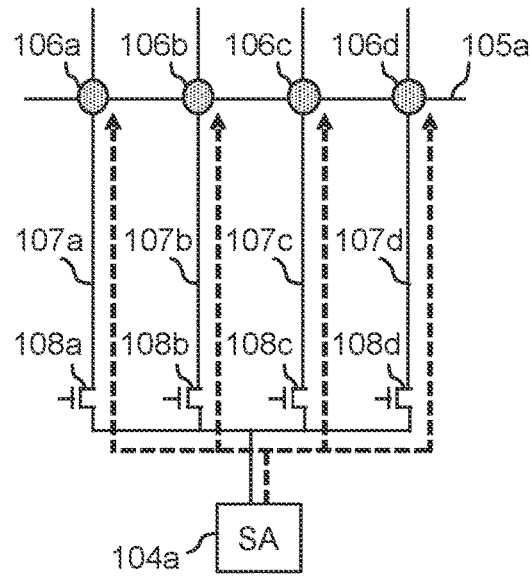
FIGS. 2F-I show embodiments of a special read operation for DRAM cells according to array architecture of the invention.

FIG. 2F shows an embodiment of a bit line pre-charge operation. It will be assumed that four bit lines (107a to 107d) are connected to a sense amplifier 104a through bit line select gates (108a to 108d). It will also be assumed that four cells (106a to 106d) on word line 105a are selected. During pre-charging, all the bit line select gates (108a to 108d) are turned on to allow the bit lines (107a to 107d) to be pre-charged and equalized to a selected voltage level, such as ½ VDD or any desired voltage from 0V to VDD, by the sense amplifier 104a and/or other pre-charging/equalizer circuit. This prevents data loss on the unselected bit lines during the next charge-sharing step. It should be noted that the pre-charging voltage of ½ VDD is just an example, and that other voltages in the range of 0V to VDD can be utilized. After the bit lines (107a to 107d) are successfully pre-charged, the bit line select gates (108a to 108d) are turned off and the bit line voltages are maintained by the capacitance associated with each bit line (e.g., bit line capacitances).

Figure 2G:
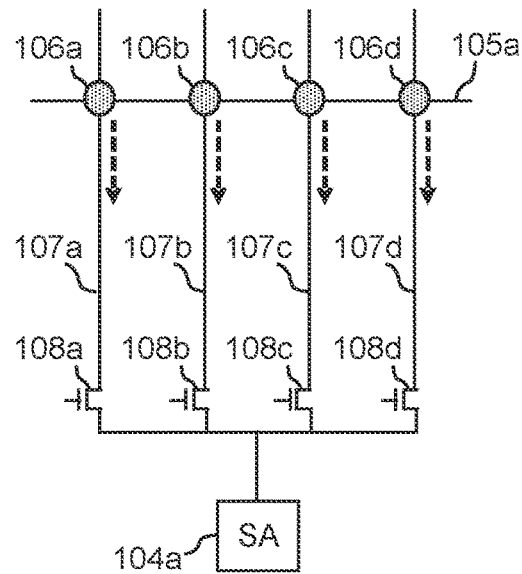

FIG. 2G shows an embodiment of a bit line and cell charge-sharing operation. The selected word line 105a is supplied with an access voltage, which turns on the select transistors of the cells (106a to 106d) to cause charge-sharing to occur between the cells' capacitors and the bit lines (107a to 107d). Because all the bit lines have been previously pre-charged to a proper voltage, such as ½ VDD or any desired voltage from 0V to VDD, the cells with the capacitors storing VDD will cause the bit lines to have a voltage level that is a little bit higher than the pre-charging voltage, and the cells with the capacitors storing 0V will cause the bit lines to have a voltage level that is a little bit lower than the pre-charging voltage. After charge-sharing, each bit line voltage is maintained by the associated bit line capacitance.

Figure 2H:
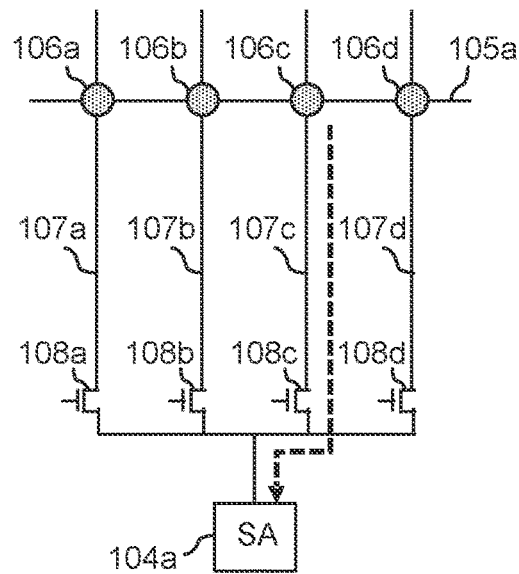

FIG. 2H shows an embodiment of an operation to read a selected cell. The selected bit line select gate, such as 108c, is turned on. This will connect the selected bit line, such as 107c, to the sense amplifier 104a. The sense amplifier 104a will sense the bit line voltage to generate the output data and develop the bit line voltage to either full 0V or VDD levels. The full 0V or VDD levels will be written back to the selected cell 106c to restore the data of the selected cell 106c. Please notice, during this step, because the other bit line select gates are turned off, the bit line voltages of the unselected bit lines remain unchanged and are maintained by their bit line capacitance.

Figure 2I:
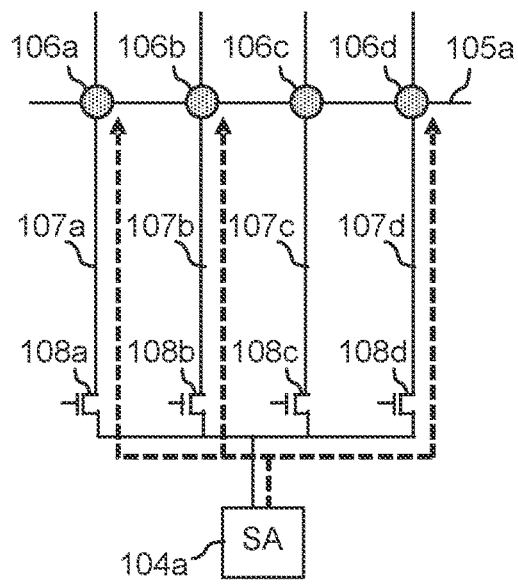

FIG. 2I shows an embodiment of an operation to restore data to unselected cells. The unselected bit line select gates 108a, 108b, and 108d are sequentially (or randomly) turned on for a period of time to connect the unselected bit lines 107a, 107b, and 107d to the sense amplifier 104a, respectively. For each bit line connected to the sense amplifier, the sense amplifier 104a senses the bit line voltage and develops the voltage of the unselected bit line to either full 0V or VDD levels to restore the data back to particular unselected cell of cells 106a, 106b, and 106d.

Referring again to FIG. 1E, it will be assumed the array comprises N/M bit line groups (100a to 100k). The bit line select gate signals BSG[0-m] select one bit line from one bit line group (100a to 100k), for a total N/M bit lines. The selected cells on these selected bit lines are defined as a 'page'. Therefore, the bit line select gate signals BSG[0-m] select PAGE[0] to PAGE[m], respectively, which is further illustrated in FIG. 3.

Figure 3:
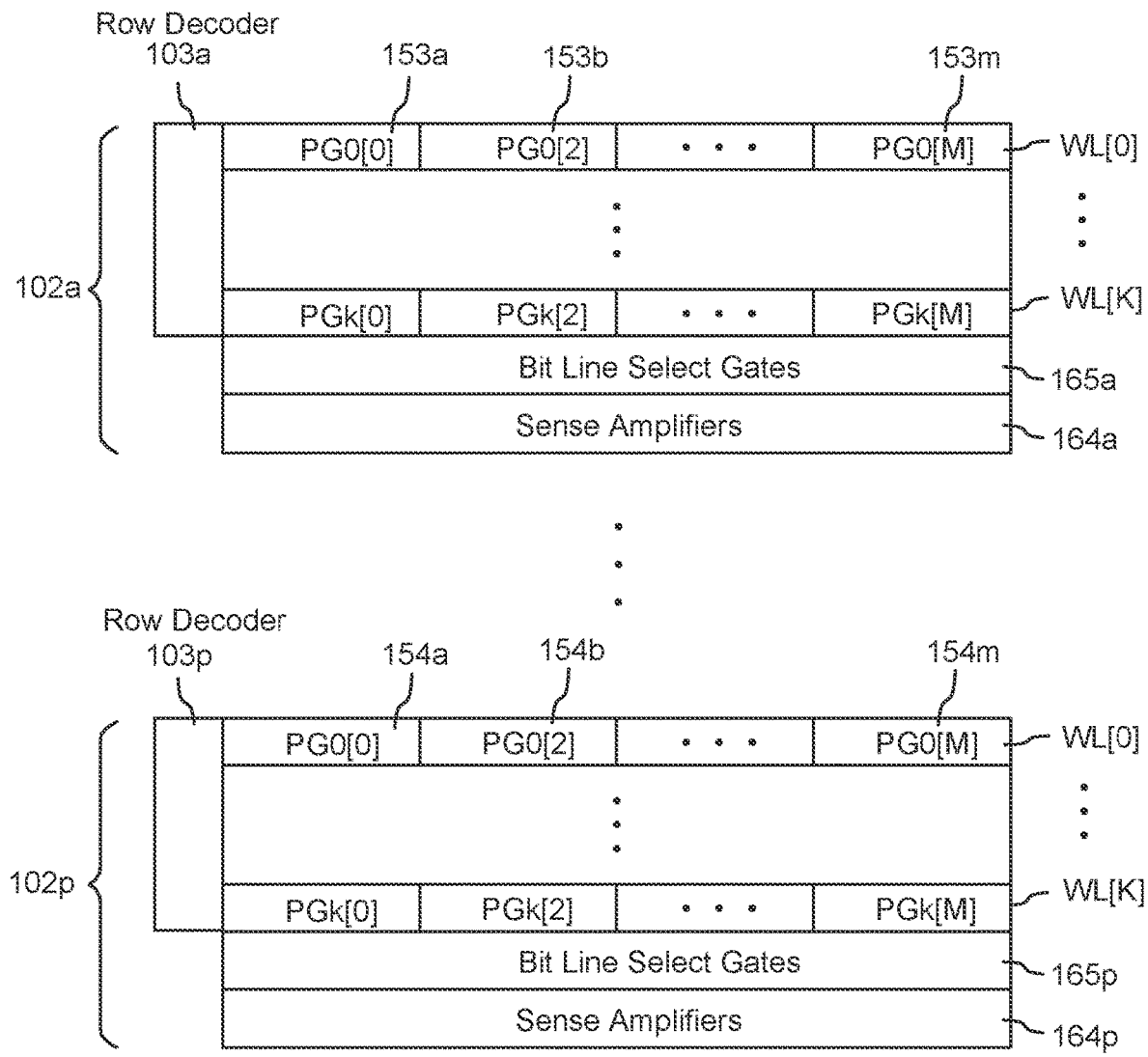
FIG. 3 shows an embodiment of the arrangement of the pages according to the invention.

FIG. 3 shows an embodiment of an arrangement of memory pages according to the invention. It will be assumed the array is divided into multiple sub-arrays (102a to 102p). Each sub-array comprises multiple word lines WL[0] to WL[K]. Each word line is divided into multiple pages. For example, the WL[0] in the sub-array 102a is divided into pages PG0[0-m](153a to 153m). The WL[1] in the sub-array 102p is divided into pages PG0[0-m] (154a to 154m). The pages are selected by the bit line select gates 165a to 165p. During read and write operations, multiple pages in the sub-arrays (102a to 102p) may be selected together. For example, the pages (153a to 154a) may be selected to perform the read and write operations together. This allows P pages of data to be read and written together. When using the multiple page read and write operations shown in FIG. 4C, the M pages of each sub-array (102a to 102p) can perform read and write operation together. Therefore, the total bandwidth may be increased by a factor of (M×P pages).

For conventional DRAM architecture, each bit line is connected to one sense amplifier. During read operations, all the bit lines are precharged, sensed, and restored in parallel by the sense amplifiers. However, for embodiments of the invention, because multiple bit lines are connected to one sense amplifier through the selection of bit line select gates, special operations are used to precharge all the bit lines, read the selected bit lines, and then restore the data of the unselected bit lines.

Figure 4A:
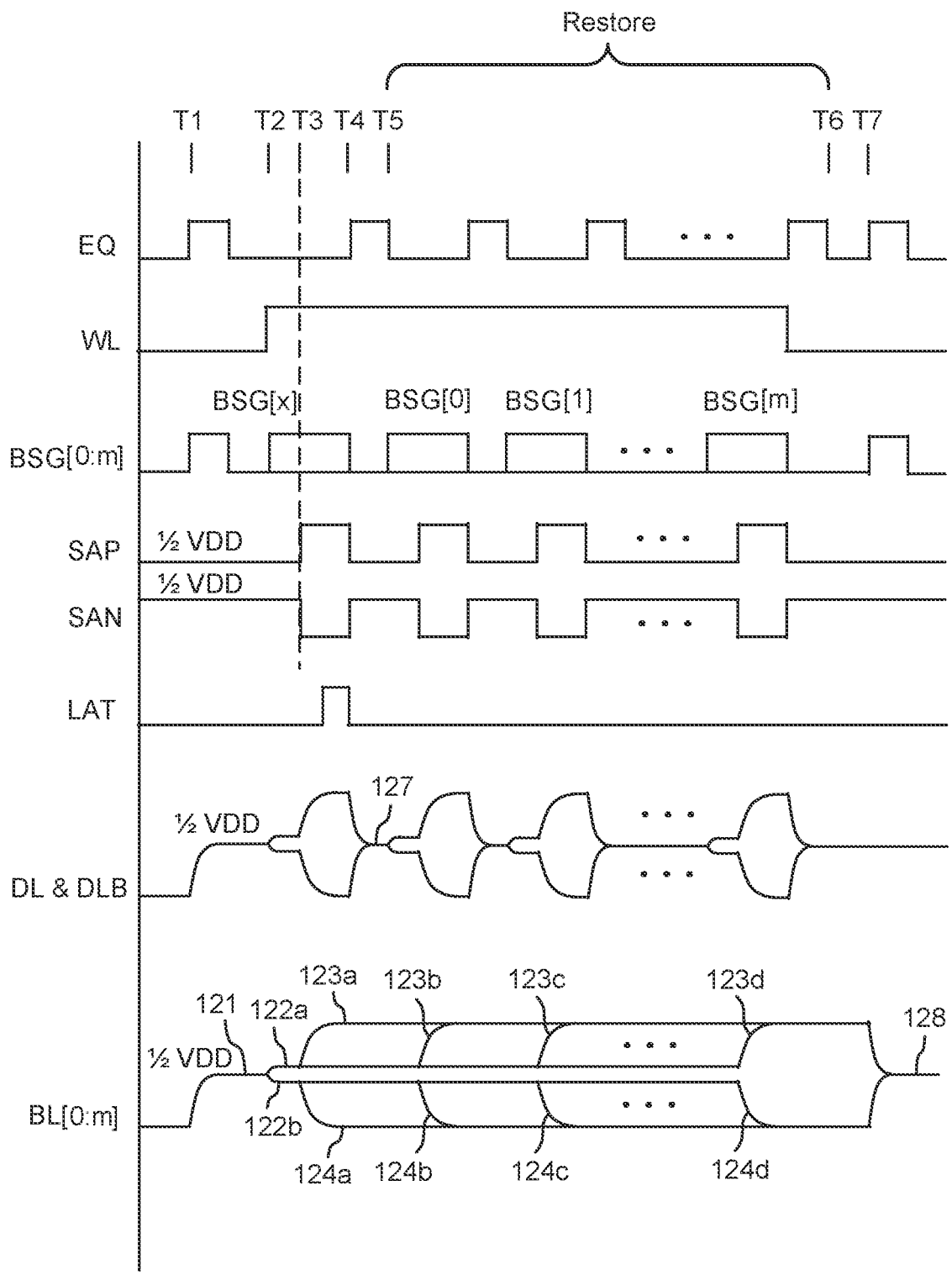
FIG. 4A shows an embodiment of waveforms for read operations according to the invention.

FIG. 4A shows an embodiment of waveforms for read operations according to the invention. Please refer to FIG. 2A for the array and circuit architecture description and FIG. 2D-E for detailed circuits of the equalizer circuit 110 and the sense amplifier 111. Assume the cell 106a shown in FIG. 2A is selected for a read operation. At time T1, all the bit line select gate signals BSG[0-m] go high to turn on the bit line select gates (108a to 108m) and (108a' to 108m'). The equalizer signal EQ shown in FIG. 2D goes high to enable the equalizer circuit 110 to pre-charge and equalize the levels of the data lines 109a and 109b and all the bit lines (107a to 107m) and (107a' to 107m') to about ½ VDD or any desired voltage from 0V to VDD, as shown at indicator 121 in FIG. 4A.

At time T2, the selected word line (WL) 105a goes high to turn on the select transistors of the DRAM cells (106a to 106m). Since all the cells (106a to 106m) shown in FIG. 2A are connected to the selected word line 105a, this will cause all the cells (106a to 106m) to start charge-sharing with the bit line capacitances associated with their connected bit lines and lose the voltage levels stored in the capacitors of the cells. Therefore, after the data of the selected cell 106a is read and restored, a 'restore' operation will be performed later to restore the data back to the unselected cells (106b to 106m), otherwise the data of the unselected cells will be lost.

Therefore, all the bit line select gates BSG[0:m] are turned on at time T1 to pre-charge all the bit lines to about ½ VDD or any desired voltage from 0V to VDD. Enabling the selected word line (105a) at time T2 will cause all the unselected bit lines to maintain the voltage levels as shown at 122a and 122b after charge-sharing. The indicators 122a and 122b show the results after charge-sharing for the cells' capacitors storing VDD and VSS, respectively. For example, cells storing VDD will charge-share with the bit line to a level higher than ½ VDD as shown at 122a, and cells storing VSS will charge-share with the bit line to a level lower than ½ VDD as shown by 122b. For example, the level is dependent on the ratio between the bit line capacitance and the cell capacitor. In one embodiment, the level is in the range of 30 millivolts to 100 millivolts. By using this method, all the cells' data is preserved by the bit line capacitance. This allows the data to be restored back to the cells, as shown from time T5 to time T6. If only the selected bit line pair 107a and 107a' are pre-charged at time T1, then all the data of the unselected cells on the bit lines (106b to 106m) will be lost.

From time T2 to T4, the data of the selected bit lines are read. Because multiple bit lines are connected to one sense amplifier, the bit line select gate signals BSG[0-m] will select one bit line pair such as 107a and 107a' to be connected to the sense amplifier. This allows the sense amplifier to sense the voltage of the selected bit line 107a and compare it with the voltage of the reference bit line 107a' to generate the read data. Meanwhile, the other unselected bit line select gates will remain turned off. This holds the data of the unselected bit lines in the bit line capacitances.

Assume the bit line select gate BSG[x] is selected, where the value of x is the number of the selected bit line select gate (from 0 to m). At time T2, the selected bit line select gate signal BSG[x] will go high to connect the selected bit line pair to the data lines 109a and 109b.

The power lines SAP and SAN shown in FIG. 2E of the sense amplifier are initially supplied with the equalization voltage, such as ½ VDD or any desired voltage from 0V to VDD. At time T3, the power lines SAP and SAN are pulled to VDD and 0V, respectively. This develops the voltage of the selected bit line pair from the charge-sharing voltage level (e.g., 122a and 122b) into full VDD and ground levels, as shown at indicators 123a and 124a. Then, the latch (LAT) signal will go high to turn on the pass gates 112a and 112b shown in FIG. 2A to store the data in the data latch 113. After the voltages of the bit line pair 123a and 124a are developed into VDD and ground levels, because the word line 105 is still selected, the data on the selected bit line pair 123a and 124a will be written back to the selected cells. This results in a restore operation for the selected cells.

At time T4, the signal LAT will go low to turn off the pass gates 112a and 112b to isolate the data latch 113 from the data lines 109a and 109b. After that, the column select line (CSL) signal, not shown in FIG. 4A, is randomly selected or sequentially selected to turn on the column select gates 114a and 114b to output the data from the data latch 113 to the I/O bus 115a and 115b.

At time T4, the selected bit line select gate signal BSG[x] goes low to isolate the data lines 109a and 109b from the selected bit line pair. The signals SAP and SAN of the sense amplifier 111 are disabled. The signal EQ goes high to equalize the data lines 109a and 109b to about ½ VDD or any desired voltage from 0V to VDD, as shown by indicator 127. Then, the circuit is ready for sensing the next bit line pair.

After the data of the selected page is read and stored in the data latch 113, from time T5 to time T6, a 'restore operation' is performed to restore the data of the unselected cells. The restore operation develops the post-charge-sharing voltage stored in the bit line capacitance of the unselected bit lines back to full VDD and ground levels, and then writes the data back to the cells. From time T5 to time T6, the bit line select gate signals BSG[0-m] sequentially turn on the bit line select gates (108a to 108m) and (108a' to 108m') for a period of time. From time T2 to time T6, because the voltage of the selected word line stays high, the cells remain accessed. Therefore, the data of full VDD and ground levels on the bit lines will be written back to the cells. This will restore the cells' data.

In an embodiment, the previously selected bit lines are included in the restore operation. In another embodiment, the previously selected bit lines are excluded from the restore operation as shown and described with reference to FIG. 4B. The restore operation for the bit lines can be done in any desired order.

The operation from time T2 to time T5 is repeated for each selected bit line pair to sense the voltage stored in the capacitance of the bit lines and write the data back to the cells. After the restore operation at time T7, the operation at time T1 may be repeated to equalize all the bit lines to about ½ VDD or any desired voltage from 0V to VDD, as shown by indicator 128, and another word line may be selected.

The waveform shown in FIG. 4A is for reading one bit line from one bit line group, such as bit line group 100a shown in FIG. 1E. Assuming the array is divided into K bit line groups (100a to 100k). Each bit line group comprises M bit lines. The bit line select gates (165a to 165k) select one bit line out of the M bit lines in each bit line group (100a to 100k) to be connected to the sense amplifiers (104a to 104k). This reads and writes data for all K bit lines from the bit line groups (100a to 100k) in parallel. This K-bit data is called 'one page'. Therefore, each word line comprises M pages. Each page contains K bits of data. Each page can be selected by the bit line select gate signals BSG[0-m].

It should also be noted that although the operation shown in FIG. 4A illustrates an example of sequentially incrementing bit line select gate signals BSG[0-m] from time T5 to T6, in other embodiments, the bit line select gate signals BSG [0-m] may be activated in any other suitable order.

Figure 4B:
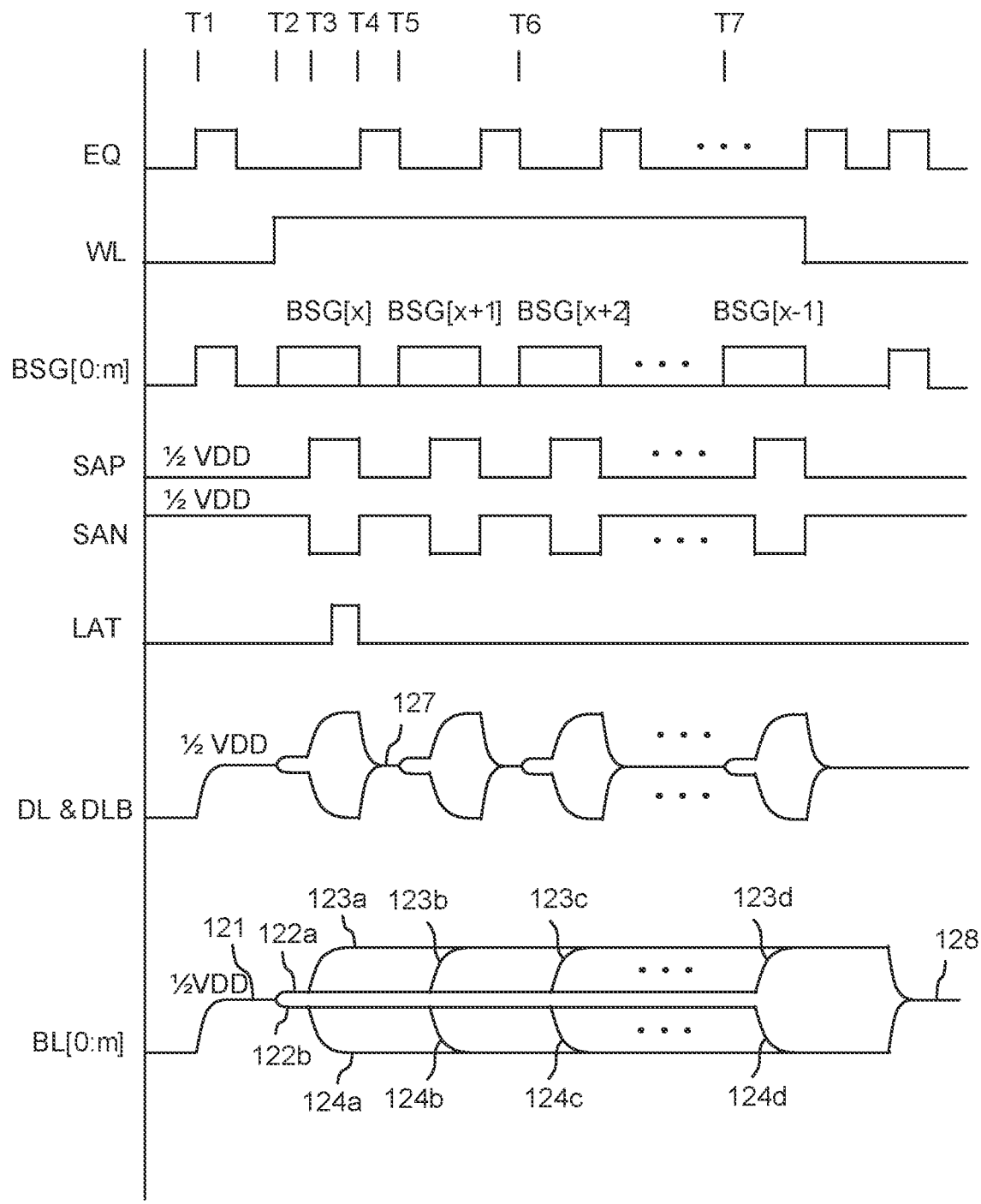
FIG. 4B shows another embodiment of waveforms for read operations according to the invention that utilizes a different order for activating the BSG[0-$m$] signals.

FIG. 4B shows another embodiment of waveforms for read operations for use with embodiments of the invention that utilize a different order for activating the BSG[0-m] signals. This embodiment is similar to the one shown in FIG. 4A except that after the selected page is read, at time T5, the bit line select gate signals BSG[0-m] are incremented to the next column. For example, assuming BSG[x] is selected at time T2, the next column BSG[x+1] is selected at time T5. Then, the restore operation is performed to restore the data to the cell on the bit line selected by BSG[x+1].

The above operation will be repeated from time T6 to T7 to increment the bit line select gate signals BSG[0-m] to restore the data of the unselected bit lines. After activation of the bit line select gate signals BSG[0-m] reaches the last column BSG[m], the operation overflows to the first column BSG[0] and continues the sequence until it reaches BSG[x−1], as shown at time T7. Then, the restore operation is completed. All the data is restored to the cells of the unselected bit lines.

It should be noted that the exemplary embodiment shown in FIG. 4B uses an incrementing operation to activate the bit line select gate signals BSG[0-m]. In another embodiment, the bit line select gate signals BSG[0-m] may be activated using a decrementing operation. For example, assuming BSG[x] is selected at time T2, from time T5 to T7, the bit line select gate signals are decremented from BSG[x−1] to BSG[0], and then overflowed to BSG[m], and then decremented to BSG[x+1]. Then, the restore operation is complete.

Figure 4C:
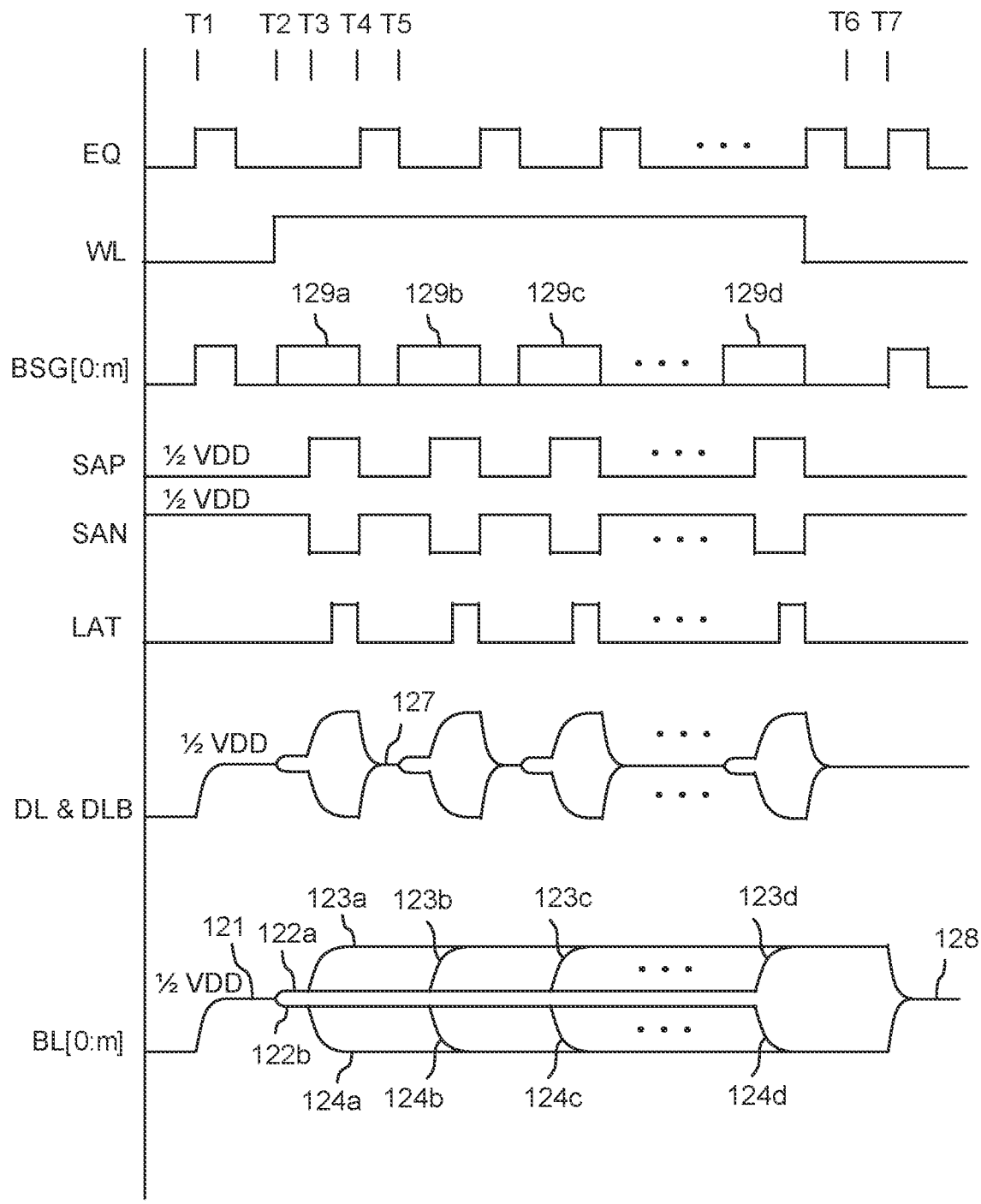
FIG. 4C shows another embodiment of waveforms for multiple-page read operations.

FIG. 4C shows another embodiment of waveforms for multiple page read operations. These operations are similar to the single page read operations shown in FIG. 4A. Please refer to FIG. 2A for the circuit operation description. At time T1, all the bit lines are equalized to a voltage level of about ½ VDD or any desired voltage from 0V to VDD, as shown at indicator 121. At time T2, a word line, such as WL 105a is selected to access all the cells (106a to 106m). This will cause charge-sharing to occur between the cells' capacitors and the bit line capacitance, as shown at indicators 122a and 122b. As a result, the data of M pages is stored in the bit line capacitance as voltage levels 122a and 122b.

From time T2 to time T6, the M pages of data are random-selected by the bit line select gate signals BSG[O-m], as shown by indicators (129a to 129d). The selected page's bit lines will be connected to the data lines 109a and 109b and developed into full VDD and ground levels by the sense amplifier 111, as shown by indicators (123a to 123d) and (124a to 124d). Please refer to the description for detailed operations between the time T2 to time T5 as described in FIG. 4A. After the data is developed, the LAT signal is supplied with a pulse to store the data into the data latch 113. After that, the CSL signal (not shown in FIG. 4C) is randomly selected to turn on the column select gates 114a and 114b to output the data from the data latch 113 to the I/O bus 115a and 115b. By using this method, the M pages of data can be randomly selected for read operations.

From time T2 to time T6, because the voltage of the selected word line stays high, the cells remain accessed. Therefore, the data of full VDD and ground levels on the bit lines will be written back to the cells. This will restore the data of the cells.

Figure 4D:
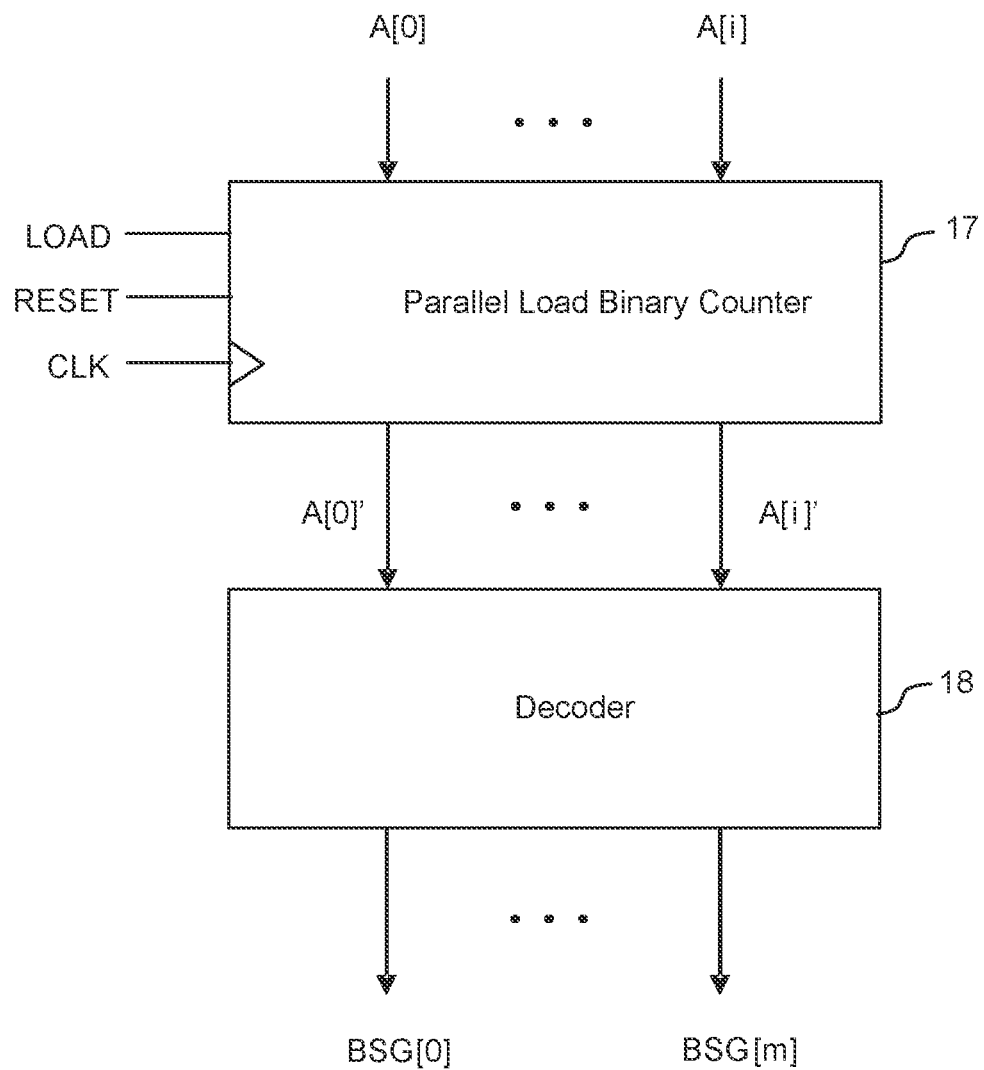
FIG. 4D shows an embodiment of the multiple-page read operations shown in FIG. 4C.

FIG. 4D shows an embodiment of a circuit implementation for the single-page read operation shown in FIG. 4B. It will be assumed that the bit line select gate signals BSG[O-m] are controlled by the input address bits A[0-i]. The input address A[0-i] is loaded into a parallel load binary counter 17. The output signals A[0-i]' of the counter 17 are fed to a decoder 18 to generate the bit line select gate signals BSG[0-m]. The counter 17 can be an up-counter or a down-counter. The counter 17 can have a LOAD signal to control the parallel loading of the input address A[0-i], a RESET signal to reset the counter, and a clock signal (CLK) to increment the counter.

During operation, when an address A[0-i] is input, it will be loaded to the counter 17 as the starting address. This will select the bit line select gate signals BSG[0-m] to read the selected page, as shown at time T2 in FIG. 4B. After the data is read to the sense amplifiers and restored back to the cells, at time T5, the clock signal (CLK) will be activated to increment the counter 17. This will cause the decoder 18 to select the next bit line select signals BSG[0-m] to perform the restore operation to the next page. From time T5 to T7, the clock signal (CLK) is repeatedly activated to increment the counter 17 to perform the restore operations to all the unselected pages. When the counter reaches its maximum count, the next clock will cause the counts to overflow or underflow and the counting sequence will start over.

Figure 4E:
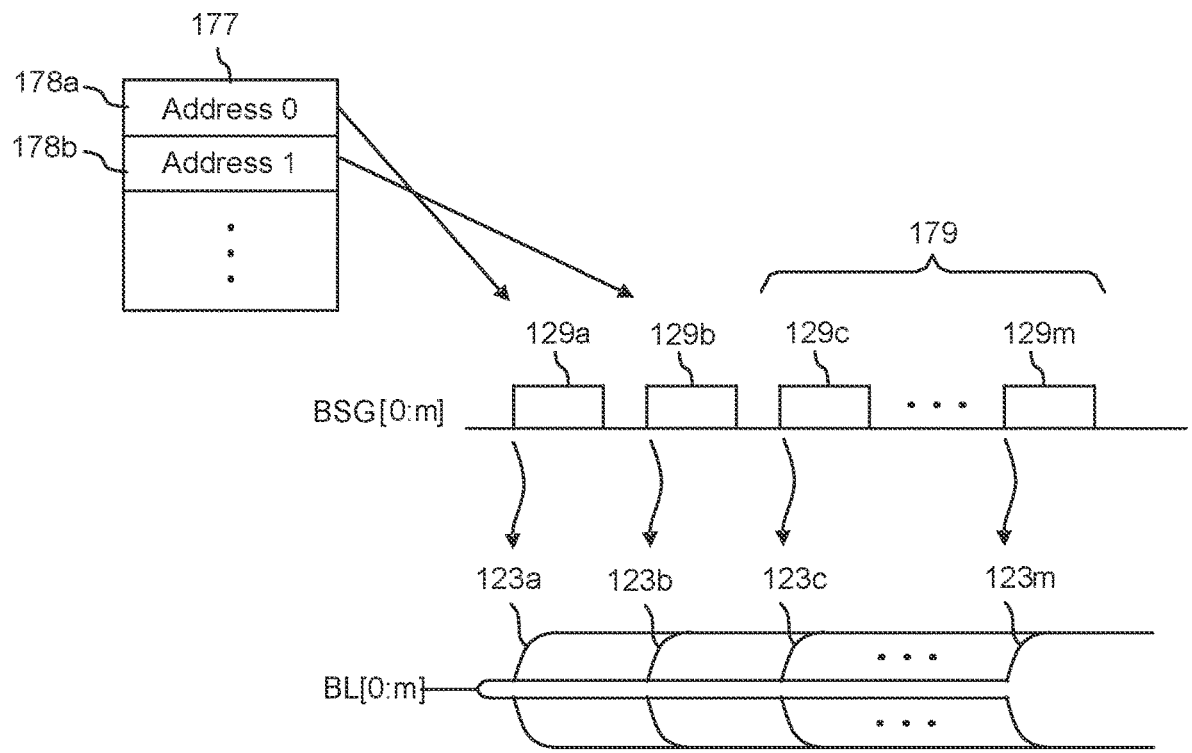
FIG. 4E shows an embodiment of the multiple page read operations shown in FIG. 4C.

FIG. 4E shows an embodiment of the multiple page read operations shown in FIG. 4C. An address queue 177, such as a First-In First-Out (FIFO) buffer, stores an address to be read. When a row (word line) is accessed, the system sequentially decodes the addresses stored in the queue 177, such as Address 0 178a and Address 1 178b, to select their corresponding bit line select gates, such as 129a and 129b to read their corresponding bit lines 123a and 123b, respectively.

After that, a restore operation 179 is performed to sequentially select all the bit line select gates or all the unselected bit line select gates (129c to 129m) to restore the data of the unselected bit lines back to the unselected cells, as shown in (123c to 123m).

Figure 4F:
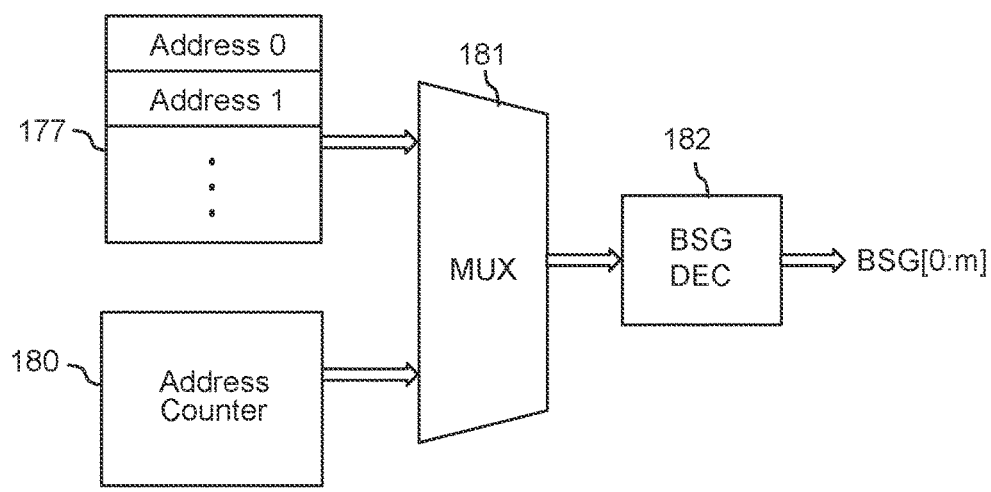
FIG. 4F shows an embodiment of a circuit implementation for the operations shown in FIG. 4E.

FIG. 4F shows an embodiment of a circuit implementation for the operations shown in FIG. 4E. The bit line select gate decoder 182 is connected to a multiplexer 181. The multiplexer 181 takes address inputs from an address queue 177 during the read operation and from an address counter 180 during the restore operation 179 shown in FIG. 4E.

Figure 4G:
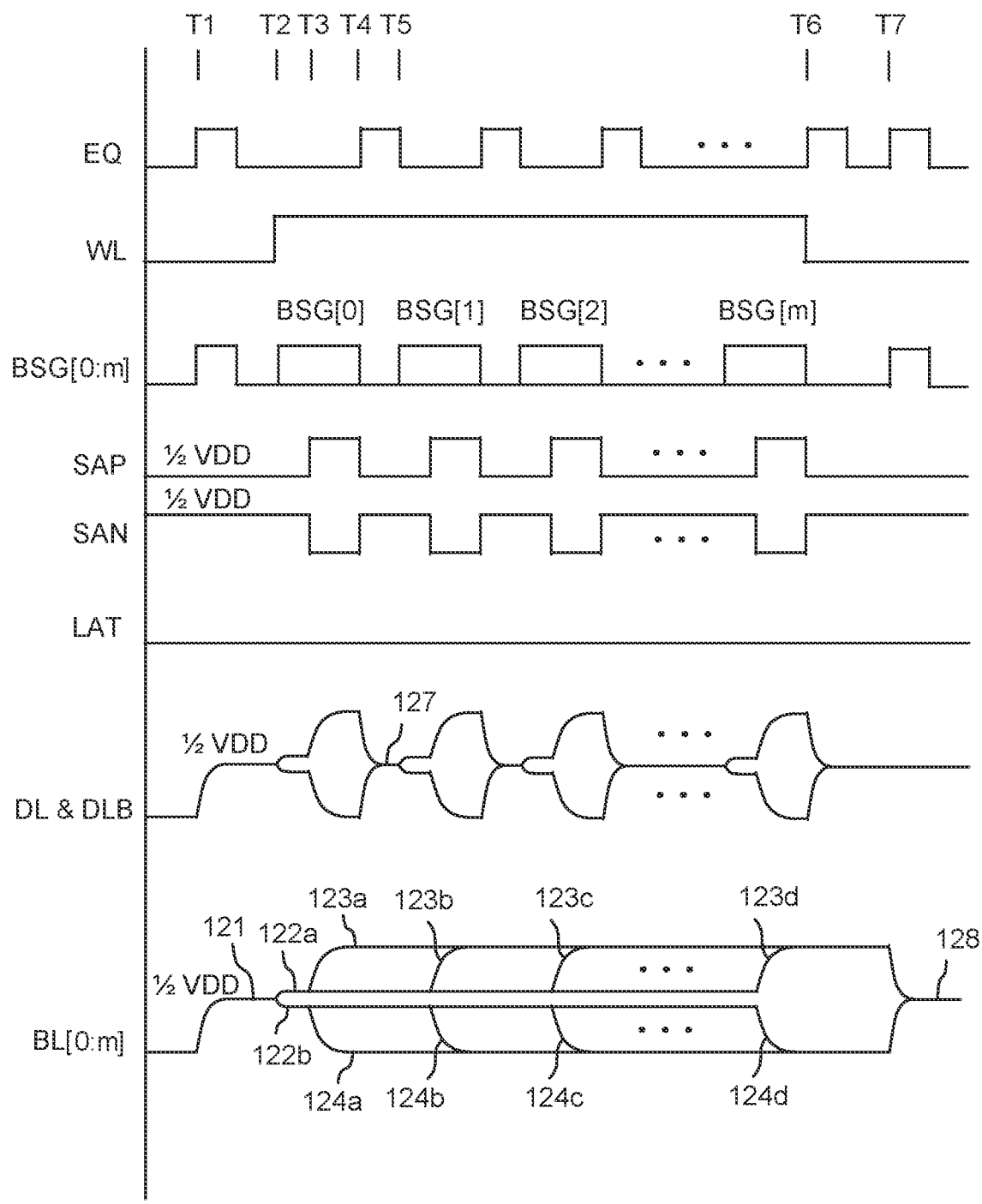
FIG. 4G shows another embodiment of waveforms for refresh operations.

FIG. 4G shows another embodiment of waveforms used for refresh operations in accordance with the invention. Because the charge stored in a DRAM cell's capacitor leaks over time, the data of the cell needs to be periodically read and restored to prevent the data loss. This operation is called 'refresh operation'. This operation is similar to the single-page read operations shown in FIG. 4A except that the LAT signal stays low during this operation, because the data does not need to be output. At time T1, all the bit lines are equalized to a voltage level of about ½ VDD or any desired voltage from 0V to VDD, as shown at indicator 121. At time T2, a word line, such as WL 105a is selected (raised high) to access all the cells (106a to 106m). This will cause charge-sharing to occur between the cells' capacitors and the bit line capacitance, as shown by indicators 122a and 122b.

From time T2 to time T6, the bit line select gate signals BSG[O-m] are sequentially selected to connect the bit lines to the data lines 109a and 109b and developed into full VDD and ground levels by the sense amplifier 111, as shown by indicators (123a to 123d) and (124a to 124d). Please refer to the detailed operations for the time T2 to time T5 described with respect to FIG. 4A.

From time T2 to time T6, the voltage of the selected word line stays high and the cells remain accessed. Therefore, the data of full VDD and ground levels on the bit lines will be written back to the cells. This will restore the data of the cells.

Figure 4H:
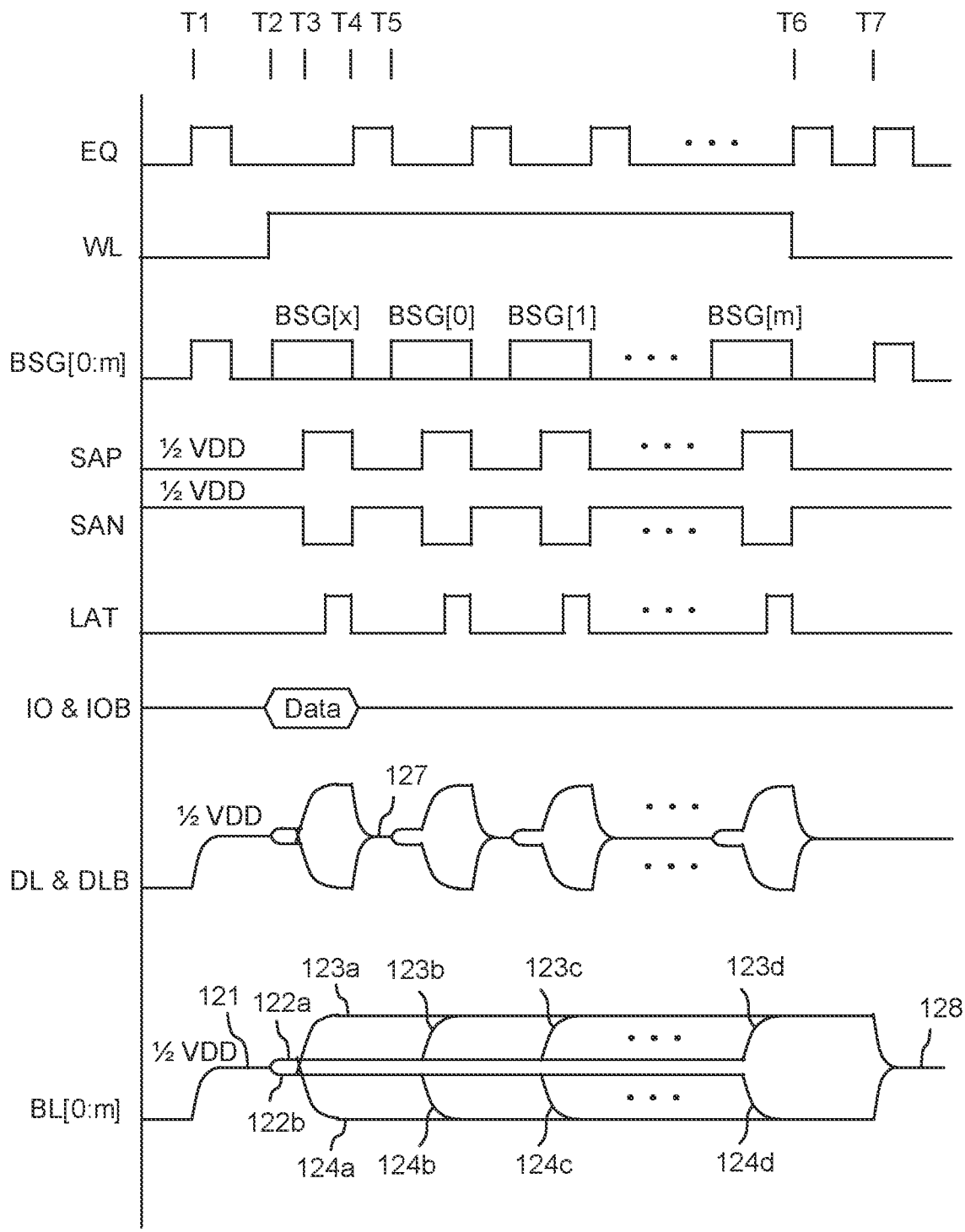
FIG. 4H shows an embodiment of waveforms for write operations according to the invention.

FIG. 4H shows an embodiment of waveforms used for write operations according to the invention. Please refer to FIG. 2A for the circuit operation description. The selected word line, such as WL 105a, goes high to access the selected cells (106a to 106m). The I/O bus 115a and 115b are sequentially supplied with the input data, Data[0-m]. The selected CSL signal is supplied with a high pulse to turn on the column select gates 114a and 114b. The signal LAT goes high to turn on the pass gates 112a and 112b. The signal EQ stays low to disable the equalizer circuit 110. The signals SAP and SAN stay low and high, respectively, to disable the sense amplifier 111. The bit line select gates, BSG[0-m] are sequentially selected to turned on the bit line select gates (108a to 108m) and (108a' to 108m') to load the input data to the bit lines (107a to 107m) and (107a' to 107m'). This will write the input data into the cells (106a to 106m).

From time T4 to time T6, the restore operation previously described with respect to FIG. 4A is applied to write the data stored in the bit line capacitances of the unselected bit lines back to the cells. Please refer to FIG. 4A for the detailed description of the restore operation.

Figure 4I:
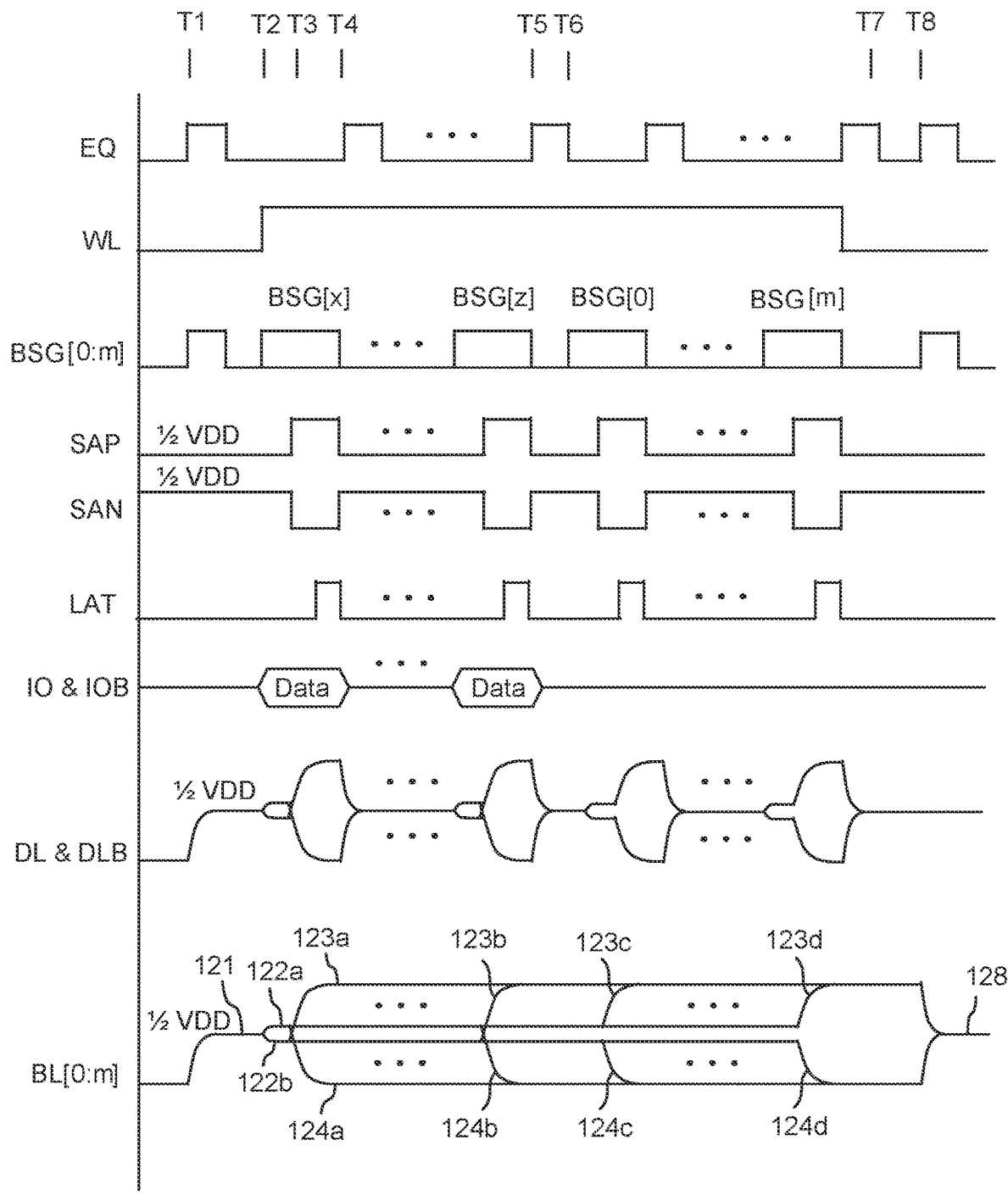
FIG. 4I shows another embodiment of the write operation according to the invention.

FIG. 4I shows another embodiment of waveforms used for write operations according to the invention. In this embodiment, multiple pages of data are written to the selected word line. From time T2 to T5, the previously described single-page write operation shown in FIG. 4H is repeated by turning on the selected bit line select gates for each page, as shown by BSG[x-z], to write the data into the multiple pages.

After the above operations, from time T6 to time T7, the restore operation previously described in FIG. 4A is applied to write the data stored in the bit line capacitances of the unselected bit lines back to the cells. Please refer to FIG. 4A for the detailed description of the restore operation.

Figure 4J:
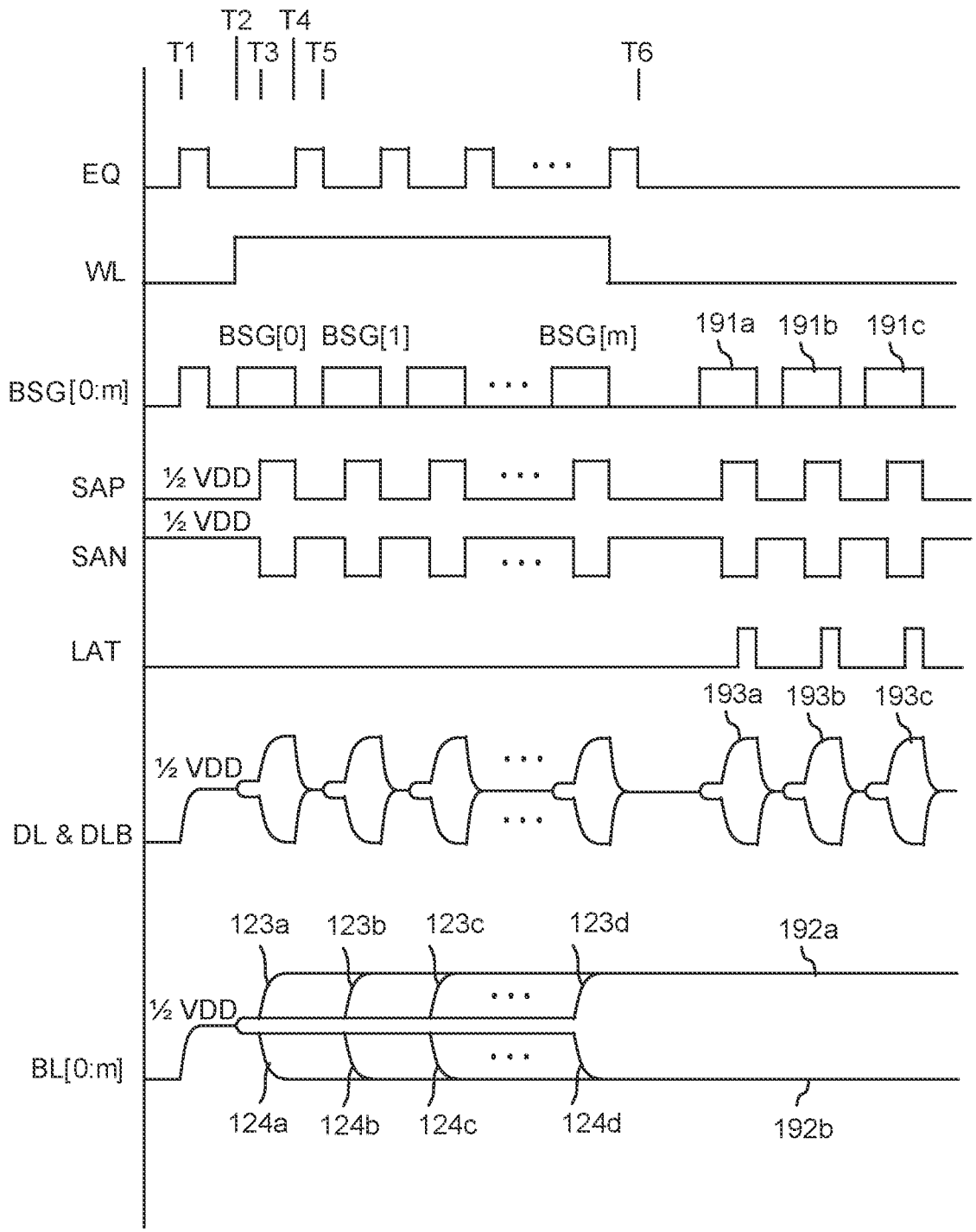
FIG. 4J shows an embodiment of column address selection for read and write operations according to the invention.

FIG. 4J shows an embodiment of column address selection for read and write operations according to the invention. As shown in FIG. 4A, from time T1 to time T6, the bit line select gate signals BSG[0-m] are sequentially selected to develop the data of all the bit lines BL[0-m] to full VDD and 0V levels to restore the data of the selected and unselected cells. This also stores the data of all the cells on the selected row (word line) in the bit line capacitances. After time T6, the bit line select gate signals BSG[0-m] may be randomly selected to read the data stored in the bit line capacitances. To do so, the column address is input to select one of the bit line select gate signals BSG[0-m] to turn on the selected bit line select gates, such as (191a to 191c). The selected bit line select gates will be turned on to allow the sense amplifier to sense the data stored in the bit line capacitance, such as illustrated at (192a and 192b). Therefore, the data of the selected column is read as shown at (193a to 193c). Please notice, because the capacitances of the data lines (DL and DLB) are very low, the delays of rising and falling edges of the data line signals (193a to 193c) are very short.

Figure 4K:
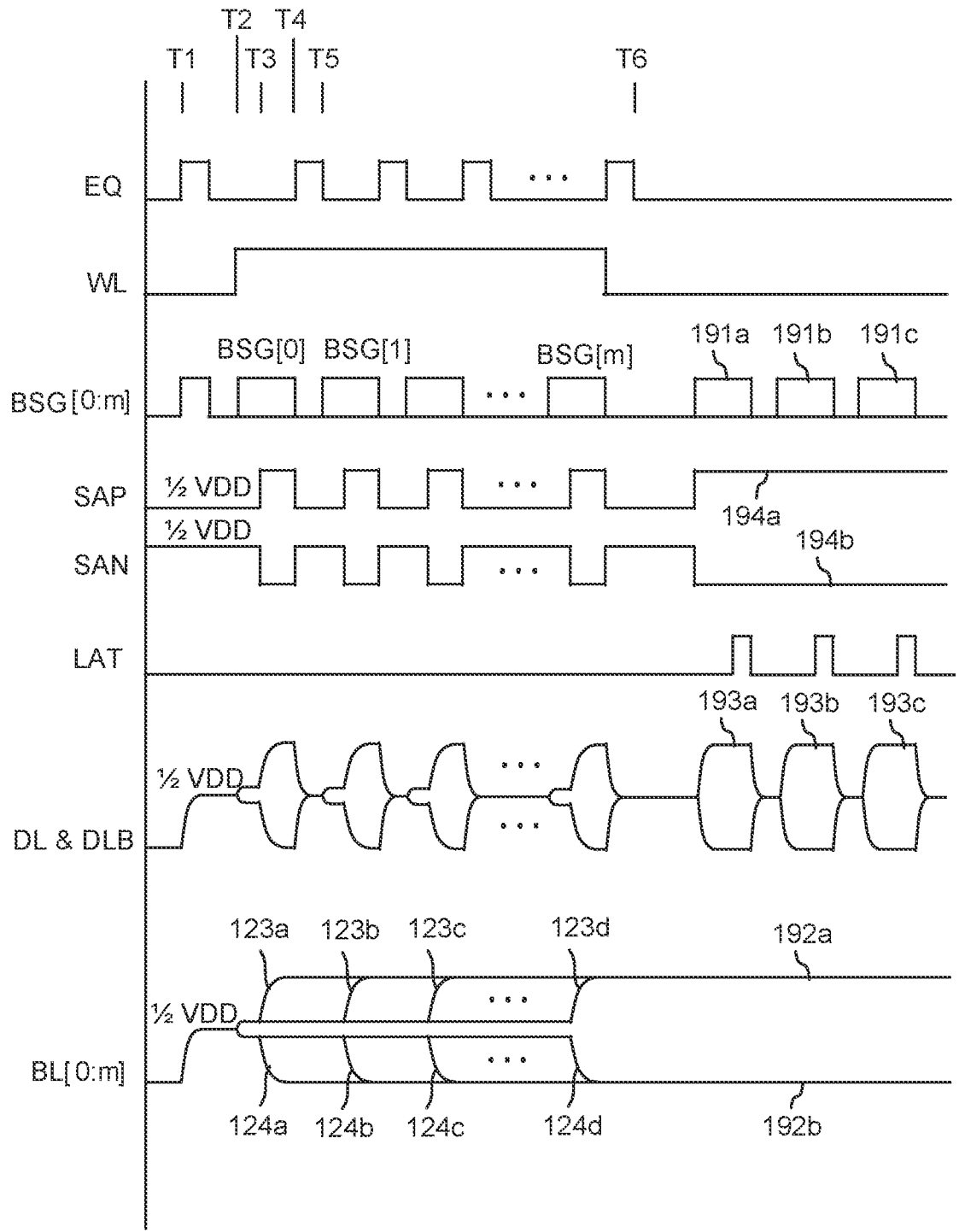
FIG. 4K shows an embodiment of column address selection for read and write operations according to the invention.

FIG. 4K shows an embodiment of column address selection for read and write operations according to the invention. This embodiment is similar to the one shown in FIG. 4J except that after time T6, the power lines SAP and SAN of the sense amplifiers remain at VDD and 0V, respectively. When the column address is input, the bit line select gate signals (191a to 191c) are selected to turn on the bit line select gates. This will cause the sense amplifiers to be flipped by the large bit line capacitance, as shown in the data line signals (193a to 193c).

Figure 5A:
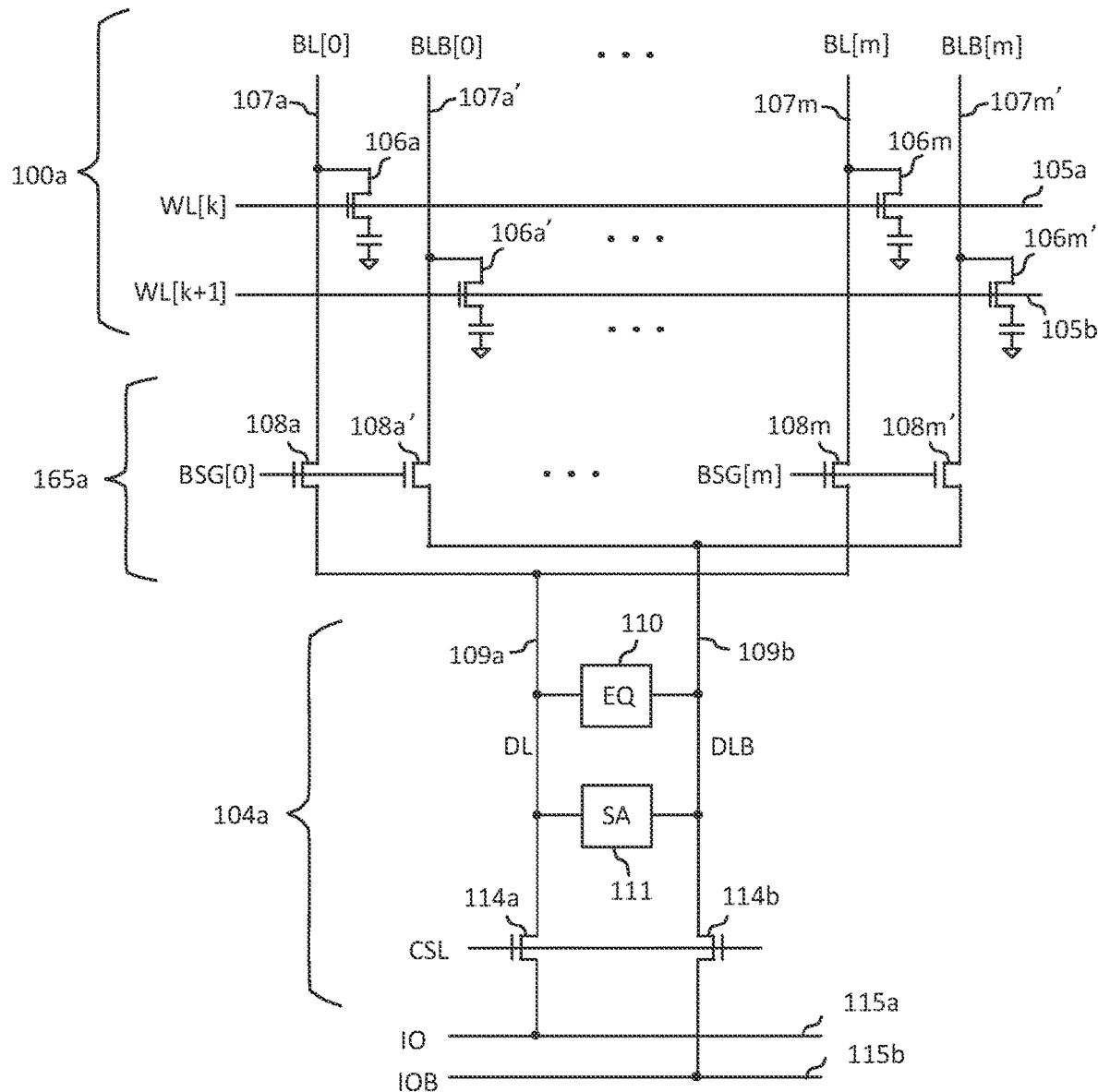
FIGS. 5A-B show additional embodiments of the array and circuit architecture according to the invention.
Figure 5B:
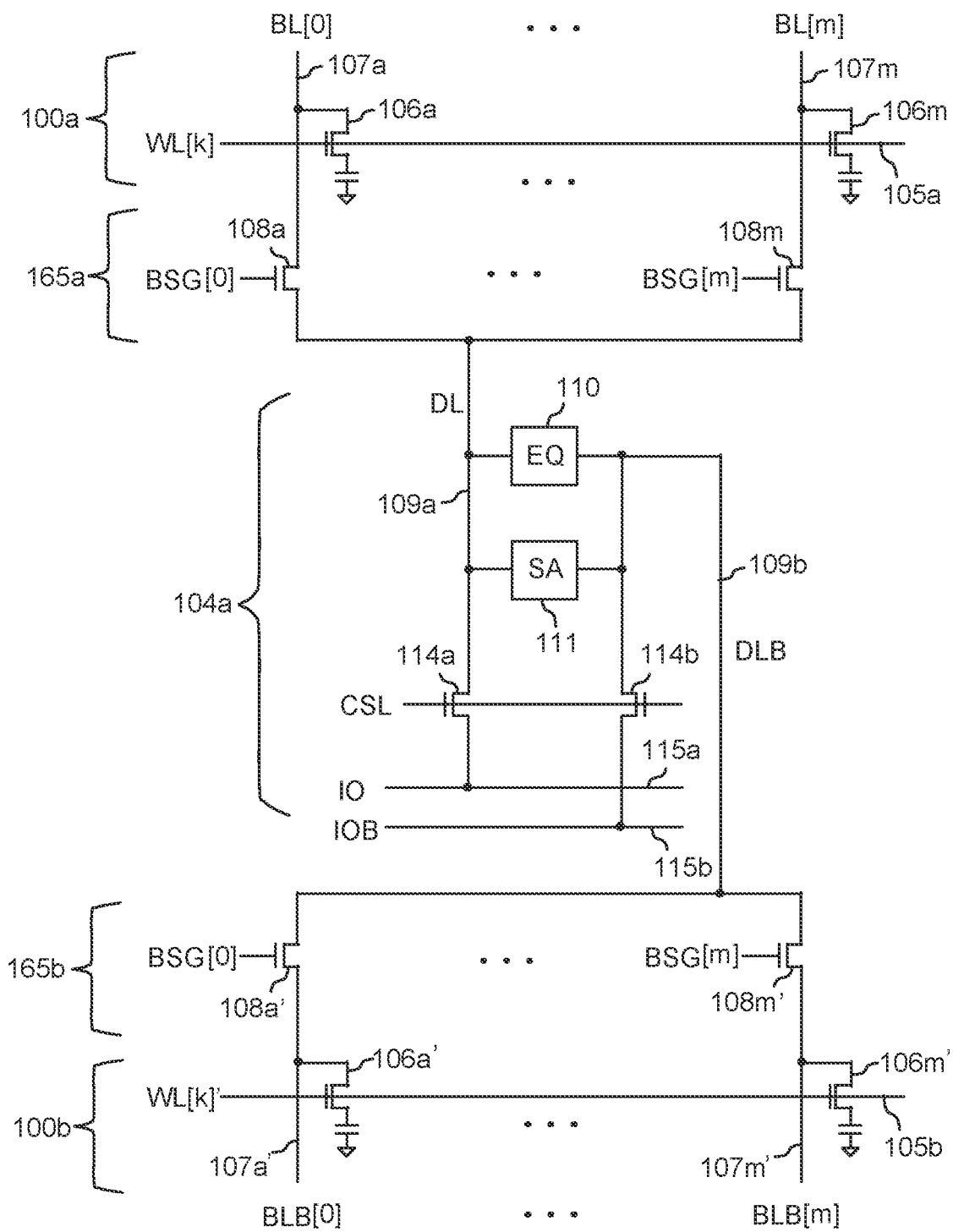

FIGS. 5A-B show additional embodiments of the architecture of one bank of memory according to the invention. This embodiment is similar to the ones shown in FIGS. 2A-B, respectively, except that the data latches 113 and the pass gates 112a and 112b are eliminated.

Figure 5C:
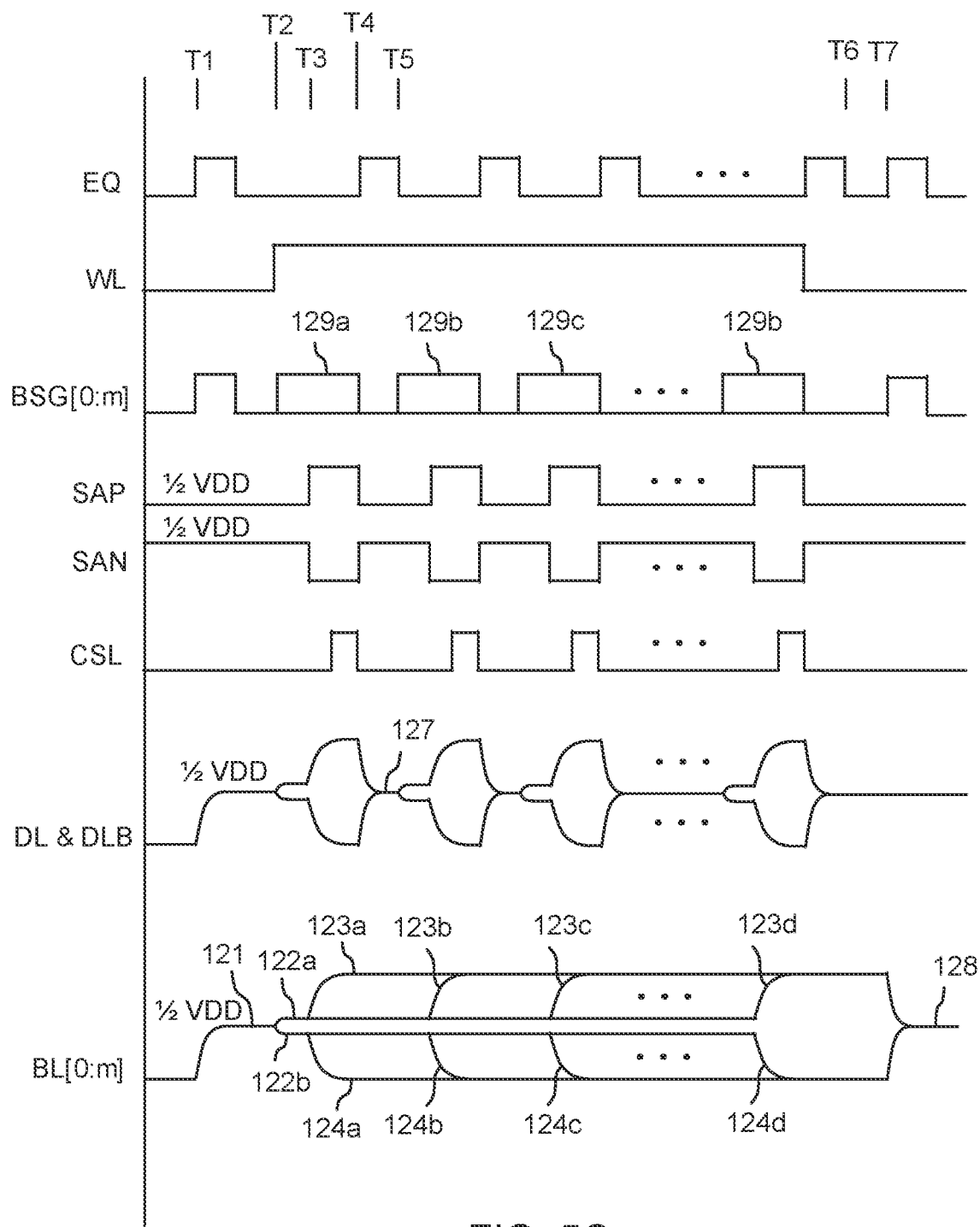
FIG. 5C shows an embodiment of the waveform for read operation according to the embodiments shown in FIGS. 5A-B.

FIG. 5C shows an embodiment of waveforms for read operations according to the embodiments shown in FIGS. 5A-B. These waveforms are the same as the multiple-page read operation waveforms shown in FIG. 4C except that the LAT signals are eliminated. The CSL signal turns on the column select gates 114a and 114b to output the data directly from the sense amplifier 111 to the I/O bus 115a and 115b. Please refer to the description for FIG. 4C for the detailed operation.

Figure 6A:
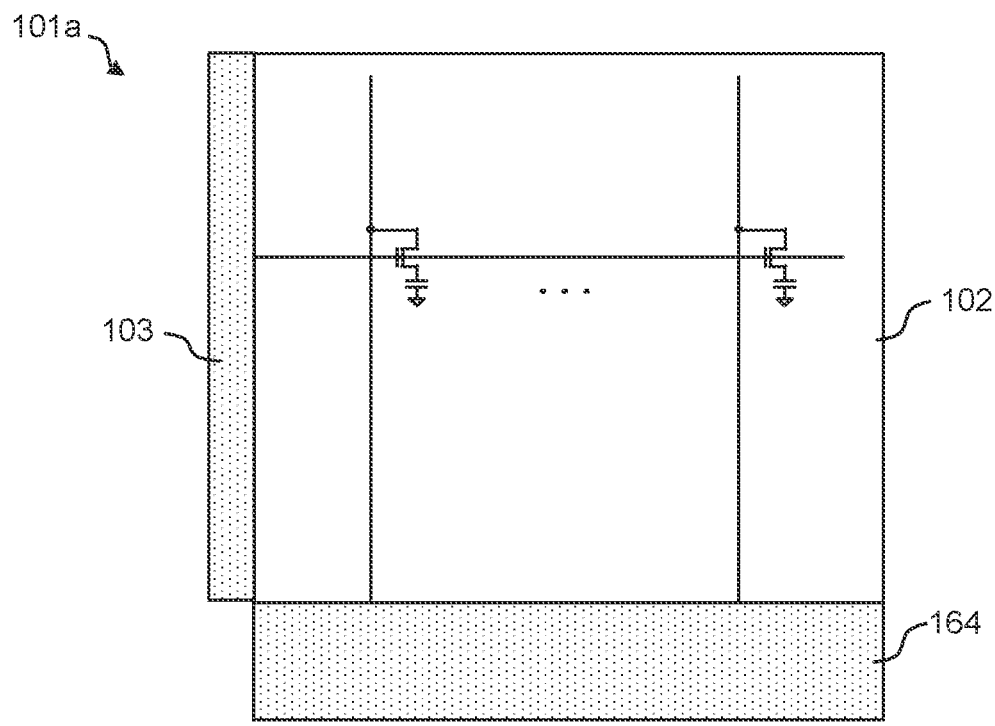
FIGS. 6A-B show a comparison between conventional art and embodiments of the invention.
Figure 6B:
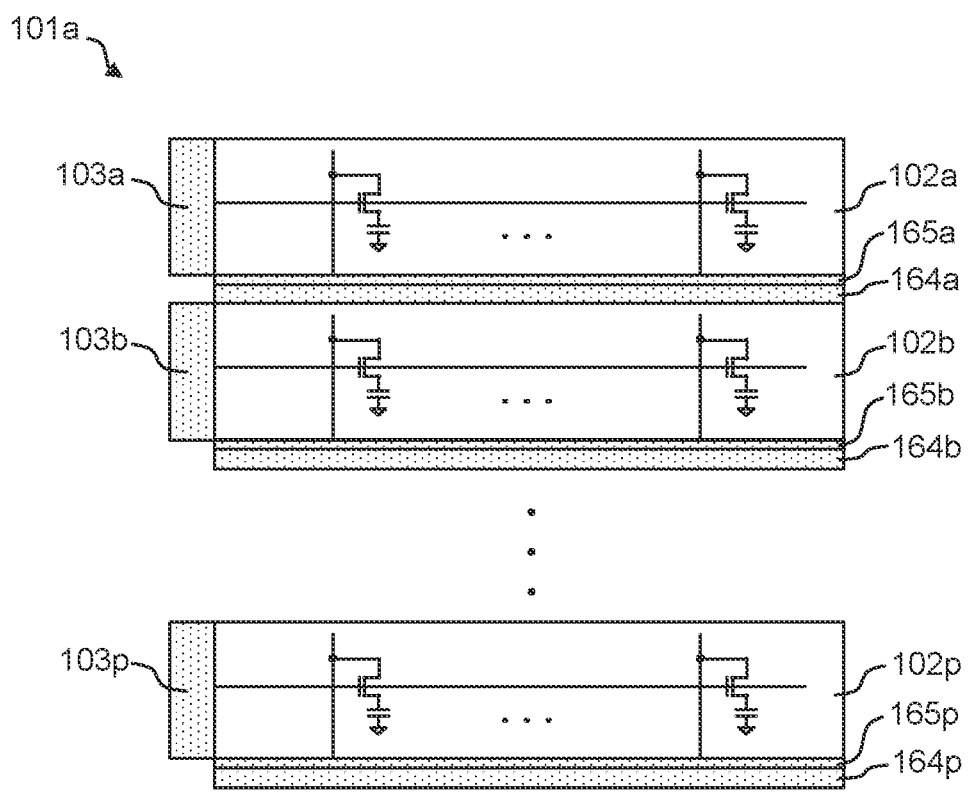

FIGS. 6A-B show a comparison between conventional art and embodiments of the invention.

FIG. 6A shows an embodiment of memory bank 101a implemented using conventional art. The array 102 is coupled to a row decoder 103 and sense amplifier circuits 164.

FIG. 6B shows an array architecture of memory bank 101a constructed in accordance with the invention. The array architecture in FIG. 6B has the same size as array 102 shown in FIG. 6A, but it is divided into P sub-arrays (102a to 102p). The sub-arrays (102a to 102p) are connected to row decoders (103a to 103p), bit line select gates (165a to 165p), and sense amplifier circuits (164a to 164p), respectively.

It will be assumed that the bit lines in each sub-array, such as sub-array 102a, are divided into M pages. The bit line select gates 165a will select one page to connect to the sense amplifiers 164a. This will reduce the number of the sense amplifier circuits 164a to 1/M. Therefore, the layout size of the sense amplifier circuits 164a are reduced to 1/M of the sense amplifier circuits 164 shown in FIG. 6A.

Therefore, if the number of the sub-array, P, equals to the number of the pages, M, the total layout size of the sense amplifier circuits (164a to 164p) will be similar to that of the sense amplifier circuit 164 shown in FIG. 6A. This makes the layout size of the array shown in FIG. 6B about the same as the conventional array shown in FIG. 6A. If the number of the sub-array, P, is lower than the number of the pages, M, the total layout size of the sense amplifiers (164a to 164p) may be smaller than that of the sense amplifier 164 shown in FIG. 6A. This makes the layout size of the array shown in FIG. 6B smaller than the conventional array shown in FIG. 6A.

The array architecture shown in FIG. 6B has many advantages over the conventional array structure shown in FIG. 6A. Assume the array is divided into M sub-arrays. The bit line length of each sub-array (102a to 102p) shown in FIG. 6B is 1/M of the bit line length shown in FIG. 6A. This reduces the bit line capacitance to 1/M. This provides many advantages. First, the RC delay of the bit line is reduced to 1/M. This may drastically increase the read and write speed. Second, when using multiple-page read operations shown in FIG. 4C, the data bandwidth can be increased by M times.

Third, since the bit line capacitance is reduced to 1/M, it takes only 1/M power to charge the bit lines. Therefore, the bit line power consumption for read, write, and refresh operations is reduced to 1/M. This is very important because the power consumption of DRAM is a big challenge for battery-power devices.

Figure 7A:
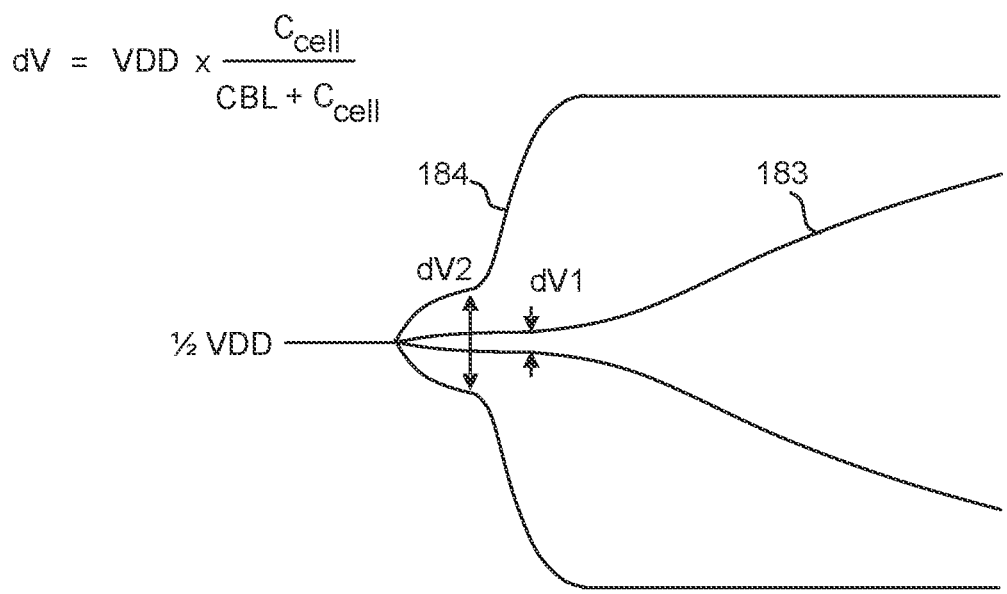
FIG. 7A shows plot lines that illustrate bit line voltages during a read operation according to the conventional art and embodiments of the invention.

Fourth, the read margin for the bit line voltage is increased by M times. Referring now to FIG. 7A, plot lines 183 and 184 show the bit line voltages during a read operation according to the conventional art and embodiments of the invention, respectively. It will be assumed that a cell's capacitor value is Ccell and the bit line capacitance value is CBL. The bit line voltage difference (dV) after the charge-sharing equals to (VDD×Ccell)/(Ccell+CBL). The regions dV1 and dV2 in FIG. 7A show the bit line voltage differences for the conventional art and embodiments of the invention, respectively. Because CBL is much larger than Ccell, the inventive embodiments decrease CBL to 1/M and increase the bit line voltage difference by about M times. This results in more reliable read operations and greatly reduces the error rates.

Figure 7B:
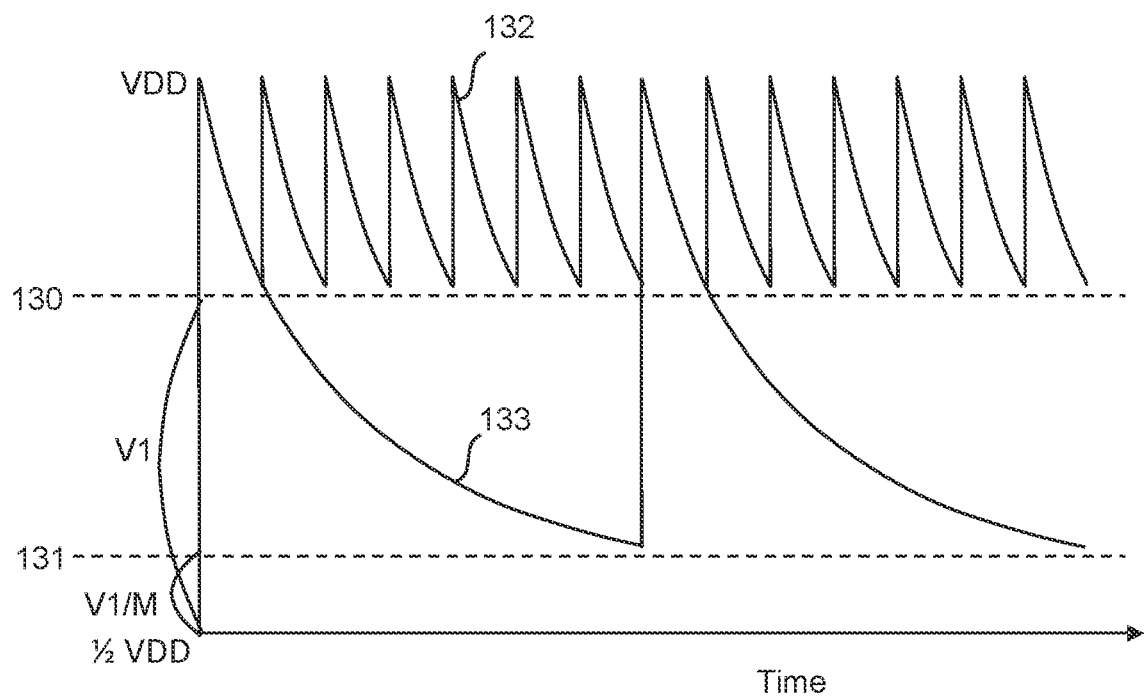
FIG. 7B shows plot lines that illustrate the minimum allowed capacitor voltage for data 1 (VDD) for the conventional art and for embodiments of the invention.

Fifth, embodiments of the invention increase the margin of the allowed capacitor leakage time by about M times. Referring now to FIG. 7B, the plot lines 130 and 131 show the minimum allowed capacitor voltage for data 1 (VDD) for the conventional art and for embodiments of the invention, respectively. It will be assumed that the voltage 130 is V1. Since the bit line voltage difference after the charge-sharing during read operation is increased by about M times, it allows the capacitor voltage 131 to be leaked to about V1/M. Therefore, the frequency of the refresh operation is reduced to about 1/M or lower. This further reduces the average power consumption of the refresh operation to 1/M. Combining the fourth and fifth advantages, the overall power consumption of the refresh operation is reduced to about $1/M^2$.

As a result, the array architecture according to embodiments of the invention has the advantages of high speed, low power consumption, high data throughput, and small die size over conventional implementations.

For conventional DRAM array architectures, the parasitic capacitance between the adjacent bit lines is not high, due to the large space between the bit lines required by the capacitors. However, for advanced technologies that use vertical transistors as the cell's select gate, as shown in FIGS. 8-9, the parasitic capacitance between the bit lines may be higher. Therefore, the bit line to bit line capacitance coupling during the read and write operations is taken into consideration.

FIGS. 8-9 show two types of exemplary DRAM cells using vertical transistors as the cell's select gate. The DRAM cells in FIGS. 8-9 comprise a capacitor 141 and a gate 142 of the vertical transistor that is connected to a word line. Also included are source 143 and drain 144 of the vertical transistors. A bit line 145 is formed of conductor material, such as metal, polysilicon, or heavily doped diffusion. The bit line 145 in FIG. 8 and FIG. 9 is located at the bottom and at the top of the cell, respectively.

For the cell structures shown in FIGS. 8-9, when forming a memory array, the bit line to bit line capacitance is high due to the bit lines being located in parallel with minimal spacing. During read and write operations, when the sense amplifier reads or writes the selected bit line, the selected bit line couples energy to the adjacent unselected bit lines and may affect the data stored in capacitance of the adjacent bit lines.

Figure 10A:
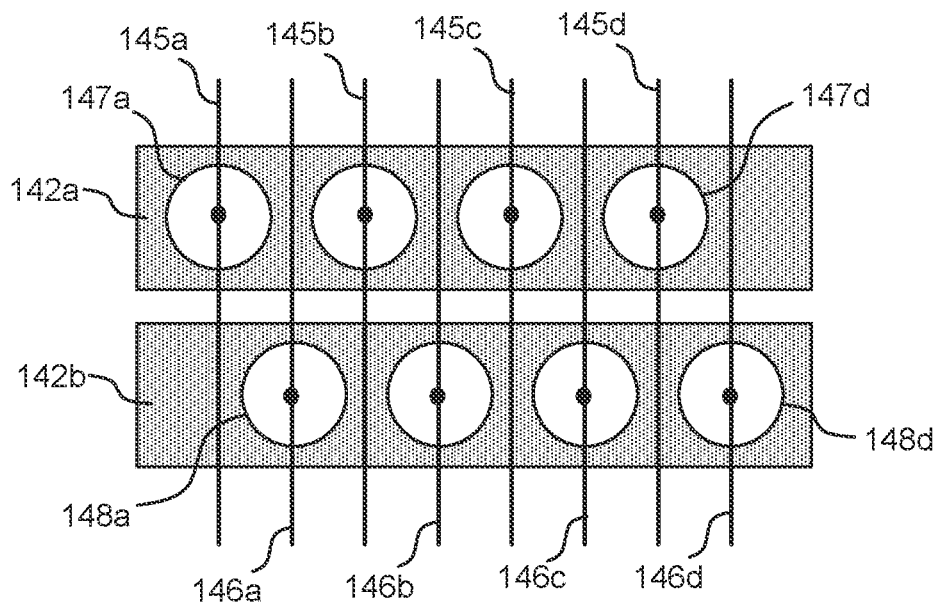
FIG. 10A shows a novel array structure to eliminate adjacent bit line coupling.

FIG. 10A shows a novel array structure to eliminate adjacent bit line coupling. The array shown in FIG. 10A comprises even 142a and odd 142b word lines. Cells (147a to 147d) and (148a to 148d) are also shown. Also shown are even (145a to 145d) and odd (146a to 146d) bit lines, respectively. The cells (147a to 147d) are connected to the even bit lines (145a to 145d). The cells (148a to 148d) are connected to the odd bit lines (146a to 146d).

By using this array structure, when the even word line 142a is selected, the cells (147a to 147d) will be accessed through the even bit lines (145a to 145d). The odd bit lines (146a to 146d) are unselected. The odd bit lines (146a to 146b) may be floating or supplied with a fixed voltage, such as 0V, VDD, or ½ VDD or any desired voltage from 0V to VDD to provide a 'shielding' effect to eliminate the capacitance coupling between the even bit lines (145a to 145d).

Similarly, when the odd word line 142b is selected, the cells (148a to 148d) will be accessed through the odd bit lines (146a to 146d). The even bit lines (145a to 145d) may be floating or supplied with a fixed voltage such as 0V, VDD, or ½ VDD or any desired voltage from 0V to VDD to provide a 'shielding' effect to eliminate the capacitance coupling between the odd bit lines (146a to 146d). Consequently, the previously mentioned bit line coupling problem with respect to FIGS. 8-9 is solved.

Figure 10B:
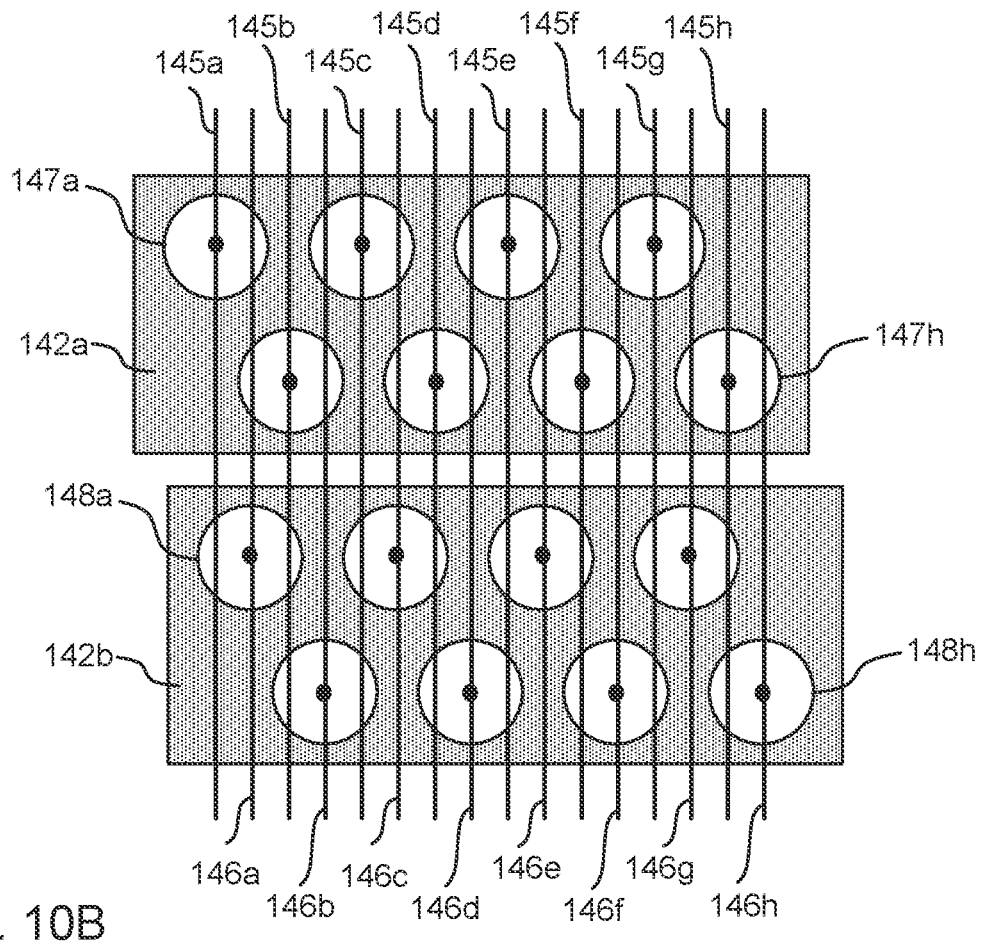
FIG. 10B shows another embodiment of an array structure according to the invention.

FIG. 10B shows another embodiment of an array structure according to the invention. This embodiment is similar to the one shown in FIG. 10A except that the number of bit lines is doubled. This increases the bandwidth of the read and write operations. When the even word line 142a is selected, the cells (147a to 147h) can be accessed through the even bit lines (145a to 145h). The odd bit lines (146a to 146h) may be floating or supplied with a shielding voltage as described in FIG. 10A. Similarly, when the odd word line 142b is selected, the cells (148a to 148h) can be accessed through the odd bit lines (146a to 146h). The even bit lines (145a to 145h) may be floating or supplied with a shielding voltage as described in FIG. 10A.

In an embodiment, the array structure is modified by using a similar approach to increase the number of bit lines by three, four, or any suitable number of times. These modifications shall remain in the scope of the invention.

Figure 11A:
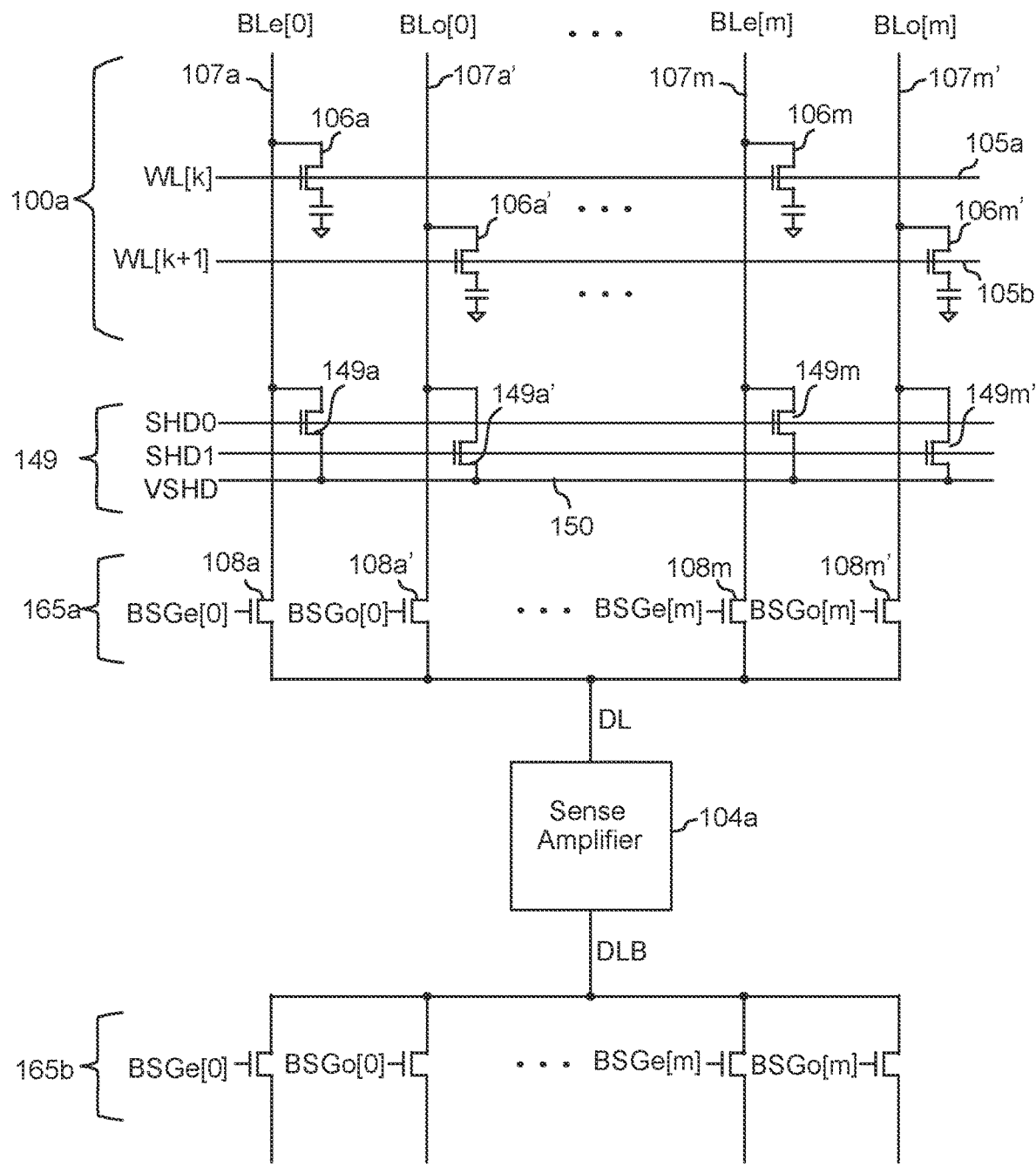
FIG. 11A shows an embodiment of the bit line select gates and sense amplifier circuit implementation for the array structure shown in FIGS. 10A-B.

FIG. 11A shows an embodiment of the bit line select gates and sense amplifier circuit implementation for the array structure shown in FIGS. 10A-B. In the bit line group 100a, the cells (106a to 106m) on the even bit lines (107a to 107m) are selected by the even word line 105a. The cells (106a' to 106m') on the odd bit lines (107a' to 107m') are selected by the odd word line 105b.

The even bit lines (107a to 107m) and odd bit lines (107a' to 107m') are connected to a sense amplifier circuit 104a through the selection of the bit line select gates (108a to 108m) and (108a' to 108m'). Please refer to FIG. 2B for the details of the sense amplifier circuit 104a. The sense amplifier circuit 104a is connected to the data lines DL and DLB. The DLB is connected to anther array through the bit line select gates 165b. For simplicity, the array connected to the select gate 165b is not shown in FIG. 11A.

FIG. 11A also shows 'shielding devices' 149 that provide a shielding voltage to the unselected even or odd bit lines. For example, assuming the even bit lines (107a to 107m) are selected, the signal SHD0 are supplied with 0V to turn off the shielding devices (149a to 149m) on the even bit lines (107a to 107m). The signal SHD1 are supplied with VDD to turn on the shielding devices (149a' to 149m') to apply the shielding voltage from the voltage source VSHD 150 to the odd bit lines (107a' to 107m'). Meanwhile, the signals BSGo[0-m] are supplied with 0V to turn off the odd bit line select gates (108a' to 108m').

Figure 11B:
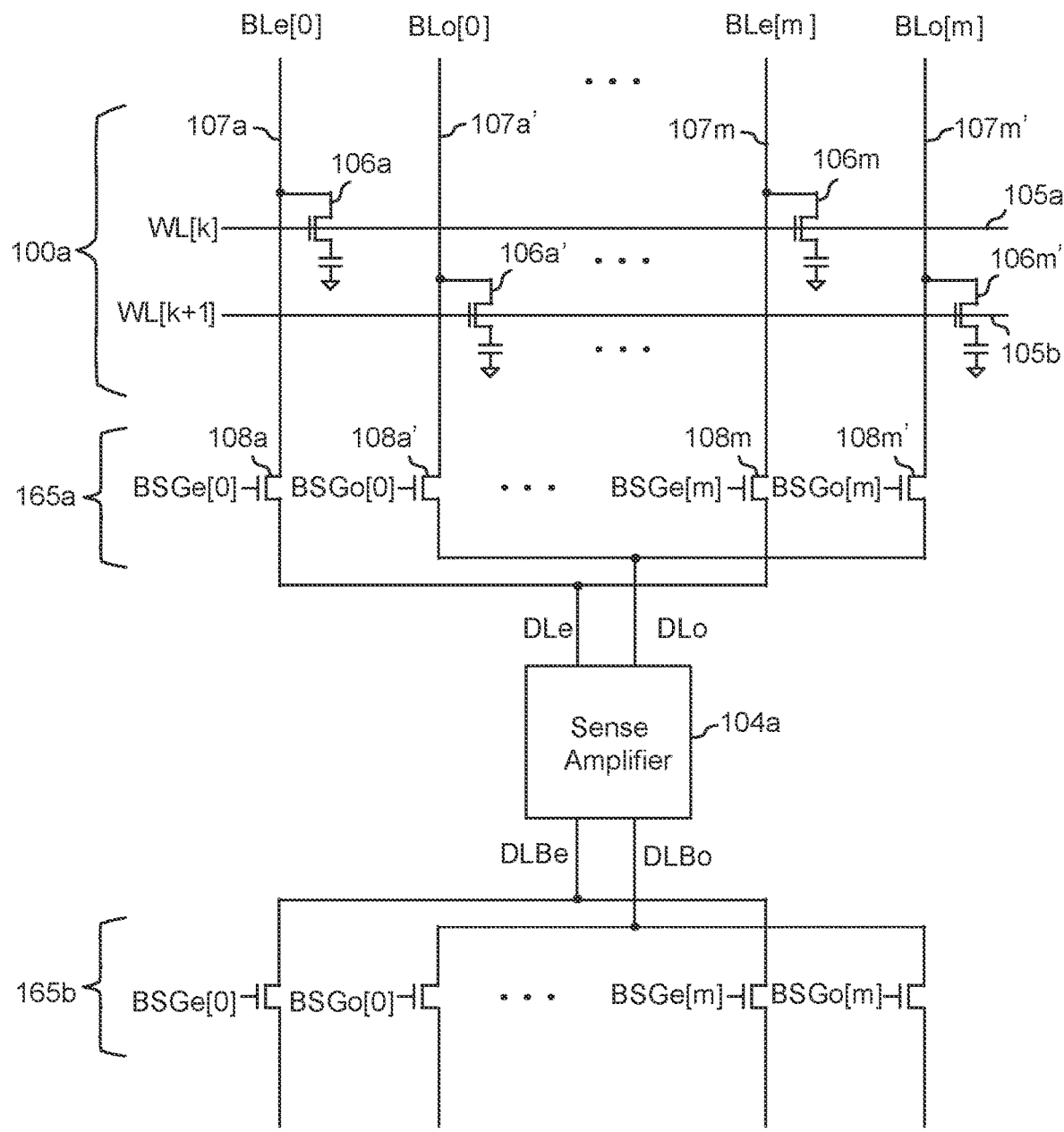
FIG. 11B shows another embodiment of the bit line select gates and sense amplifier circuit implementation for the array structures shown in FIGS. 10A-B.

FIG. 11B shows another embodiment of the bit line select gates and sense amplifier circuit implementation for the array structures shown in FIGS. 10A-B. This embodiment is similar to the one shown in FIG. 11A except that the shielding voltage is supplied by the sense amplifier circuit 104a. The sense amplifier 104a is connected to even and odd data lines DLe and DLo, respectively.

Assuming that the even bit lines (107a to 107m) are selected, the signal lines BSGo[0-m] are supplied with VDD to turn on all the odd bit line select gates (108a' to 108m'). The sense amplifier 104b applies the shielding voltage to the odd data line DLo, and then through the odd bit line select gates (108a' to 108m') to the odd bit lines (107a' to 107m').

The sense amplifier circuit 104a is also connected to data lines DLBe and DLBo. The data lines DLBe and DLBo are connected to another array through the bit line select gates 165b. For simplicity, the array connected to the bit line select gates 165b is not shown in FIG. 11B.

Figure 11C:
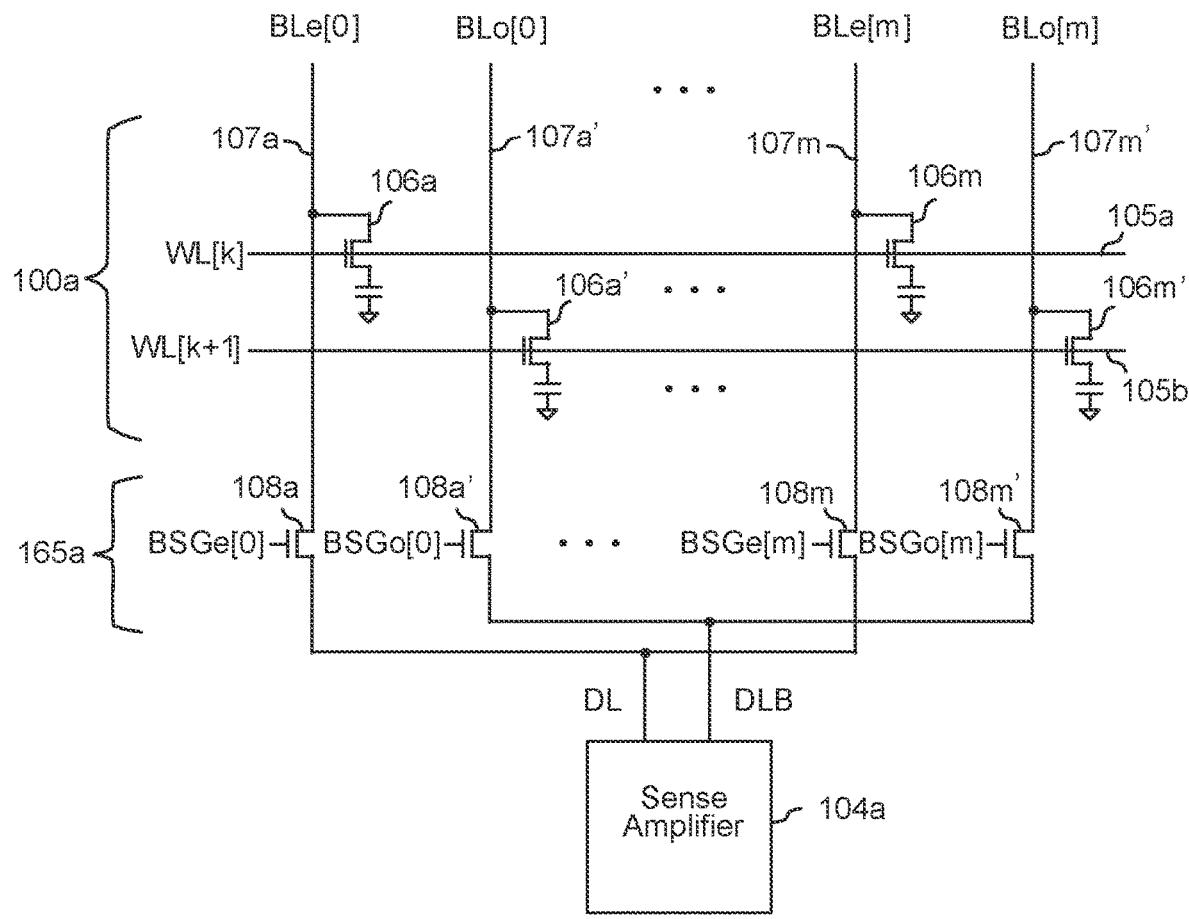
FIG. 11C shows another embodiment of a circuit implementation for the array structures shown in FIGS. 10A-B.

FIG. 11C shows another embodiment of a circuit implementation for the array structures shown in FIGS. 10A-B. This embodiment is similar to the one shown in FIG. 11B except that the sense amplifier circuit 104*a* is only connected to one bit line group 100*a*. The sense amplifier 104*a* is connected to data lines DL and DLB. Assuming that the even bit lines (107*a* to 107*m*) are selected, the odd bit lines (107*a*' to 107*m*') are supplied with a reference voltage, such as ½ VDD or any desired voltage from 0V to VDD by the sense amplifier circuit 104*a* through the data line DLB. The reference voltage on the odd bit lines (107*a*' to 107*m*') also provides the shielding effect for the even bit lines (107*a* to 107*m*).

Figure 12:
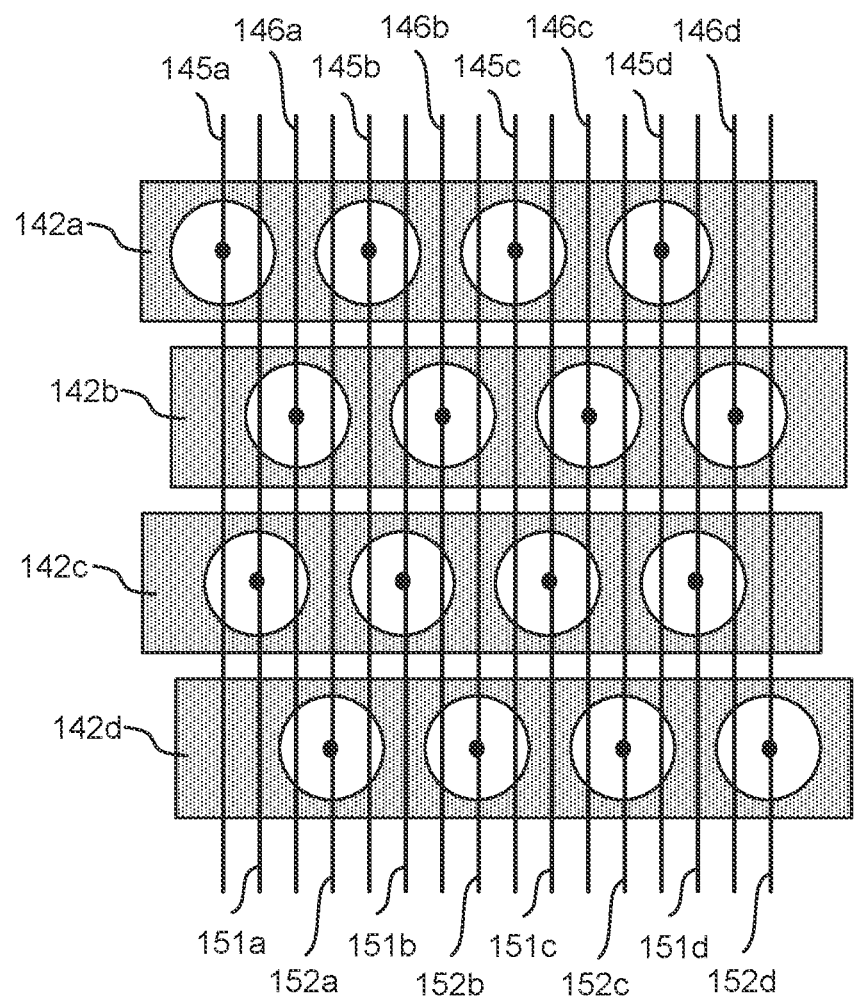
FIG. 12 shows another embodiment of an array structure according to the invention.

FIG. 12 shows another embodiment of an array structure according to the invention. This embodiment is similar to the one shown in FIG. 10A except that the cells on the four word lines (142*a* to 142*d*) are connected to four groups of bit lines (145*a* to 145*d*), (146*a* to 146*d*), (151*a* to 151*d*), and (152*a* to 152*d*), respectively. When one word line is selected, the unselected bit lines may be floating or supplied with the shielding voltage to eliminate the capacitance coupling between the selected bit lines.

Figure 13:
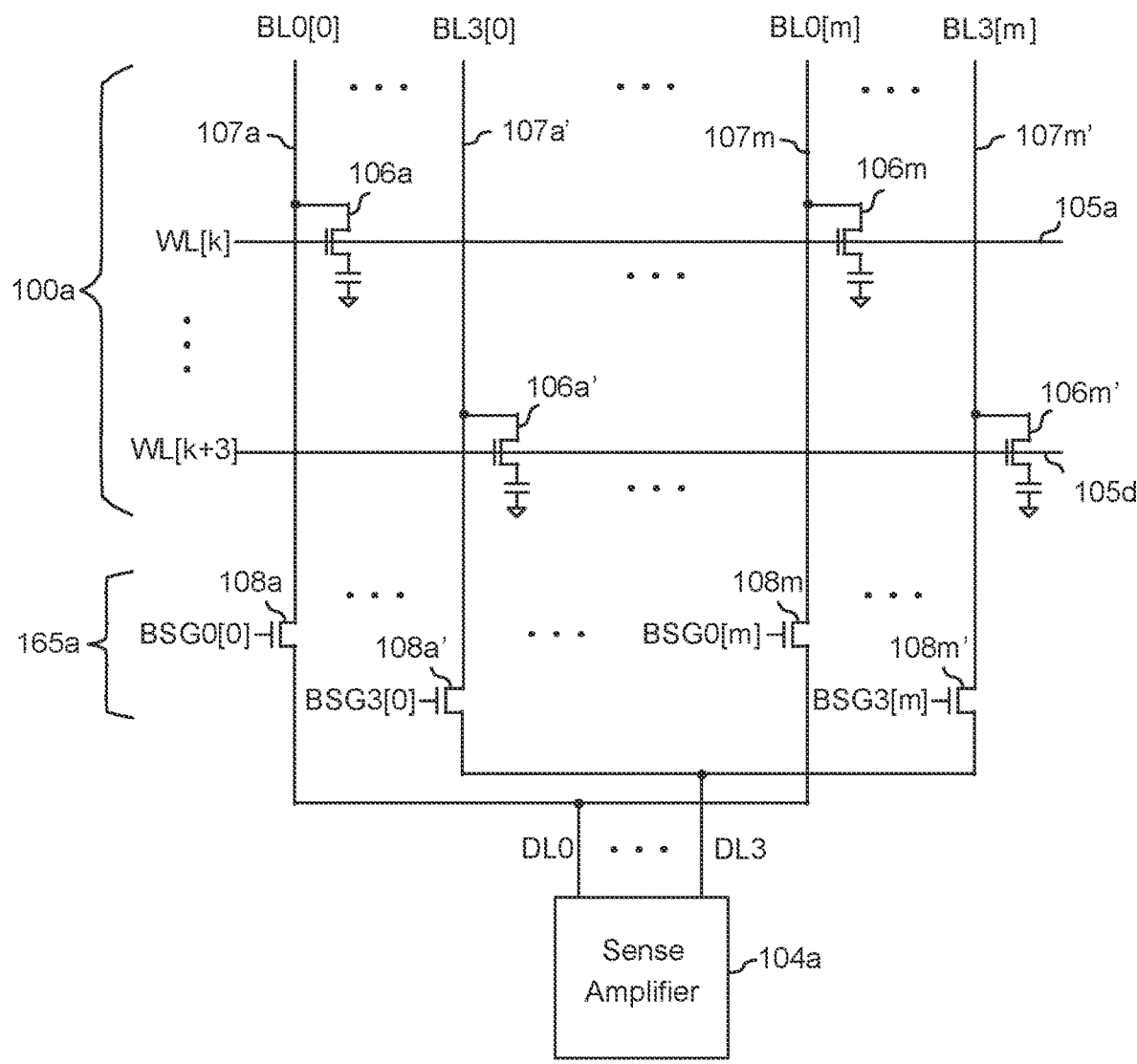
FIG. 13 shows an embodiment of the bit line select gates and sense amplifier circuit implementation for the array shown in FIG. 12.

FIG. 13 shows an embodiment of the bit line select gates and sense amplifier circuit implementation for the array shown in FIG. 12. The operation of this embodiment is similar to the one shown in FIG. 11C, except that the reference or shielding voltage are applied to three unselected groups of the bit lines. For simplicity, the detailed operation description is not repeated. Please refer to the description for FIG. 11C for the details.

Figure 14:
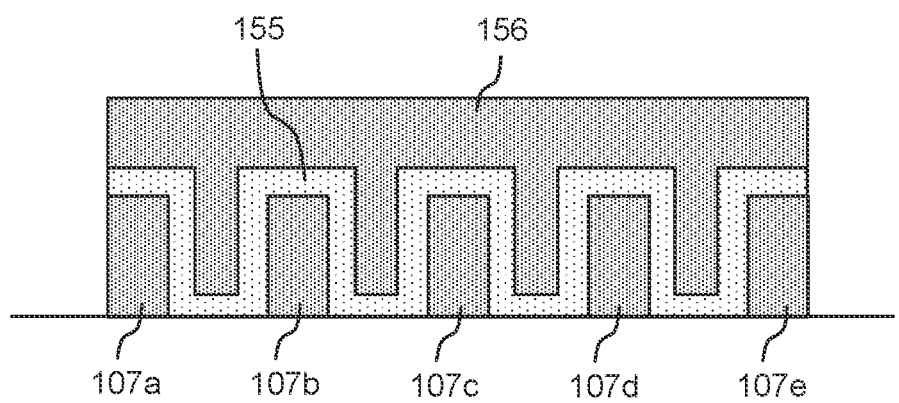
FIG. 14 shows a cross-section view of multiple bit lines that illustrate an embodiment for eliminating bit line capacitance coupling.

FIG. 14 shows a cross-section view of multiple bit lines (107*a* to 107*e*) that illustrate an embodiment for eliminating bit line capacitance coupling without using the previously described array structures shown in FIG. 10A, FIG. 10B, and FIG. 12. This embodiment can be applied to the conventional array structure shown in FIG. 2B and FIG. 5B.

After the bit lines (107*a* to 107*e*) are formed, an insulating layer 155, such as oxide, is formed on top of the bit lines (107*a* to 107*e*) by using thin-film deposition process. Then, a conductor layer 156, such as metal or polysilicon, is formed on top of the insulting layer 155 and fills the space between the bit lines (107*a* to 107*e*). The conductor layer 156 is supplied with a shielding voltage, such as 0V or VDD, to prevent capacitance coupling between the bit lines (107*a* to 107*e*).

In addition to DRAM cells using vertical select transistors as shown in FIG. 8 and FIG. 9, the bit line shielding approaches according to the invention can be applied to other types of DRAM arrays, such as DRAM using trench capacitors.

Figure 15A:
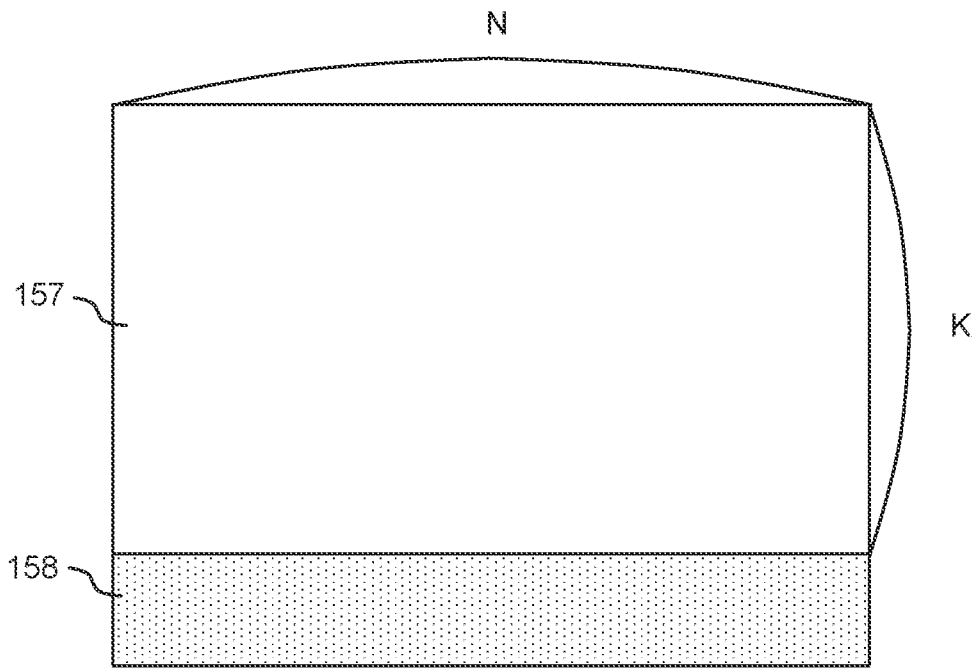
FIGS. 15A-B shows the comparison between the invention and the conventional DRAM.
Figure 15B:
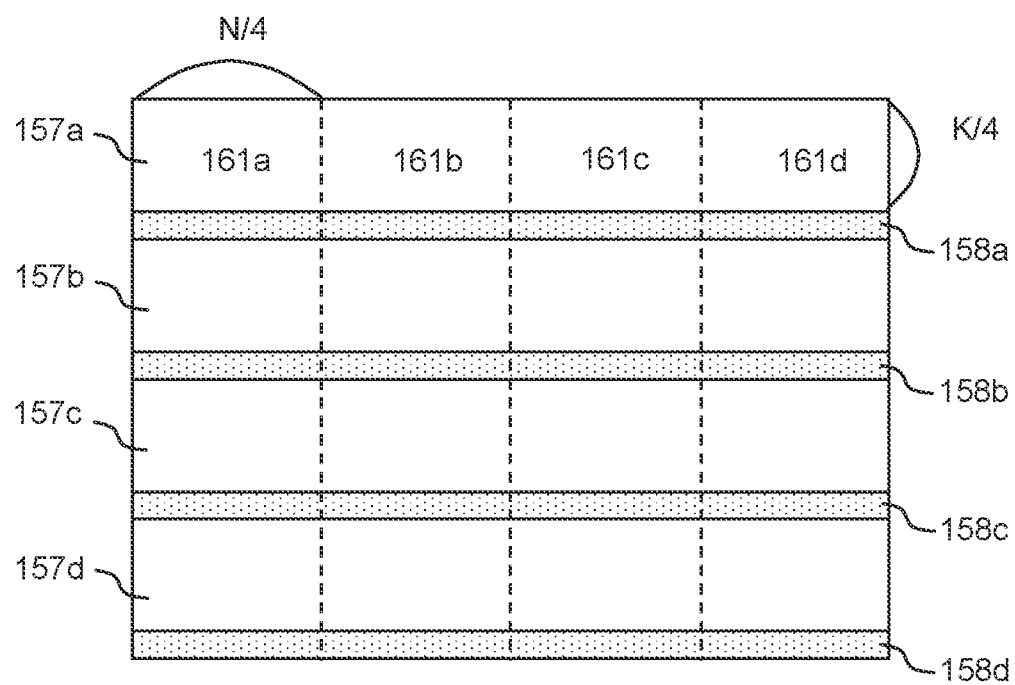

FIGS. 15A-B shows the comparison between the invention and the conventional DRAM.

FIG. 15A shows a bank of conventional DRAM that includes a cell array 157 and sense amplifier circuits 158. Assuming the array 157 comprises K words lines and N bit lines, then N sense amplifiers 158 are connected to the N bit lines.

FIG. 15B shows an embodiment of a bank constructed according to the invention. The bank is divided into four sub-arrays (157*a* to 157*d*). Each sub-array comprises K/4 word lines. Each sub-array uses the array architecture shown in FIGS. 2A-B. It will be assumed that four bit lines are connected to one sense amplifier through four bit line select gates. This will reduce the number of the sense amplifiers (158*a* to 158*d*) in each sub-array to N/4. As a result, the total number of the sense amplifiers (158*a* to 158*d*) is the same as that of the sense amplifiers 158 of the bank shown in FIG. 15A. This makes the layout size of the banks shown in FIG. 15A and FIG. 15B about the same.

As shown in FIG. 2A, in each sub-array, four bit lines are connected to one sense amplifier through four bit line select gates that are selected by signals BSG[0-3]. Each bit line select gate signal selects N/4 bit lines to be connected to N/4 sense amplifiers in each sub-array, for example, the sense amplifier circuits (158*a* to 158*d*) shown in FIG. 15B. For the purpose of illustration, the N/4 bit lines selected by one bit line select gate signal are defined as a 'page'. Each sub-array, such as sub-array 157*a* comprises four pages (161*a* to 161*d*). The locations of pages (161*a* to 161*d*) shown in FIG. 15B are for shown illustration only. In an actual layout, the cells of each page are located distributively rather than collectively.

Figure 15C:
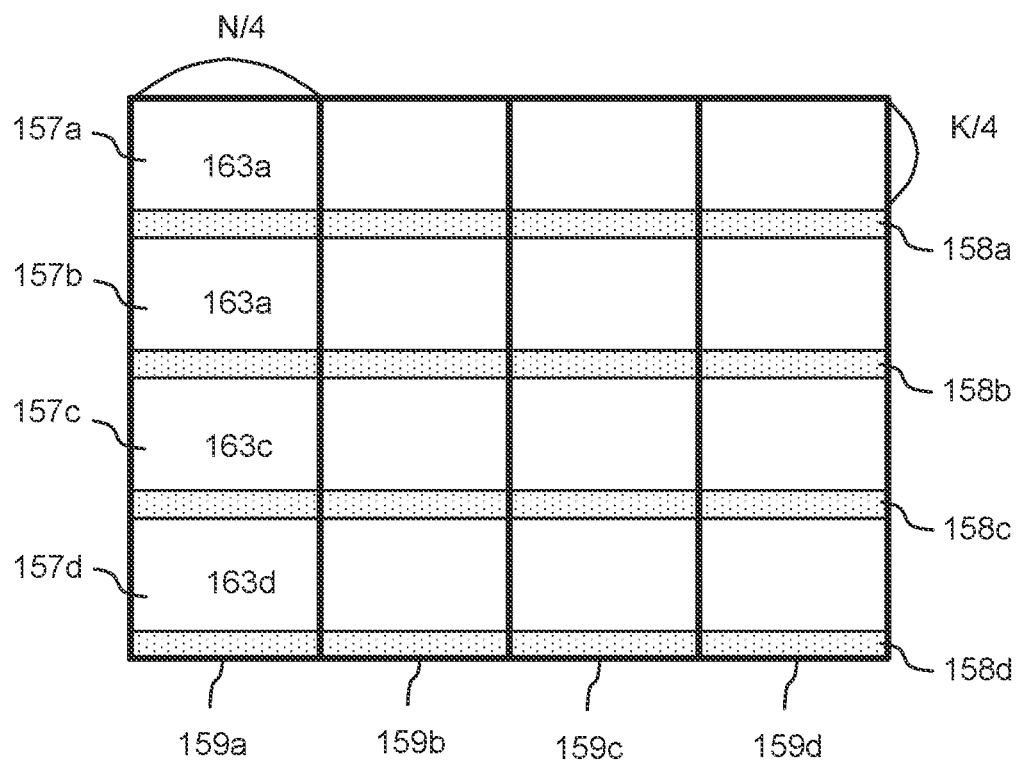
FIG. 15C shows an embodiment of a bank constructed according to the invention.

FIG. 15C shows an embodiment of a bank constructed according to the invention. During operations, the pages (163*a* to 163*d*) in the four sub-arrays (157*a* to 157*d*) form a 'block' 159*a*. The pages (163*a* to 163*d*) in the block 159*a* may be read or written by the sense amplifiers (158*a* to 158*d*) at the same time. By using this method, the total number of bit lines for read and write operations is N bit lines, which is the same as the conventional art shown in FIG. 15A. However, the bit line length and bit line capacitance of the embodiment shown in FIG. 15C is only ¼ of that of the conventional art shown in FIG. 15A. This will reduce both the bit line latency and power consumption to ¼.

Figure 15D:
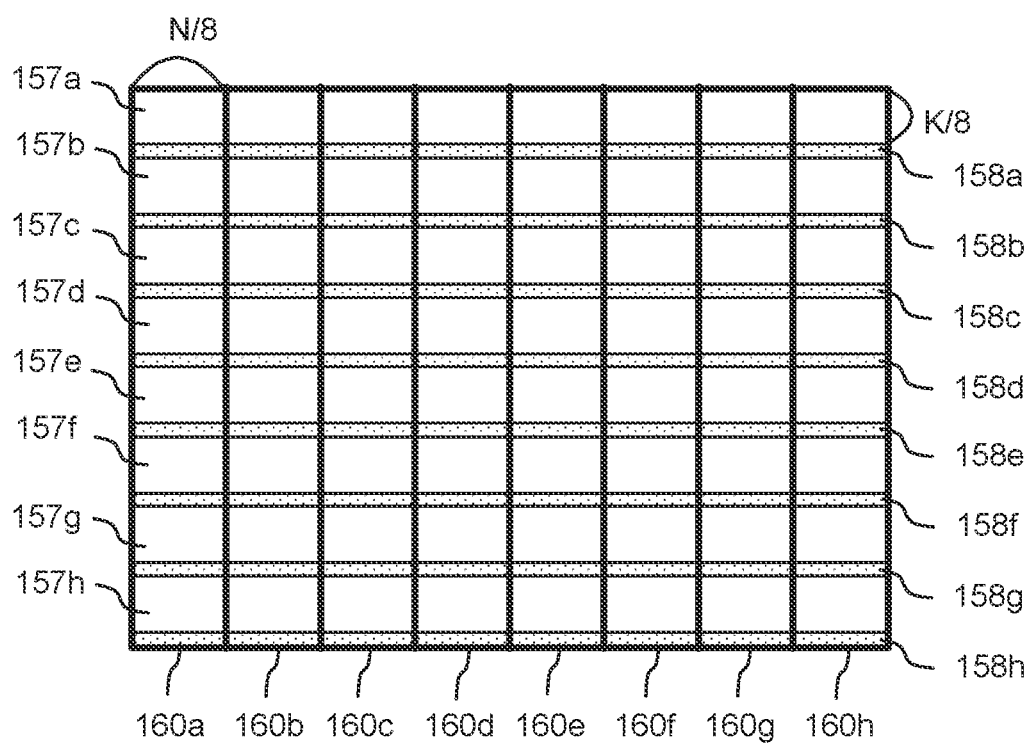
FIG. 15D shows another embodiment of an array architecture constructed according to the invention.

FIG. 15D shows another embodiment of an array architecture constructed according to the invention. In this embodiment, the array is divided into eight sub-arrays (157*a* to 157*h*). Each sub-array comprises K/8 word lines. It will be assumed that eight bit lines are connected to one sense amplifier through eight bit line select gates. The number of sense amplifiers (158*a* to 158*h*) in each sub-array may be reduced to N/8. As a result, the total number of the sense amplifiers (158*a* to 158*h*) is the same as that of the sense amplifiers 158. This makes the layout size of the banks shown in FIG. 15A and FIG. 15C about the same.

FIG. 15D shows an array that is divided into eight blocks (160*a* to 160*h*) similar to the array shown in FIG. 15C. During operations, the pages in one block selected from blocks (160*a* to 160*h*) are read or written at the same time by the sense amplifiers (158*a* to 158*h*). By using this method, the total number of bit lines for read and write operations is N bit lines, which is the same as the conventional array shown in FIG. 15A. However, the bit line length and bit line capacitance of the array shown in FIG. 15D is only ⅛ of that of the conventional array shown in FIG. 15A. Both the bit line latency and power consumption are also reduced to ⅛.

Similarly, the array may be further divided into 16, 32, or any suitable number of sub-arrays. This will reduce the bit line latency and power consumption to 1/16, 1/32, or lower, without increasing the layout size of the array.

Figure 15E:
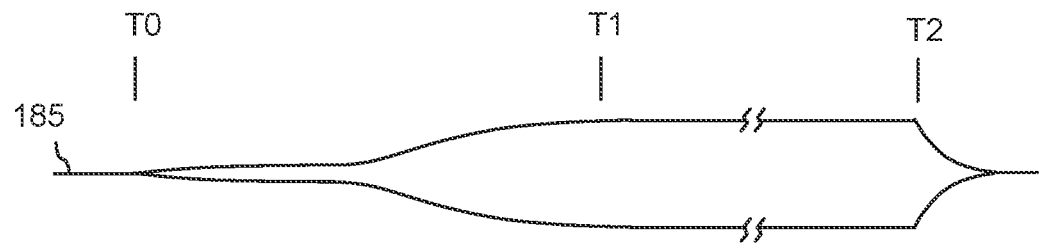
FIGS. 15E-F show a comparison of read operations performed by the conventional array and the inventive array.
Figure 15F:
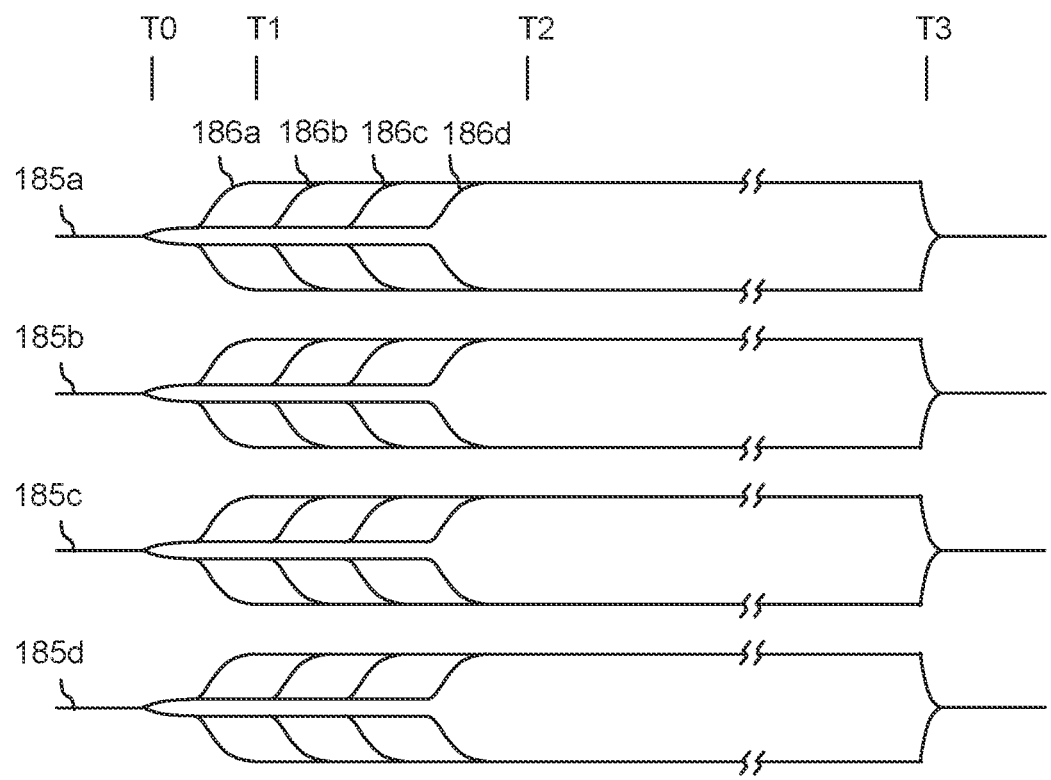

FIGS. 15E-F show a comparison of read operations performed by the conventional array shown in FIG. 15A to the inventive array shown in FIG. 15B, respectively.

FIG. 15E shows read operations for the conventional array where from time T0 to time T1, all the N bit lines 185 and the selected cells are charge-sharing and then developed into full VDD and 0V levels. The data is stored in N sense amplifiers 158. From time T1 to time T2, random or sequential column addresses are selected to read the data from the sense amplifiers 158.

FIG. 15F shows read operations performed by the inventive array shown in FIG. 15B. FIG. 15F illustrates bit lines (185*a* to 185*d*) of the sub-arrays (157*a* to 157*d*), respectively. The system selects one row (word line) from one sub-array. From time T0 to time T2, four pages of each row (word line) are read, as shown in (186*a* to 186*d*). The data of the four pages are developed into VDD and 0V levels and stored in the capacitances of the bit lines (185*a* to 185*d*).

From time T2 to time T3, random or sequential column addresses are selected to read the data from the selected bit lines (185*a* to 185*d*). Because each sub-array has N bit lines, a total of 4N bit lines are read. Compared with the conventional array, the inventive array provides four times the page size. Moreover, compared with the conventional array, the inventive array data latency of the first page, from time T0 to time T1, is greatly reduced.

Figure 15G:
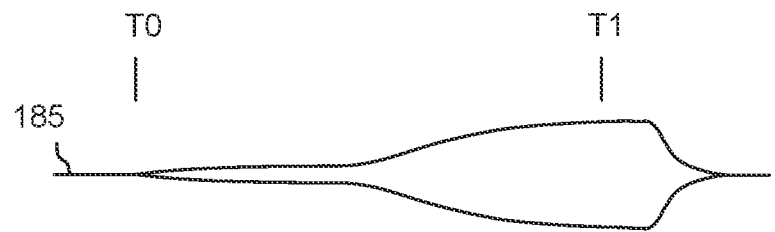
FIGS. 15G-H show a comparison of refresh operations according to the conventional array and the inventive array.
Figure 15H:
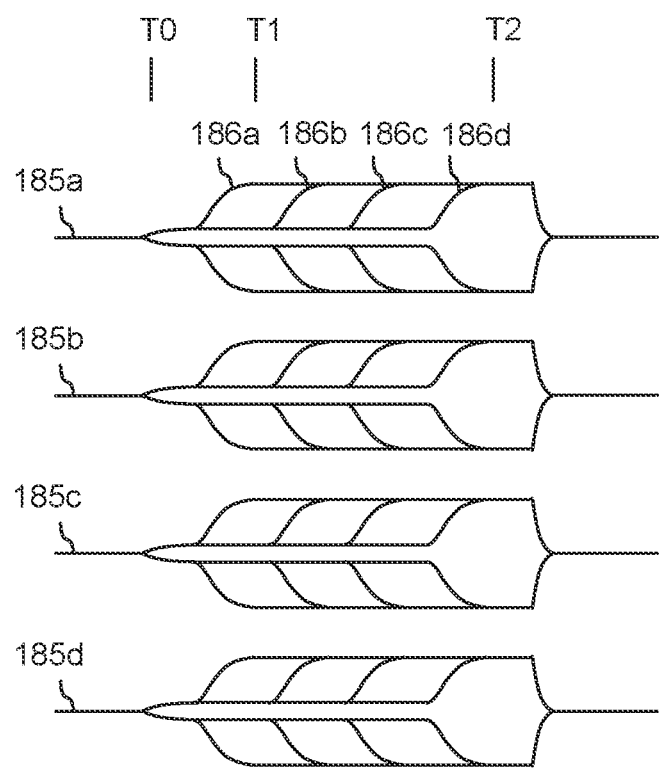

FIGS. 15G-H show a comparison of refresh operations used for the conventional array shown in FIG. 15A compared to refresh operations used for embodiments of the inventive array shown in FIG. 15B, respectively. The refresh operation for the inventive array is similar to the read operation shown in FIGS. 15E-F except that the random or sequential column read operations shown from time T1 to time T2 in FIG. 15E and time T2 to time T3 shown in FIG. 15F is eliminated. In FIG. 15G, for the conventional array, from time T0 to time T1, the data of the cells of the selected page are read and restored back to the cells. After the data of the selected page is restored to the cells, the bit line voltage can be equalized, and the next page can be refreshed. In FIG. 15H, for embodiments of the invention, assuming four pages (185*a* to 185*d*) are selected from the sub-arrays (157*a* to 157*d*) shown in FIG. 15B, respectively. From time T0 to time T2, the data of the selected bit lines (186*a* to 186*d*) is sequentially read and restored to the cells on the pages (185*a* to 185*d*) simultaneously. After the data is restored, at time T2, the bit line voltage is equalized, and the next page can be refreshed. Because the invention can perform refresh operations to four sub-arrays in parallel, the refresh time of the inventive array is shorter than 25% of the refresh time of the conventional array.

Figure 16A:
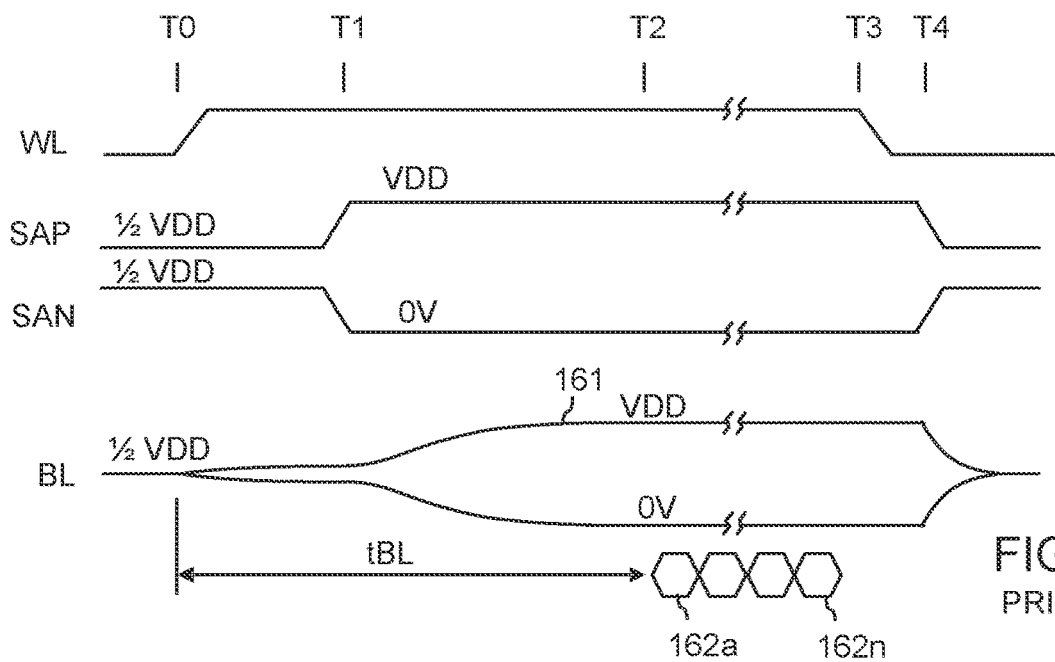
FIG. 16A shows read operations of a conventional DRAM.

FIG. 16A shows read operations of a conventional DRAM. Initially, the bit line (BL) and sense amplifier signals SAP and SAN are pre-charged and equalized at a voltage such as ½ VDD or any desired voltage from 0V to VDD. At time T0, the selected word line (WL) is supplied with a voltage, such as VDD, to access the selected cells. This causes charge-sharing to occur between the selected cell and the bit line 161 from time T0 to T1.

At time T1, the sense amplifier signals SAP and SAN are supplied with VDD and 0V, respectively. This develops the voltage of the bit line (161) into full VDD and 0V range, as shown from time T1 to time T2. After the bit line voltage is fully developed, at time T2, the data of the selected page is latched. Then, the data is output to the external system sequentially, as shown at (162*a* to 162*d*). At time T4 the bit line is equalized to ½ VDD and ready for reading the next page. To read the next page, the operation shown from time T0 to time T3 will be repeated. The time T0 to time T2 is defined as 'bit line latency' (tBL). The bit line latency is very important because it determines how fast the system can randomly access the data from the DRAM.

Figure 16B:
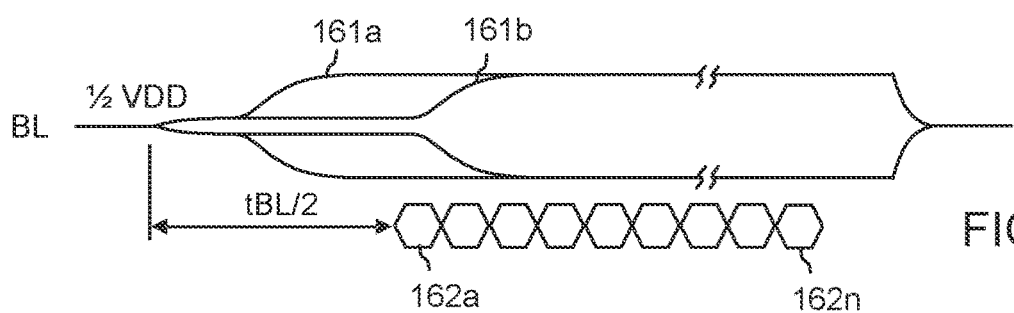
FIGS. 16B-D shows embodiments of read operations for the inventive array that is divided into 2, 4, and 8 sub-arrays according to the invention, respectively.
Figure 16C:
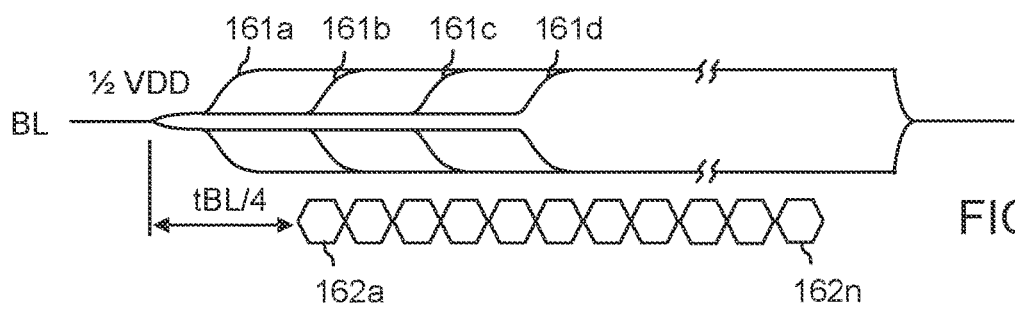
Figure 16D:
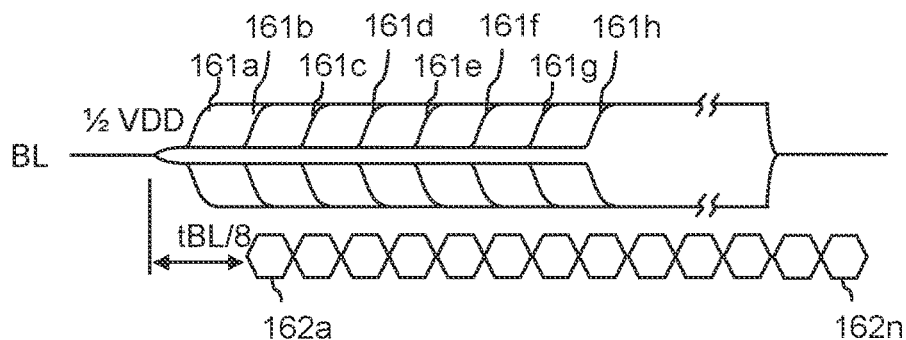

FIGS. 16B-D shows embodiments of read operations for the inventive array that is divided into 2, 4, and 8 sub-arrays according to the invention, respectively. This reduces the bit line length and bit line capacitance to ½, ¼, and ⅛, respectively. Therefore, bit line latency tBL is reduced to tBL/2, tBL/4, and tBL/8, respectively. In addition to reducing the bit line latency, the inventive array architecture increases the bandwidth of a bank for read and write operations.

FIG. 16B show read operations for the inventive array having two sub-arrays. This reduces the bit line length and the capacitance by ½ and causes the bit line development time to be reduced by ½, as shown in the pages 161*a* and 161*b*. After the data of the selected page 161*a* is read and stored in the data latch 113, (e.g., as shown in FIGS. 2A-B), the data is output to the external system, as shown at (162*a* to 162*n*) in FIG. 16B. Meanwhile, the sense amplifier 111 (e.g., shown in FIGS. 2A-B) is used to develop the bit line voltage of the unselected page, such as page 161*b* shown in FIG. 16B.

After the data of the other page 161*b* is developed and stored in the sense amplifier 111, the system can access the data of the other page 161*b* as well. As a result, the data bandwidth of the array architecture used in FIG. 16B becomes double compared with the conventional array used in FIG. 16A.

FIG. 16C shows read operations for an inventive array architecture that uses four sub-arrays. In this array, the bit line length and capacitance are reduced to ¼ of the conventional array, thus the bit line voltage development time for pages (161*a* to 161*d*) becomes ¼ of the conventional array. While the data (162*a* to 162*n*) of the selected page 161*a* is output to the external system, the other three pages (161*b* to 161*d*) are developed as shown. The data will be stored in the bit line capacitance. This allows a total of four pages of data to be ready for output. Therefore, the data bandwidth of the inventive array of FIG. 16C is increased by four times compare with the conventional array shown in FIG. 16A.

FIG. 16D shows read operations for an inventive array architecture that uses eight sub-arrays. Similar to FIG. 16C, while the data (162*a* to 162*n*) of the selected page 161*a* is output to the external system, the other seven pages (161*b* to 161*h*) are developed as shown. The data will be stored in the bit line capacitances. This allows a total of eight pages of data to be ready for output. Therefore, the data bandwidth of the inventive array of FIG. 16C is increased by eight times compare with the conventional array shown in FIG. 16A.

During the read operations illustrated in FIGS. 16B-D, after the data of the bit lines in the unselected pages are developed, the data is stored in the bit line capacitances. To read data from an unselected page, the selected bit line select gate, such as (108*a* to 108*m*) shown in FIGS. 2A-B is turned on. This causes charge-sharing to occur between the capacitances of the selected bit line and the data line 109*a*. Because the data line 109*a* capacitance is much smaller than that of the bit line, the data line 109*a* will be pulled to the bit line voltage and flip the sense amplifier 111 in very short time.

Referring now to FIGS. 15C-D, more details about the above operations will be described.

FIG. 15C shows an inventive array architecture with four blocks (159*a* to 159*d*). It will be assumed that a page is selected from the block 159*a*. After the data is read from the page in the block 159*a* to the sense amplifiers (158*a* to 158*d*), the data is latched to the data latches in the sense amplifiers and then output to the external system. Meanwhile, the sense amplifiers (158*a* to 158*d*) develop the data of the pages on the selected word line in the unselected blocks (159*b* to 159*d*). After the data of the pages in the blocks (159*b* to 159*d*) is developed and stored in the bit line capacitances, the sense amplifiers (158*a* to 158*d*) read the data from any of the blocks (159*a* to 159*d*) by switching the bit line select gates. By using this method, the data bandwidth is increased by four times.

Similarly, as shown in the inventive array of FIG. 15D, the array is divided into eight blocks (160a to 160h). This increases the data bandwidth by eight times. It is obvious that a similar approach can be applied to an array with 16, 32, and any suitable number of blocks. This will increase the data bandwidth by 16, 32, and more times.

Figure 17A:
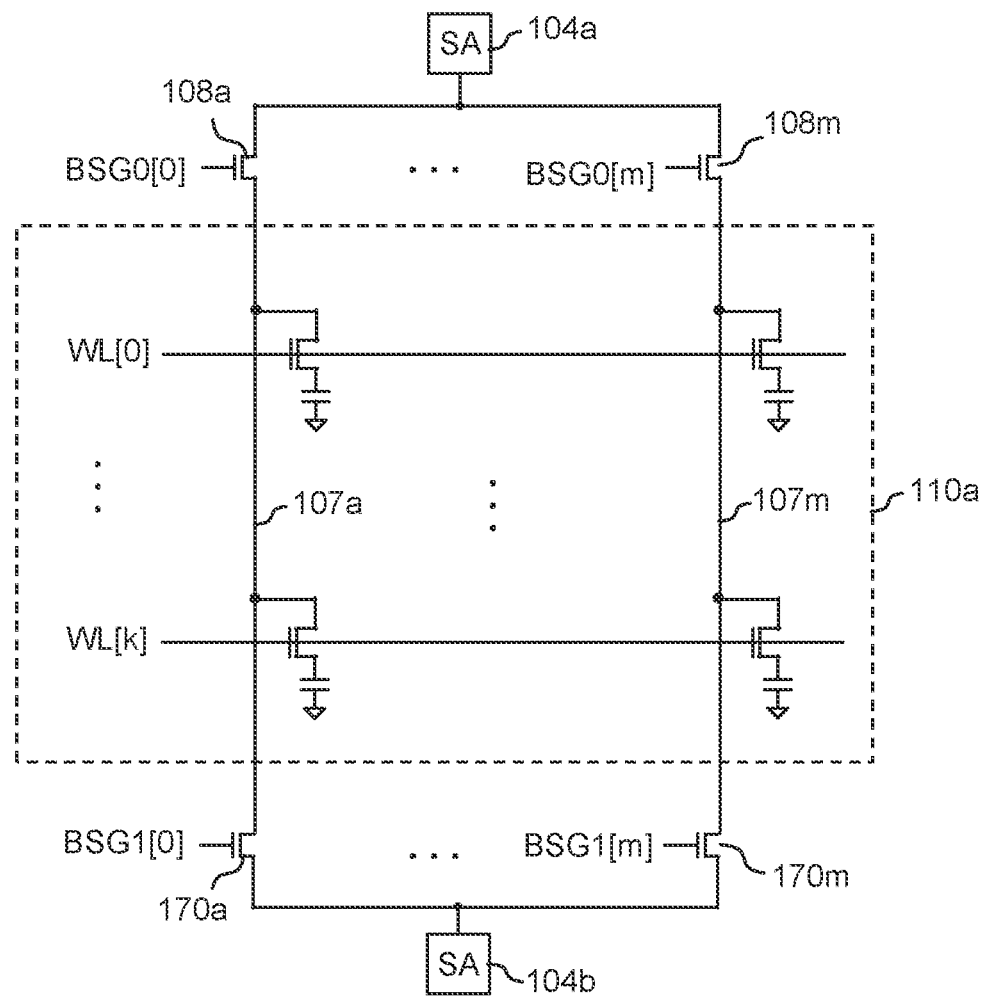
FIG. 17A shows another embodiment of an array architecture according to the invention.

FIG. 17A shows another embodiment of an array architecture according to the invention. The array of FIG. 17A comprises a bit line group 100a having bit lines (107a to 107m) that are connected to two sense amplifiers 104a and 104b through bit line select gates (108a to 108m) and (170a to 170m), respectively. This embodiment allows the two sense amplifiers 104a and 104b to simultaneously perform operations to the bit lines selected by the two groups of the bit line select gates (108a to 108m) and (170a to 170m). For example, in one operation, the sense amplifier 104a performs a read or write operation to a selected bit line and the sense amplifier 104b performs a read or write operation to the selected bit line.

In another example, the sense amplifier 104a performs a restore or refresh operation to the even bit lines and the sense amplifier 104b performs a restore or refresh operation to the odd bit lines; the two operations performed simultaneously. This embodiment uses two sense amplifiers for each bit line group, due to the sense amplifiers being shared by multiple bit lines, the total number of the sense amplifiers are the same or lower than the number of sense amplifiers used in a conventional array.

Figure 17B:
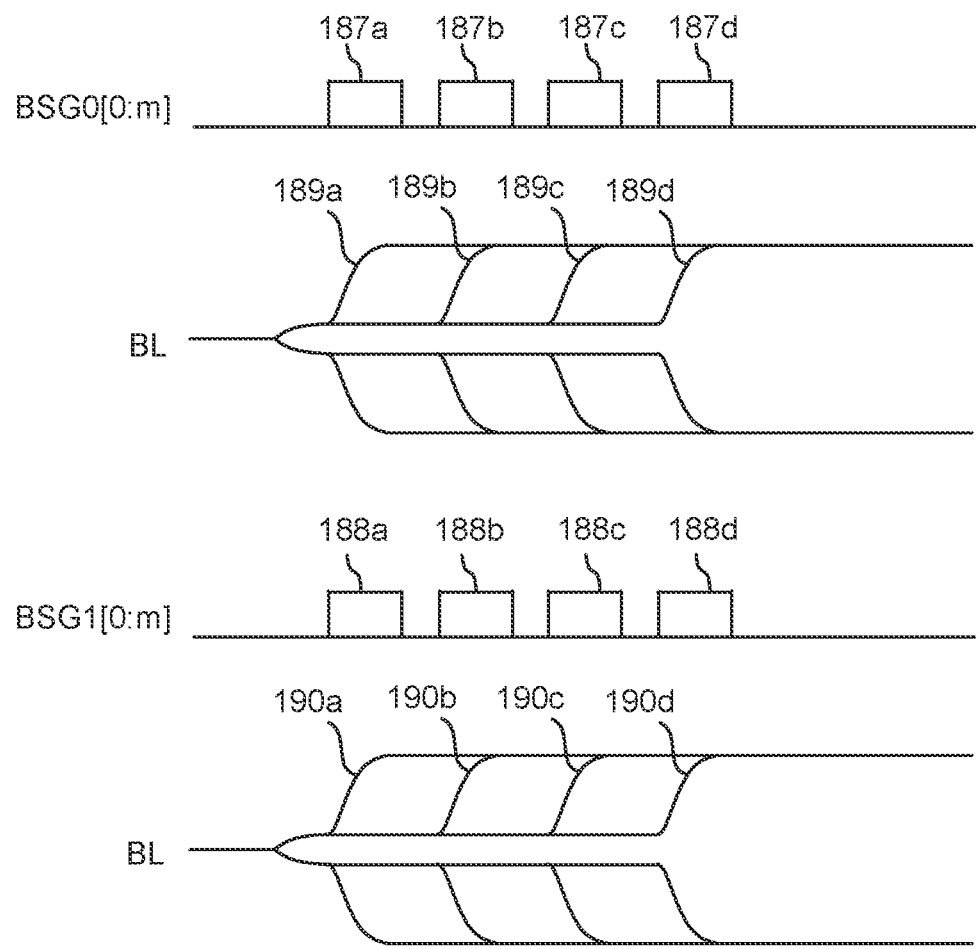
FIG. 17B shows an embodiment of a read operation for the array architecture shown in FIG. 17A.

FIG. 17B shows an embodiment of a read operation for the array architecture shown in FIG. 17A. The first group of bit line select gates (187a to 187d) and the second group of bit line select gates (188a to 188d) are simultaneously selected to read and write two random bit lines (189a to 189d) and (190a to 190d), respectively. This increases the data throughput by a factor of two.

Figure 17C:
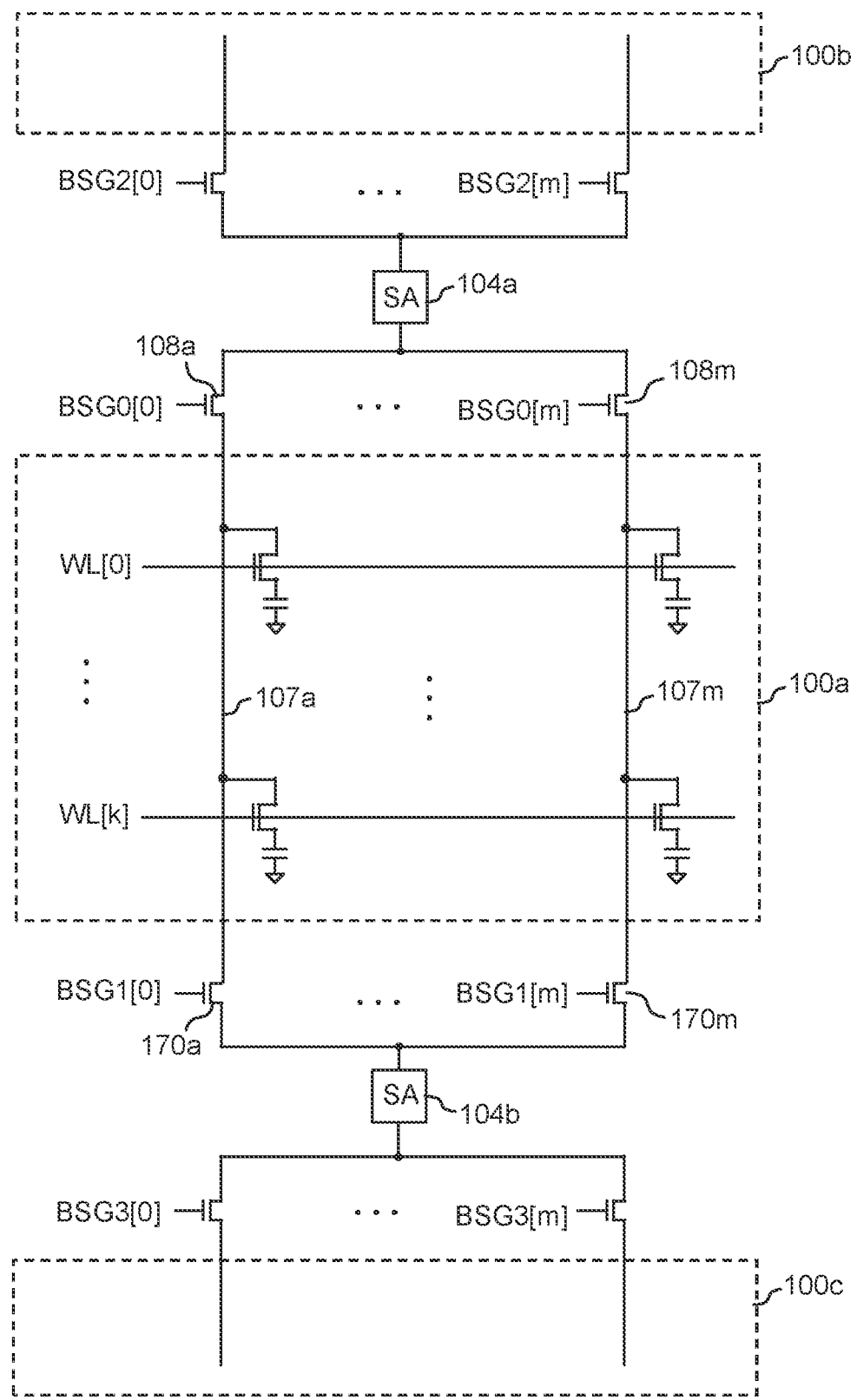
FIG. 17C shows another embodiment of an array architecture according to the invention.

FIG. 17C shows another embodiment of an array architecture according to the invention. This embodiment is similar to the one shown in FIG. 17A except that the sense amplifiers 104a and 104b of the bit line group 100a are shared with the adjacent bit line groups 100b and 100c. This reduces the total number of the sense amplifiers in one half.

Figure 17D:
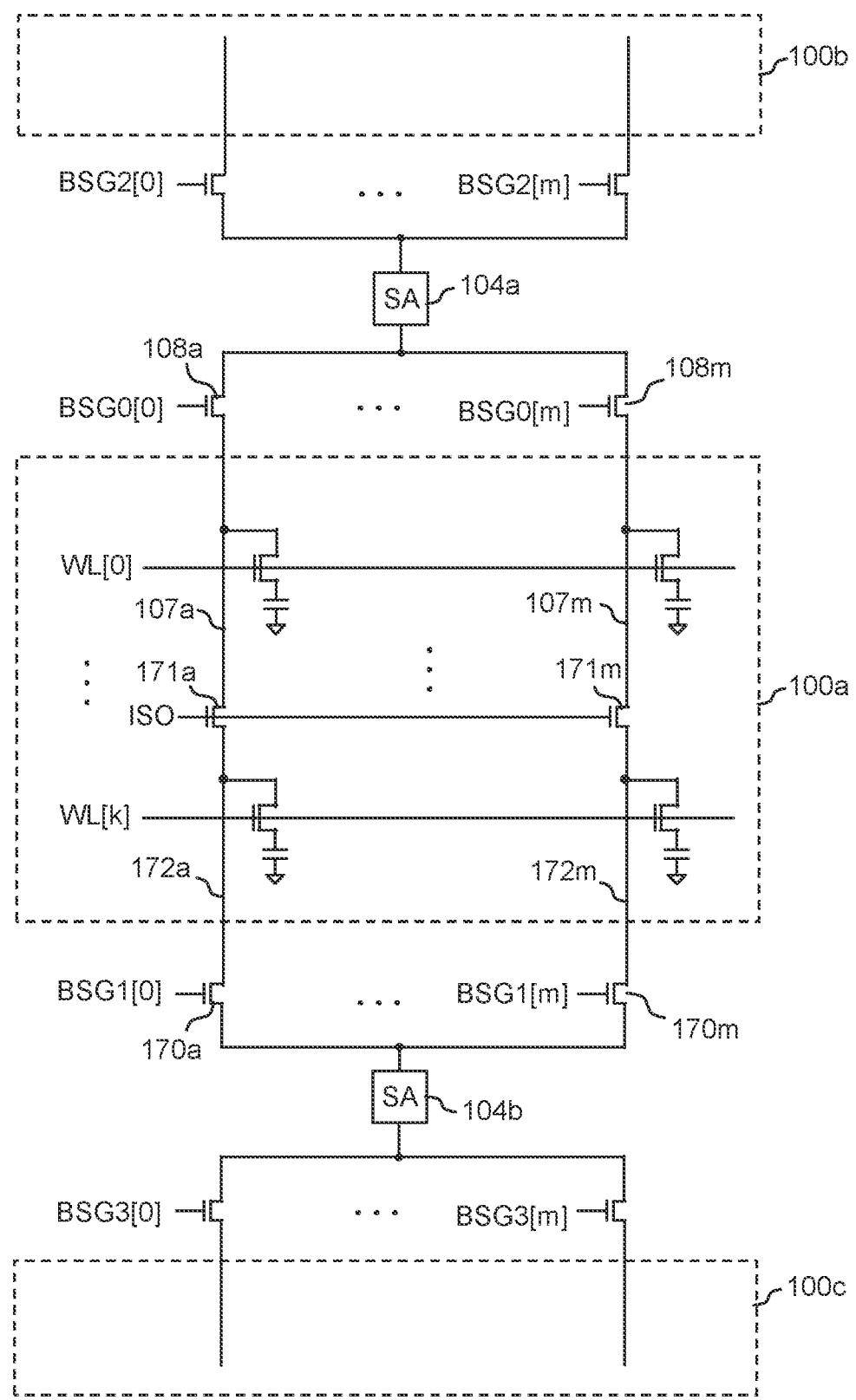
FIG. 17D shows another embodiment of an array architecture according to the invention.

FIG. 17D shows another embodiment of an array architecture according to the invention. This embodiment is similar to the one shown in FIG. 17A except that additional pass gates (171a to 171m) are added to divide the bit lines into two segments (107a to 107m) and (172a to 172m). When the pass gates (171a to 171m) are turned on, the array performs the operations described with respect to FIG. 17C. When the pass gates (171a to 171m) are turned off, this allows the sense amplifiers (104a and 104b) to simultaneously perform independent operations to the bit line segments (107a to 107m) and (172a to 172m), respectively.

Figure 17E:
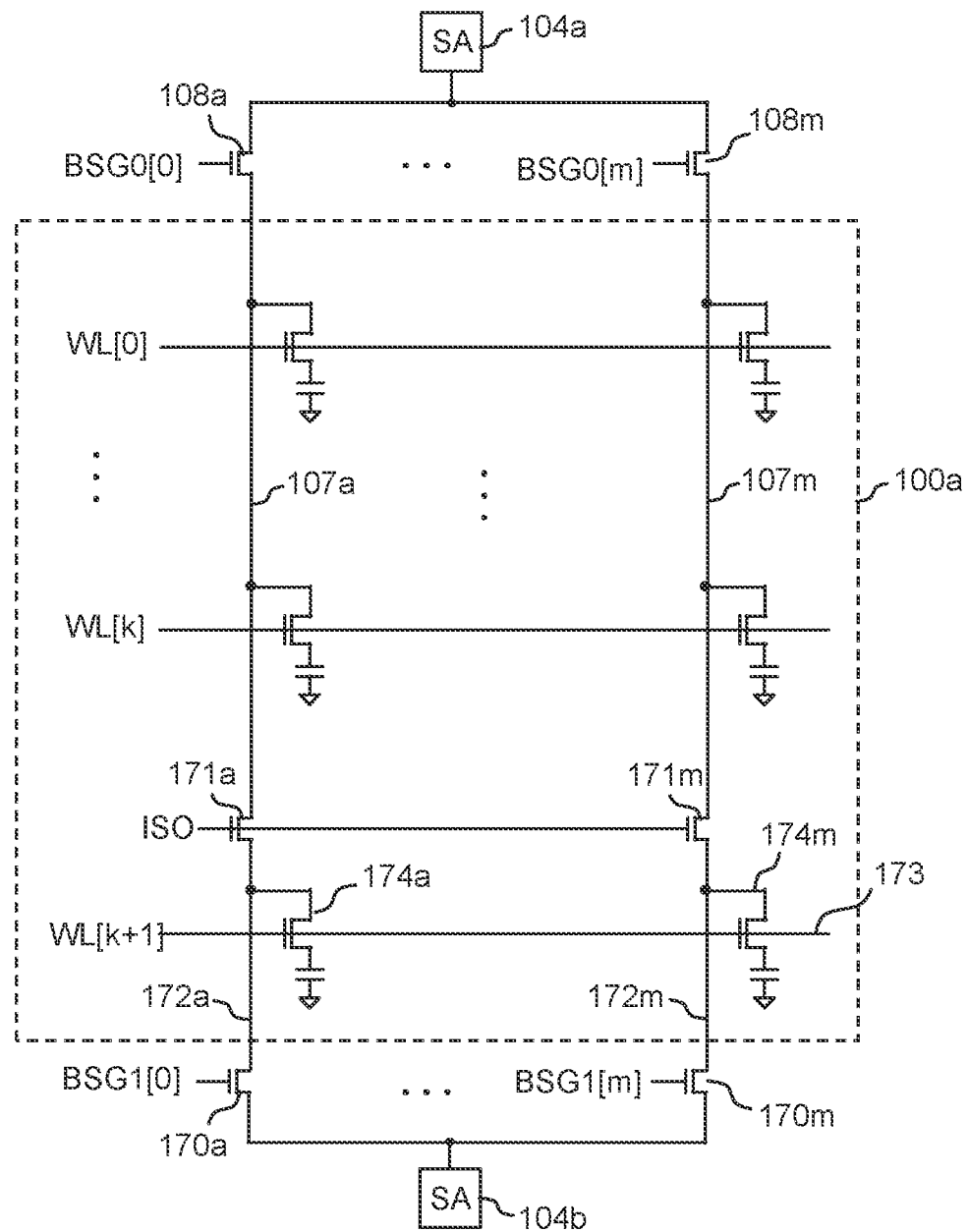
FIG. 17E shows another embodiment of an array architecture according to the invention.

FIG. 17E shows another embodiment of an array architecture according to the invention. This embodiment is similar to the one shown in FIG. 17D except that the second bit line segments (172a to 172m) are much shorter than the first bit line segments (107a to 107m). All the cells are located on the first bit line segments (107a to 107m). In one embodiment, the second bit line segments (172a to 172m) comprise one additional word line 173. In another embodiment, the second bit line segments (172a to 172m) comprise multiple additional word lines. In another embodiment, the second bit line segments (172a to 172m) comprise no additional word lines.

During a read operation, after the data is read from the cells and restored back to the cells, the pass gates (171a to 171m) are turned off to isolate the bit line segments (107a to 107m) and (172a to 172m). The data is stored in the bit line capacitance of the second bit line segments (172a to 172m). The cells (174a to 174m) on the additional word line 173 are turned on to increase the bit line capacitance of the second bit line segments (172a to 172m). The sense amplifier 104b accesses the second bit line segments (172a to 172m) through the bit line select gates (170a to 170m) to read the data stored in the bit line capacitance. Meanwhile, the sense amplifier 104a performs the next read or write operation to the bit lines segments (107a to 107m) through the bit line select gates (108a to 108m).

Figure 18A:
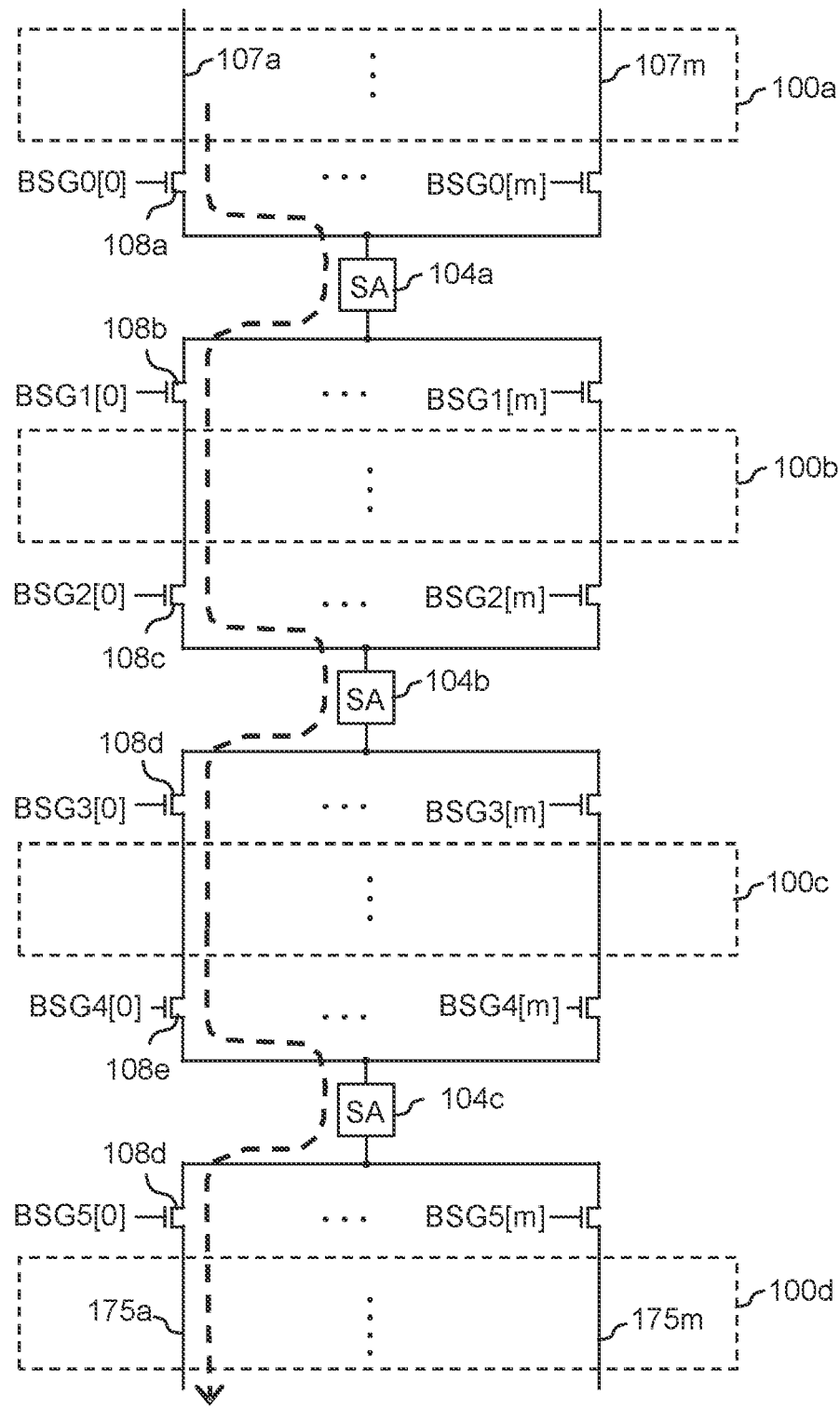
FIG. 18A shows another embodiment of an operation according to the invention using the array architecture shown in FIG. 17C.

FIG. 18A shows another embodiment of read operations according to the invention using the array architecture shown in FIG. 17C, which includes multiple bit line groups (100a to 100d). After the data of the first bit line group 100a is read and restored in the bit lines (107a to 107m), the first bit line select gates (108a to 108d) of each bit line group are turned on to transfer the data from the bit line 107a to the bit line 175a through the first bit lines of the bit line groups (100a to 100d). The sense amplifiers (104a to 104c) are used as buffers to enhance the data driving capability.

Similarly, the second bit line select gates of each bit line group are turned on to pass the data from the second bit line of the bit line group 100a to the second bit line of the bit line group 100d. This operation is repeated until all the data of the selected bit lines are passed. This operation allows a large number of data to be transferred through the bit lines in high speed. Similarly, the input data may be transferred from the bit lines of the bit line group 100d to the bit line group 100a through the bit lines using the operation described above.

Figure 18B:
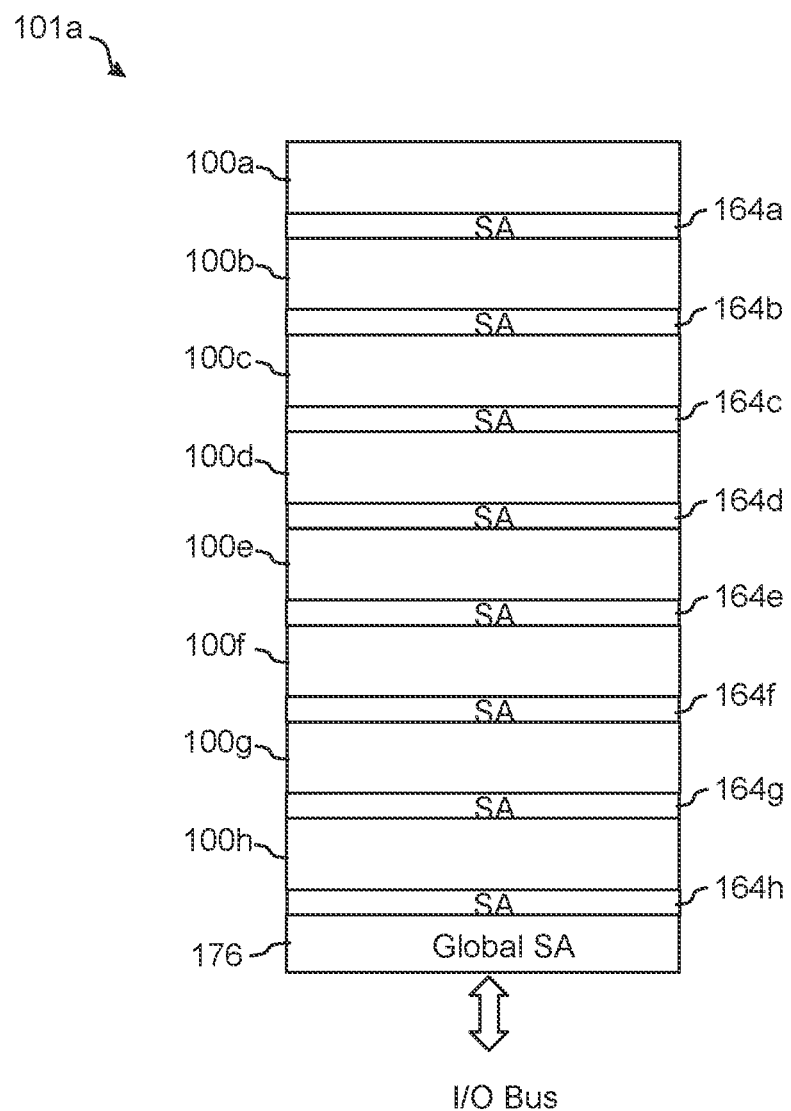
FIG. 18B shows an embodiment of an array architecture of a bank group of DRAM.

FIG. 18B shows an embodiment of an array architecture of a bank of DRAM. The bank 101a comprises multiple bit line groups (100a to 100h) connected to the sense amplifier circuits (164a to 164h). It will be assumed that each bit line group comprises N bit lines and each sense amplifier is connected to M bit lines. The operation shown in FIG. 18A allows N/M bits of data to be transferred to a global sense amplifier 176. The global sense amplifier 176 comprises N/M data latches to store the data. During a write operation, the global sense amplifier 176 load N/M data to the bit line of the selected bit line group using the described operation. This embodiment significantly increases the data bandwidth, thus it is particularly suitable for high-bandwidth applications, such as high-bandwidth memory (HBM) applications, etc.

Figure 19:
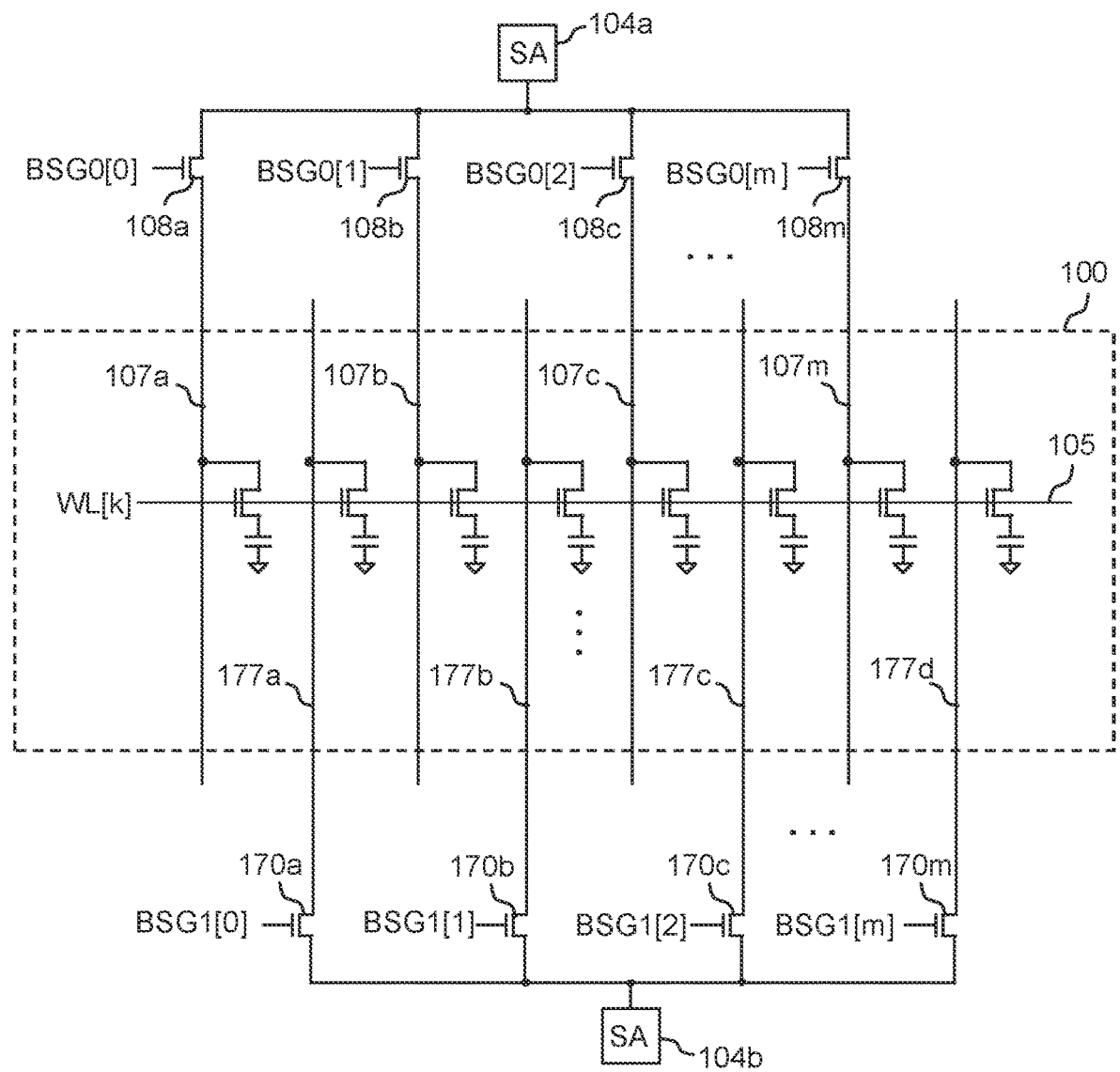
FIG. 19 shows another embodiment of an array architecture according to the invention.

FIG. 19 shows another embodiment of an array architecture according to the invention. In this embodiment, the bit lines are divided into two groups. The first group of bit lines (107a to 107m) are connected to a first sense amplifier 104a through a first group of bit line select gates (108a to 108m). The second group of bit lines (177a to 177m) are connected to a second sense amplifier 104b through a second group of bit line select gates (170a to 170m). In one embodiment, the first and second groups of bit lines are even and odd bit lines, respectively. The first sense amplifier 104a and the second sense amplifier 104b are located on two sides of the array. This architecture allows the sense amplifiers 104a and 104b to simultaneously read and write two bit lines from the first and second groups of bit lines, respectively.

A read operation waveform of the array architecture shown in FIG. 19 is similar to the waveform shown in FIG. 17B except the bit lines selected by the first group of bit line select gates (187a to 187d) and the second group of bit line select gates (188*a* to 188*d*) are located in the first and second groups of bit lines, respectively.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A method for reading a dynamic random-access memory (DRAM) array having memory cells connected to a plurality of bit lines that are connected to a single sense amplifier through a plurality of bit line select gates, respectively, the method comprising:
    activating the bit line select gates to equalize voltage levels on the plurality of bit lines;
    deactivating the bit line select gates to maintain the equalized voltage levels on the plurality of bit lines using a bit line capacitance associated with each bit line;
    activating a selected word line to access selected memory cells connected to the selected word line;
    activating bit line select gates associated with selected bit lines to pass first data from a first bit line and second data from a second bit line to the sense amplifier, wherein the first data is from a selected memory cell and the second data is reference data; and
    determining sensed data from the first and second data, wherein the sensed data is passed from the sense amplifier onto an I/O bus.

2. The method of claim 1, further comprising:
    maintaining voltage on the selected word line; and
    writing data on the bit lines back to the selected cells in a restore operation.

3. The method of claim 1, further comprising an operation of activating bit line select gates of unselected bit lines to restore data to memory cells associated with the unselected bit lines.

4. The method of claim 3, further comprising activating the bit line select gates of unselected bit lines in a sequential manner.

5. The method of claim 3, further comprising activating the bit line select gates of unselected bit lines in a non-sequential manner.

6. The method of claim 1, wherein the equalized voltage levels on the plurality of bit lines are approximately equal to ($½$*VDD).

7. The method of claim 1, wherein the operation of activating bit line select gates associated with selected bit lines causes charge-sharing with the selected cells' capacitors that are storing VDD and VSS.

8. The method of claim 7, wherein bit lines associated with cells having capacitors storing VDD levels will have a charge-sharing values greater than ($½$*VDD), and bit lines associated with cells having capacitors storing VSS levels will have a charge-sharing values less than ($½$*VDD).

9. The method of claim 1, further comprising controlling column select gates to enable the sensed data to pass onto the I/O bus.

* * * * *